(12) United States Patent
Choi et al.

(10) Patent No.: US 12,022,696 B2
(45) Date of Patent: Jun. 25, 2024

(54) DISPLAY DEVICE

(71) Applicant: Samsung Display Co., Ltd., Yongin-si (KR)

(72) Inventors: Kyunghyun Choi, Yongin-si (KR); Seongjun Lee, Yongin-si (KR); Jinseock Ma, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 130 days.

(21) Appl. No.: 17/325,326

(22) Filed: May 20, 2021

(65) Prior Publication Data

US 2022/0020835 A1 Jan. 20, 2022

(30) Foreign Application Priority Data

Jul. 14, 2020 (KR) .................. 10-2020-0086918

(51) Int. Cl.
*H10K 59/124* (2023.01)
(52) U.S. Cl.
CPC ................. *H10K 59/124* (2023.02)
(58) Field of Classification Search
None
See application file for complete search history.

(56) References Cited

U.S. PATENT DOCUMENTS

| | | | |
|---|---|---|---|
| 10,096,662 B2 | 10/2018 | Choi et al. | |
| 2017/0148856 A1* | 5/2017 | Choi | ................. H10K 59/124 |
| 2019/0198588 A1* | 6/2019 | Moon | ................. G03F 7/40 |
| 2019/0267440 A1* | 8/2019 | Park | ................. H10K 59/1213 |
| 2020/0134505 A1 | 4/2020 | Jang et al. | |
| 2020/0212140 A1* | 7/2020 | Huh | ................. H01L 27/156 |
| 2020/0251543 A1 | 8/2020 | Lee et al. | |
| 2021/0193951 A1* | 6/2021 | Wu | ................. H10K 50/81 |
| 2021/0305283 A1* | 9/2021 | Di | ................. H01L 27/1218 |
| 2021/0327906 A1* | 10/2021 | Li | ................. H01L 27/1225 |
| 2021/0365659 A1* | 11/2021 | Yang | ................. H10K 59/65 |
| 2021/0408401 A1* | 12/2021 | Zhang | ................. H10K 59/1213 |

FOREIGN PATENT DOCUMENTS

| | | |
|---|---|---|
| KR | 10-1999598 | 12/2014 |
| KR | 10-2017-0113780 | 10/2017 |
| KR | 10-2019-0096467 | 8/2019 |
| KR | 10-2020-0048808 | 5/2020 |

* cited by examiner

*Primary Examiner* — Vongsavanh Sengdara
(74) *Attorney, Agent, or Firm* — KILE PARK REED & HOUTTEMAN PLLC

(57) ABSTRACT

A display device including a substrate including a main display area, a component area having a transmission area, and a peripheral area outside the main display area, a first thin film transistor and a first display element arranged over the main display area, a second thin film transistor and a second display element arranged over the component area, a bottom metal layer arranged between the substrate of the component area and the second thin film transistor and including a hole corresponding to the transmission area, and an organic layer arranged in the transmission area and having a hole pattern defined along an edge of the hole of the bottom metal layer.

20 Claims, 47 Drawing Sheets

DISPLAY DEVICE

CROSS-REFERENCE TO RELATED APPLICATION

This application claims priority from and the benefit of Korean Patent Application No. 10-2020-0086918, filed on Jul. 14, 2020, which is hereby incorporated by reference for all purposes as if fully set forth herein.

BACKGROUND

Field

Exemplary embodiments of the invention relate generally to a display device and a method of manufacturing the same, and more particularly, to a display device having improved product reliability and a method of manufacturing the display device.

Discussion of the Background

Recently, display devices have become thinner and lighter, which has expanded the usage of display devices.

As display devices are used in various ways, there exists various methods for designing the form of a display device, and the number of functions that may be added to or associated with display devices has increased.

The above information disclosed in this Background section is only for understanding of the background of the inventive concepts, and, therefore, it may contain information that does not constitute prior art.

SUMMARY

Display devices constructed according to exemplary embodiments of the invention and a method of manufacturing the same are capable of displaying an image even in an area where a component as an electronic element is arranged.

Additional features of the inventive concepts will be set forth in the description which follows, and in part will be apparent from the description, or may be learned by practice of the inventive concepts.

According to one or more embodiments, a display device includes a substrate including a main display area, a component area including a transmission area, and a peripheral area outside the main display area, a first thin film transistor and a first display element arranged over the main display area, a second thin film transistor and a second display element arranged over the component area, a bottom metal layer arranged between the substrate of the component area and the second thin film transistor and including a hole corresponding to the transmission area, and an organic layer arranged in the transmission area and having a hole pattern defined along an edge of the hole of the bottom metal layer.

The display device may further include a first conductive pattern in the hole pattern of the organic layer.

The first conductive pattern may include ytterbium (Yb).

A thickness of the first conductive pattern may be about 50 angstroms (Å) to about 200 angstroms (Å).

The display device may further include a second conductive pattern on upper surfaces of a source electrode and a drain electrode of the second thin film transistor.

The second conductive pattern may include titanium (Ti).

The second conductive pattern may include the same material as uppermost layers of the source electrode and the drain electrode.

The organic layer may include at least one of a first functional layer arranged under emission layers of the first display element and the second display element and a second functional layer arranged on the emission layers.

The hole pattern of the organic layer may have a line shape and may be continuous or discontinuous along the edge of the hole of the bottom metal layer.

The hole pattern of the organic layer may include a plurality of island-type hole patterns arranged at certain intervals along the edge of the hole of the bottom metal layer.

The hole pattern of the organic layer may have a shape of the hole of the bottom metal layer.

The display device may further include an inorganic layer arranged between the substrate and the organic layer in the transmission area.

The substrate may include a first base layer including an organic material, a first barrier layer including an inorganic material and arranged on the first base layer, a second base layer including an organic material and arranged on the first barrier layer, and a second barrier layer including an inorganic material and arranged on the second base layer.

The organic layer may be on the second barrier layer.

The bottom metal layer may include a first metal layer having a first thickness from an upper surface of the substrate, and a second metal layer having a second thickness from an upper surface of the first metal layer, wherein the second thickness may be greater than the first thickness.

According to one or more embodiments, a display device includes a substrate including a main display area, a component area including a transmission area, and a peripheral area outside the main display area, a bottom metal layer arranged in the component area of the substrate and including a hole corresponding to the transmission area, at least one insulating layer arranged on the bottom metal layer and including a hole corresponding to the transmission area, a pixel electrode arranged on the at least one insulating layer, an emission layer on the pixel electrode, an organic layer including a first functional layer arranged under the emission layer and in the transmission area and a second functional layer arranged on the emission layer and in the transmission area, and an opposite electrode facing the pixel electrode and arranged on the organic layer, wherein, in the transmission area, the organic layer has a hole pattern defined along an edge of the hole of the bottom metal layer.

The display device may further include a first conductive pattern in the hole pattern of the organic layer.

The first conductive pattern may include ytterbium (Yb).

The display device may further include a second conductive pattern overlapping the bottom metal layer and arranged on upper surfaces of a source electrode and a drain electrode of a thin film transistor arranged between the bottom metal layer and the pixel electrode.

The second conductive pattern may include titanium (Ti).

The hole pattern of the organic layer may have a line shape or a shape of the hole of the bottom metal layer.

The hole pattern of the organic layer may be continuous or discontinuous along the edge of the hole of the bottom metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
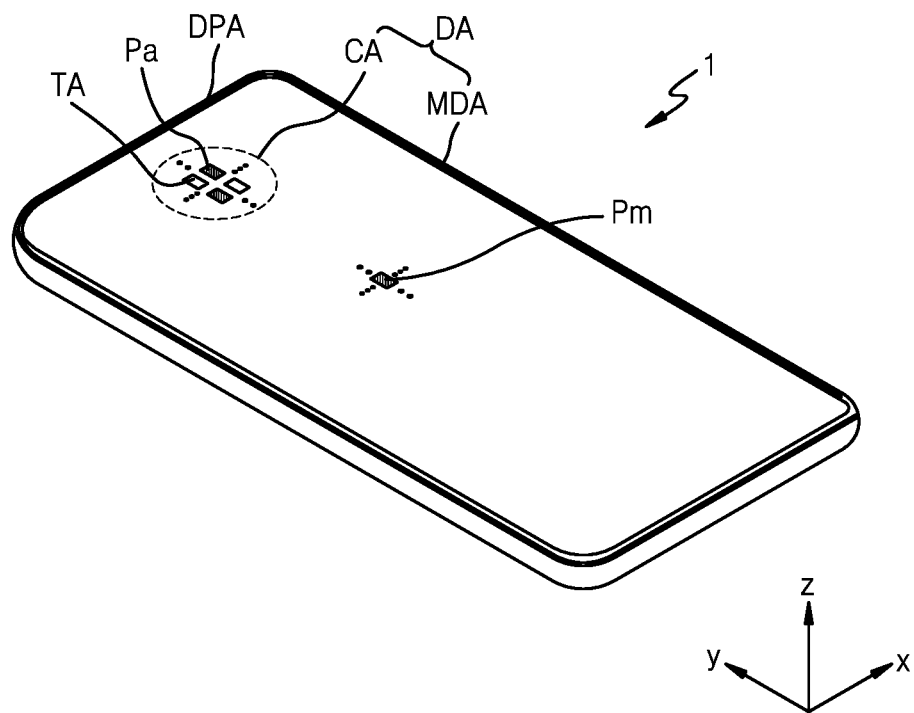
FIG. 1 is a perspective view schematically illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating a display device according to an exemplary embodiment.

Referring to FIG. 1, the display device 1 includes a display area DA and a peripheral area DPA outside the display area DA. The display area DA includes a component area CA and a main display area MDA at least partially surrounding the component area CA. The component area CA and the main display area MDA may display images individually or together. The peripheral area DPA may be a non-display area where no display element is arranged. The display area DA may be entirely surrounded by the peripheral area DPA.

FIG. 1 exemplarily shows one component area CA positioned in the main display area MDA. According to another embodiment, the display device 1 may have two or more component areas CA, and shapes and sizes of the plurality of component areas CA may be different from each other. When viewed from a direction (e.g., direction z) substantially vertical to an upper surface of the display device 1, the component area CA may have various shapes, such as a circular shape, an oval shape, a polygonal shape, such as a quadrilateral shape, a hexagonal shape, or an octagonal shape, a star shape, or a diamond shape. Although FIG. 1 exemplarily shows the component area CA arranged in an upper center (direction +y) of the main display area MDA having a substantially quadrilateral shape when viewed from a direction substantially vertical to an upper surface of the display device 1, in other exemplary embodiments, the component area CA may be arranged on one side, for example, an upper right side or an upper left side, of the main display area MDA having a quadrilateral shape.

The display device 1 may provide an image by using a plurality of first sub-pixels Pm arranged in the main display area MDA and a plurality of second sub-pixels Pa arranged in the component area CA.

As described below with reference to FIG. 2, in the component area CA, a component 40 as an electronic element may be arranged below a display panel to correspond to the component area CA. The component 40 may be a camera using infrared rays or visible light, and may include an imaging device. Alternatively, the component 40 may be a solar cell, a flash, an illuminance sensor, a proximity sensor, or an iris sensor. The component 40 may additionally or alternatively may receive sound. The component area CA may include a transmission area TA capable of transmitting light and/or sound output from the component 40 to the outside or traveling from the outside toward the component 40. In a display panel according to an exemplary embodiment and a display device including the same, when light is transmitted through the component area CA, the light transmittance may be about 10% or more, and more particularly, may be 40% or more, 25% or more, 50% or more, 85% or more, or 90% or more.

The plurality of second sub-pixels Pa may be arranged in the component area CA. The plurality of second sub-pixels Pa may provide a certain image by emitting light. An image displayed in the component area CA is an auxiliary image and may have lower resolution than an image displayed in the main display area MDA. More particularly, the component area CA includes the transmission area TA capable of transmitting light and sound. In some exemplary embodiments, when no sub-pixel is arranged in the transmission area TA, the number of second sub-pixels Pa that may be arranged per unit area may be less than the number of first sub-pixels Pm that are arranged per unit area in the main display area MDA.

Figure 2:
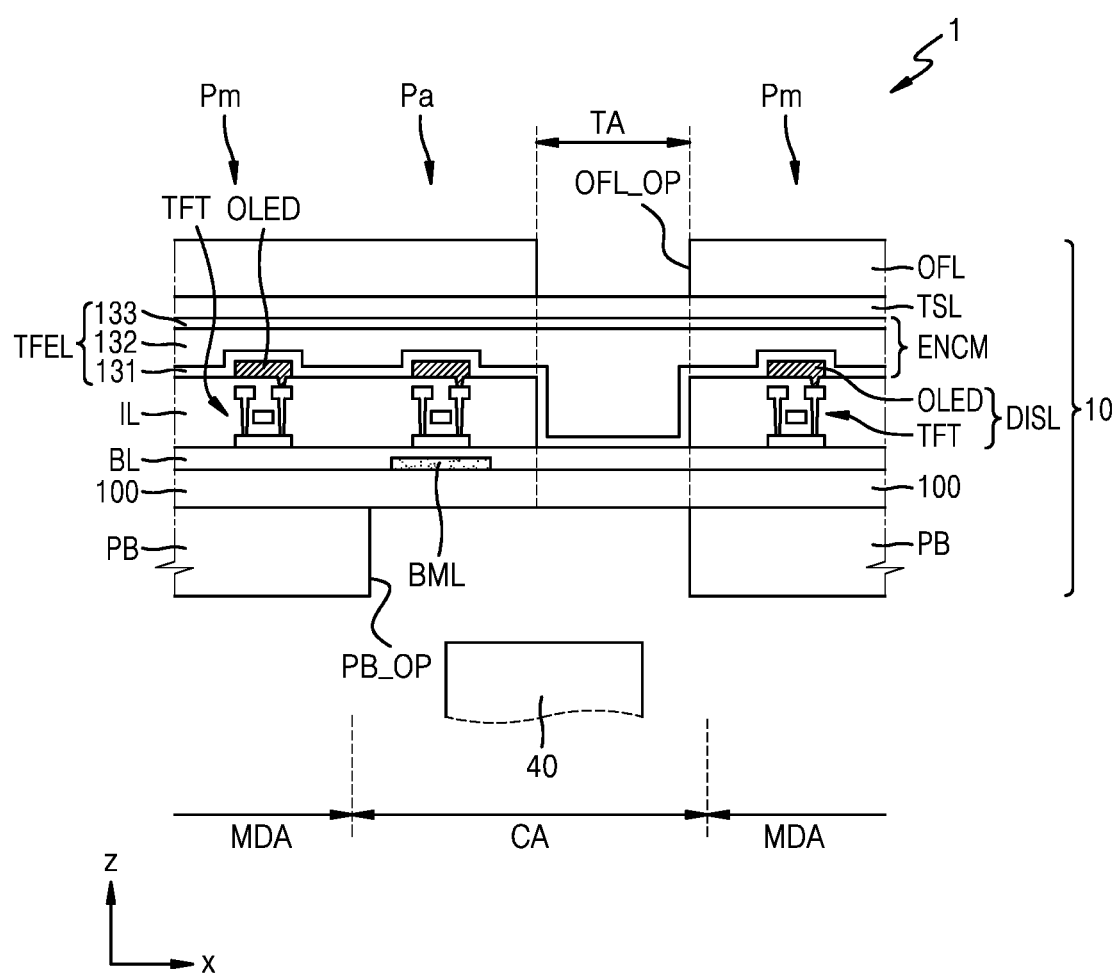
FIG. 2 is a cross-sectional view schematically illustrating a portion of a display device according to an exemplary embodiment.

FIG. 2 is a cross-sectional view of the display device 1 according to an exemplary embodiment.

Referring to FIG. 2, the display device 1 may include a display panel 10 and the component 40 overlapping the display panel 10. In some exemplary embodiments, a cover window protecting the display panel 10 may be further arranged on the display panel 10.

The display panel 10 includes the component area CA overlapping the component 40, and the main display area MDA where a main image is displayed. The display panel 10 may include a substrate 100, a display layer DISL on the substrate 100, an encapsulation member ENCM, a touch screen layer TSL, and an optical functional layer OFL on the display layer DISL. A panel protection member PB may be arranged under the substrate 100.

The display layer DISL may include a pixel circuit including a thin film transistor TFT of each of a first sub-pixel Pm and a second sub-pixel Pa, an organic light-emitting diode OLED as a display element, a buffer layer BL, and an insulating layer IL. The encapsulation member ENCM may include a thin film encapsulation layer TFEL or a sealing substrate (not shown).

The substrate 100 may include an insulative material, such as glass, quartz, and polymer resin. The substrate 100 may be a rigid substrate or a flexible substrate that is bendable, foldable, or rollable.

The transmission area TA, where the thin film transistor TFT and the organic light-emitting diode OLED are not arranged, may be arranged in the component area CA. The transmission area TA may be an area where light/signal emitted from the component 40 corresponding to the component area CA or light/signal incident on the component 40 is transmitted.

A bottom metal layer BML may be arranged in the component area CA. The bottom metal layer BML may correspond to a lower portion of the pixel circuit. For example, the bottom metal layer BML may be arranged between the thin film transistor TFT and the substrate 100. The bottom metal layer BML may prevent external light from reaching the thin film transistor TFT. In some exemplary embodiments, a constant voltage or a signal may be applied to the bottom metal layer BML.

The display layer DISL may be covered with the thin film encapsulation layer TFEL or may be covered with the sealing substrate. In some exemplary embodiments, the thin film encapsulation layer TFEL may include at least one inorganic encapsulation layer and at least one organic encapsulation layer. According to an exemplary embodiment, the thin film encapsulation layer TFEL may include first and second inorganic encapsulation layers 131 and 133 and an organic encapsulation layer 132 therebetween.

The first and second inorganic encapsulation layers 131 and 133 may include one or more inorganic insulating materials among aluminum oxide, titanium oxide, tantalum oxide, hafnium oxide, zinc oxide, silicon oxide, silicon nitride, and silicon oxynitride. The organic encapsulation layer 132 may include a polymer-based material, such as an acrylic resin, an epoxy resin, polyimide, and/or polyethylene.

When the display layer DISL is sealed by a sealing substrate (not shown), the sealing substrate may face the substrate 100 with the display layer DISL therebetween. In this case, a gap may be formed between the sealing substrate and the display layer DISL. The sealing substrate may include glass. A sealant including a frit, etc. may be arranged between the substrate 100 and the sealing substrate, and the sealant may be arranged in the peripheral area DPA described above. The sealant arranged in the peripheral area DPA may prevent lateral penetration of moisture while surrounding the display area DA.

The touch screen layer TSL may obtain coordinate information according to an external input, for example, a touch event. The touch screen layer TSL may include a touch electrode and touch wires connected to the touch electrode. The touch screen layer TSL may sense an external input according to a self-capacitance method or a mutual capacitance method.

The touch screen layer TSL may be formed on the thin-film encapsulation layer TFEL. Alternatively, the touch screen layer TSL may be separately formed on a touch substrate, and then combined to the thin film encapsulation layer TFEL through an adhesive layer such as an optically clear adhesive (OCA). According to an exemplary embodiment, the touch screen layer TSL may be directly formed on the thin film encapsulation layer TFEL, and in this case, there may be no adhesive layer between the touch screen layer TSL and the thin film encapsulation layer TFEL.

The optical functional layer OFL may include an anti-reflection layer. The anti-reflection layer may reduce reflectance of light (e.g., external light) incident from the outside toward the display device 1.

In some exemplary embodiments, the optical functional layer OFL may include a polarizing film. The optical functional layer OFL may have an opening OFL_OP corresponding to the transmission area TA. In this manner, the light transmittance in the transmission area TA may be significantly improved. The opening OFL_OP may be filled with a transparent material, such as optically clear resin (OCR).

In some exemplary embodiments, the optical functional layer OFL may include a filter plate including a black matrix and color filters.

In some exemplary embodiments, the optical functional layer OFL may further include a multi-layer structure on the anti-reflection layer. The multi-layer structure may include a first layer and a second layer on the first layer. The first layer and the second layer may include an organic insulating material and may have different refractive indexes from each other. For example, a refractive index of the second layer may be greater than a refractive index of the first layer.

A cover window (not shown) may be arranged on the display panel 10 to protect the display panel 10. The optical functional layer OFL may be attached to the cover window with OCA or may be attached to the touch screen layer TSL with OCA.

The panel protection member PB may be attached to a lower portion of the substrate 100 to support and protect the substrate 100. The panel protection member PB may include an opening PB_OP corresponding to the component area CA. As the panel protection member PB includes the opening PB_OP, the light transmittance in the component area CA may be improved. The panel protection member PB may include polyethylene terephthalate (PET) or polyimide (PI).

The component area CA may have a larger area than an area where the component 40 is arranged. Accordingly, an area of the opening PB_OP included in the panel protection member PB may be different from an area of the component area CA.

In some exemplary embodiments, a plurality of components 40 may be arranged in the component area CA. The plurality of components 40 may have different functions from each other. For example, the plurality of components 40 may include at least two among a camera (an imaging device), a solar cell, a flash, a proximity sensor, an illuminance sensor, and an iris sensor, without being limited thereto.

Figure 3:
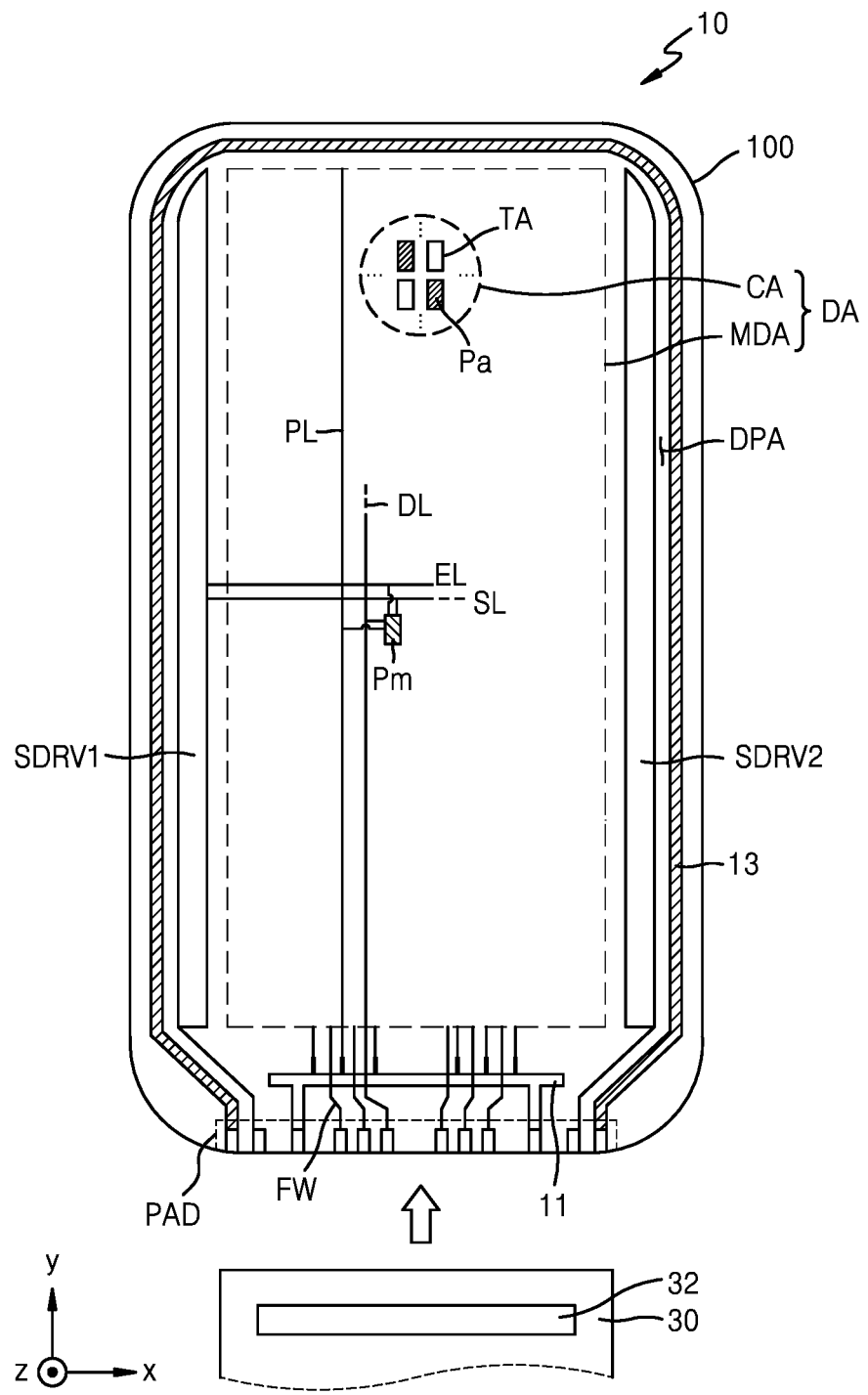
FIG. 3 is a plan view schematically illustrating a display panel according to an exemplary embodiment.

FIG. 3 is a plan view schematically illustrating the display panel 10 according to an exemplary embodiment.

Referring to FIG. 3, various elements forming the display panel 10 are arranged on the substrate 100. The substrate 100 includes the display area DA and the peripheral area DPA surrounding the display area DA. The display area DA includes the main display area MDA on which a main image is displayed, and the component area CA which includes the transmission area TA and on which an auxiliary image is displayed. The auxiliary image may display a single image together with the main image, or may display an image independent from the main image.

The plurality of first sub-pixels Pm are arranged in the main display area MDA. The first sub-pixels Pm may each include a display element such as the organic light-emitting diode OLED. Each first sub-pixel Pm may emit, for example, red, green, blue, or white light. The main display area MDA may be covered with an encapsulation member, and thus, may be protected from ambient air, moisture, or the like.

As described above, the component area CA may be on one side of the main display area MDA, or may be arranged inside the display area DA and surrounded by the main display area MDA. The plurality of second sub-pixels Pa are arranged in the component area CA. The second sub-pixels Pa may each include a display element such as the organic light-emitting diode OLED. Each second sub-pixel Pa may emit, for example, red, green, blue, or white light. The component area CA may be covered with an encapsulation member, and thus, may be protected from ambient air, moisture, or the like.

The component area CA may have the transmission area TA. The transmission area TA may surround the plurality of second sub-pixels Pa. Alternatively, the transmission area TA may be arranged as a grid with the plurality of second sub-pixels Pa.

Because the component area CA has the transmission areas TA, a resolution of the component area CA may be lower than a resolution of the main display area MDA. For example, the resolution of the component area CA may be about ½, ⅜, ⅓, ¼, 2/9, ⅛, 1/9, or 1/16 of the resolution of the main display area MDA. For example, the resolution of the main display area MDA may be about 400 ppi or greater, and the resolution of the component area CA may be about 200 ppi or about 100 ppi.

Pixel circuits configured to drive the first and second sub-pixels Pm and Pa may each be electrically connected to peripheral circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits for driving the first and second sub-pixels Pm and Pa through a scan line SL. The first scan driving circuit SDRV1 may apply an emission control signal to each pixel circuit through an emission control line EL. The second scan driving circuit SDRV2 may be disposed opposite to the first scan driving circuit SDRV1 with respect to the main display area MDA, and may be disposed substantially parallel to the first scan driving circuit SDRV1. Some of the pixel circuits for the first sub-pixels Pm of the main display area MDA may be electrically connected to the first scan driving circuit SDRV1, and the others may be electrically connected to the second scan driving circuit SDRV2. Some of the pixel circuits for the second sub-pixels Pa of the component area CA may be electrically connected to the first scan driving circuit SDRV1, and the others may be electrically connected to the second scan driving circuit SDRV2. In some exemplary embodiment, the second scan driving circuit SDRV2 may be omitted.

The terminal portion PAD may be arranged on one side of the substrate 100. The terminal portion PAD may not be covered by an insulating layer, but may be exposed and connected to a display circuit board 30. A display driver 32 may be arranged on the display circuit board 30.

The display driver 32 may generate control signals which are transmitted to the first scan driving circuit SDRV1 and the second scan driving circuit SDRV2. The display driver 32 may generate a data signal, and the generated data signal may be transmitted to the pixel circuits of the first and second sub-pixels Pm and Pa through a fan-out wire FW and a data line DL connected to the fan-out wire FW.

The display driver 32 may supply a driving voltage ELVDD to the driving voltage supply line 11 and may supply a common voltage ELVSS to the common voltage supply line 13. The driving voltage ELVDD may be applied to the pixel circuits of the first and second sub-pixels Pm and Pa through a driving voltage line PL connected to the driving voltage supply line 11, and the common voltage ELVSS may be applied to an opposite electrode of the display element through the common voltage supply line 13.

The driving voltage supply line 11 may be connected to the terminal portion PAD and may extend in one direction (e.g., x-axis direction) at a lower side of the main display area MDA. The common voltage supply line 13 may be connected to the terminal portion PAD, and may have a loop shape in which one side thereof is opened to partially surround the main display area MDA.

Figure 4:
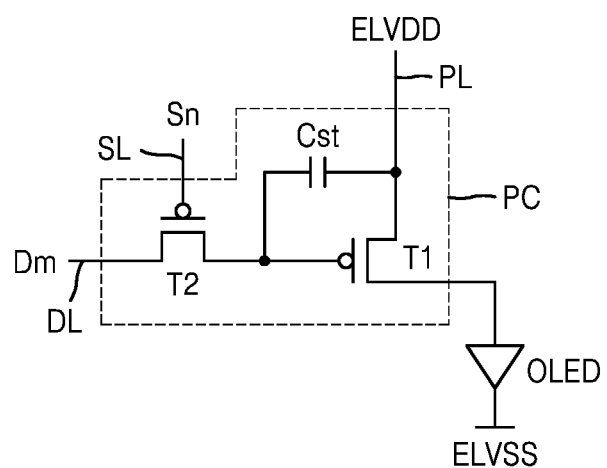
FIGS. 4 and 5 are each an equivalent circuit diagram of a pixel circuit for driving first and second sub-pixels according to an exemplary embodiment.
Figure 5:
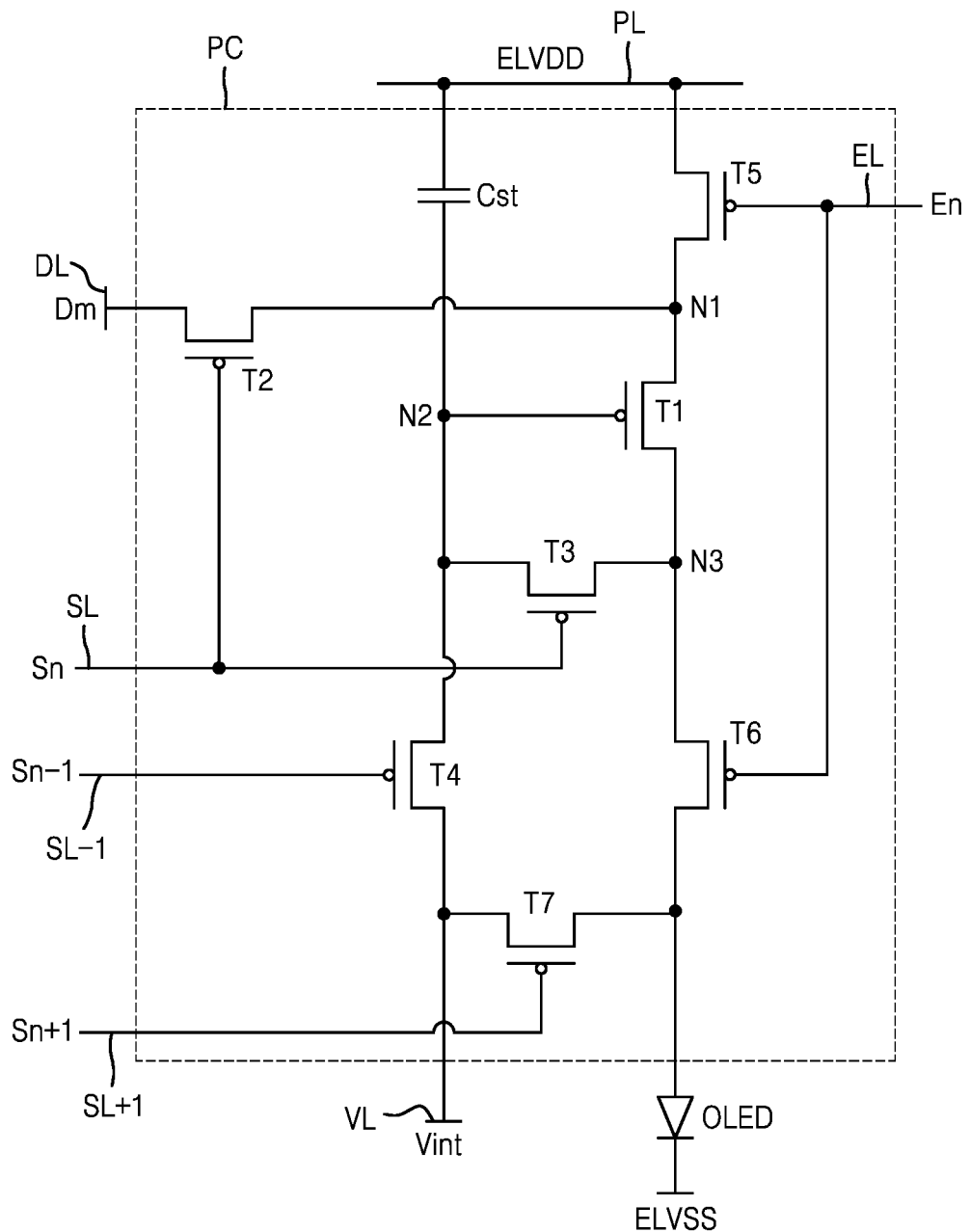

FIGS. 4 and 5 each show an equivalent circuit diagram of a pixel circuit PC configured to drive the first and second sub-pixels Pm and Pa according to an exemplary embodiment.

Referring to FIG. 4, the pixel circuit PC may be connected to a light-emitting device to implement emission of sub-pixels. The light-emitting device may be the organic light-emitting diode OLED. The pixel circuit PC includes a driving transistor T1, a switching transistor T2, and a capacitor Cst. The switching transistor T2 is connected to the scan line SL and the data line DL, and is configured to transmit a data signal Dm input via the data line DL to the driving transistor T1 according to a scan signal Sn input via the scan line SL.

The capacitor Cst is connected to the switching transistor T2 and the driving voltage line PL, and stores a voltage corresponding to a difference between a voltage received from the switching transistor T2 and the driving voltage ELVDD supplied to the driving voltage line PL.

The driving transistor T1 is connected to the driving voltage line PL and the capacitor Cst, and may control a driving current flowing through the organic light-emitting diode OLED from the driving voltage line PL in response to a voltage value stored in the capacitor Cst. The organic light-emitting diode OLED may emit light having certain brightness according to the driving current.

Although FIG. 4 exemplarily illustrates that the pixel circuit PC includes two thin film transistors and one capacitor, the inventive concepts are not limited thereto.

Referring to FIG. 5, the pixel circuit PC may include first to seventh transistors T1 to T7, and depending on the type (p-type or n-type) and/or operation condition of a transistor, a first terminal of each of the first to seventh transistors T1 to T7 may be a source terminal or a drain terminal, and a second terminal may be a terminal different from the first terminal. For example, the first terminal may be a source terminal, and the second terminal may be a drain terminal.

The pixel circuit PC may be connected to a first scan line SL configured to transmit a first scan signal Sn, a second scan line SL-1 configured to transmit a second scan signal Sn-1, a third scan line SL+1 configured to transmit a third scan signal Sn+1, an emission control line EL configured to transmit an emission control signal En, the data line DL configured to transmit the data signal Dm, the driving voltage line PL configured to transmit the driving voltage ELVDD, and an initialization voltage line VL configured to transmit an initialization voltage Vint.

The first transistor T1 includes a gate terminal connected to a second node N2, a first terminal connected to a first node N1, and a second terminal connected to a third node N3. The first transistor T1 functions as a driving transistor, and receives the data signal Dm according to a switching operation of the second transistor T2, and thus, supplies a driving current to a light-emitting device. The light-emitting device may be the organic light-emitting diode OLED.

The second transistor T2 (e.g., switching transistor) includes a gate terminal connected to the first scan line SL, a first terminal connected to the data line DL, and a second terminal connected to the first node N1 (or the first terminal of the first transistor T1). The second transistor T2 may be turned on according to the first scan signal Sn received via the first scan line SL to perform a switching operation for transmitting the data signal Dm received via the data line DL to the first node N1.

The third transistor T3 (e.g., compensation transistor) includes a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on according to the first scan signal Sn received via the first scan line SL to diode-connect the first transistor T1 to compensate a threshold voltage of the first transistor T1. The third transistor T3 may have a structure in which two or more transistors are connected in series.

The fourth transistor T4 (e.g., first initialization transistor) includes a gate terminal connected to the second scan line SL-1, a first terminal connected to the initialization voltage line VL, and a second terminal connected to the second node N2. The fourth transistor T4 may be turned on according to the second scan signal Sn-1 received via the second scan line SL-1 to initialize a gate voltage of the first transistor T1 by transmitting the initialization voltage Vint to the gate terminal of the first transistor T1. The fourth transistor T4 may have a structure in which two or more transistors are connected in series.

The fifth transistor T5 (e.g., first emission control transistor) includes a gate terminal connected to the emission control line EL, a first terminal connected to the driving voltage line PL, and a second terminal connected to the first node N1. The sixth transistor T6 (e.g., second emission control transistor) includes a gate terminal connected to the emission control line EL, a first terminal connected to the third node N3, and a second terminal connected to a pixel electrode of the organic light-emitting diode OLED. The fifth transistor T5 and the sixth transistor T6 may be simultaneously turned on according to the emission control signal En received via the emission control line EL so that a current flows through the organic light-emitting diode OLED.

The seventh transistor T7 (e.g., second initialization transistor) includes a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on according to the third scan signal Sn+1 received via the third scan line SL+1 to initialize a voltage of the pixel electrode of the organic light-emitting diode OLED by transmitting the initialization voltage Vint to the pixel electrode of the organic light-emitting diode OLED. In some exemplary embodiments, the seventh transistor T7 may be omitted.

The capacitor Cst includes a first electrode connected to the second node N2 and a second electrode connected to the driving voltage line PL.

The organic light-emitting diode OLED includes a pixel electrode and an opposite electrode facing the pixel electrode, and the opposite electrode may receive the common voltage ELVSS. The organic light-emitting diode OLED may receive a driving current from the first transistor T1, and thus, may emit light in a certain color, thereby displaying an image. The opposite electrode may be provided in common, such as being formed integrally with a plurality of sub-pixels.

Although FIG. 5 exemplarily shows that the fourth transistor T4 and the seventh transistor T7 are respectively connected to the second scan line SL-1 and the third scan line SL+1, the inventive concepts are not limited thereto. According to another exemplary embodiment, both of the fourth transistor T4 and the seventh transistor T7 may be connected to the second scan line SL-1 and be driven according to the second scan signal Sn-1. In addition, in FIG. 5, the second transistor T2 and the third transistor T3 are exemplarily illustrated as being connected to the same first scan line SL, but in another exemplary embodiment, the second transistor T2 and the third transistor T3 may be respectively connected to different scan lines and be driven.

Pixel circuits PC configured to drive the first sub-pixel Pm and the second sub-pixel Pa may be the same or different from each other. For example, each of the pixel circuit PC configured to drive the first sub-pixel Pm and the pixel circuit PC configured to drive the second sub-pixel Pa may be provided with the pixel circuit PC shown in FIG. 5. According to another exemplary embodiment, the pixel circuit PC configured to drive the first sub-pixel Pm may employ the pixel circuit PC shown in FIG. 5, and the pixel circuit PC configured to drive the second sub-pixel Pa may employ the pixel circuit PC shown in FIG. 4, or vice versa.

In FIGS. 4 and 5, transistors of the pixel circuit are exemplarily illustrated as P-type transistors, but the inventive concepts are not limited thereto. For example, transistors of the pixel circuit in other exemplary embodiments may be N-type transistors, or some transistors may be P-type transistors and the other transistors may be N-type transistors.

Figure 6:
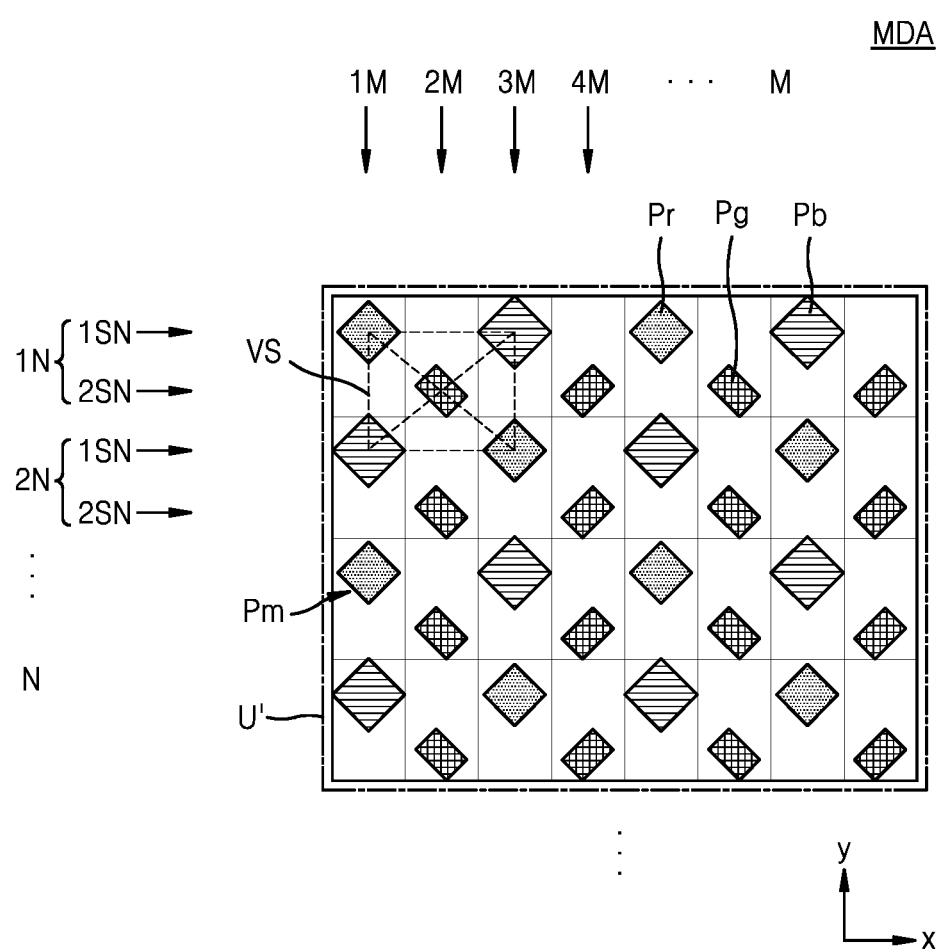
FIG. 6 is a layout diagram schematically illustrating a pixel arrangement structure in a main display area according to an exemplary embodiment.

FIG. 6 is a layout diagram schematically illustrating a pixel arrangement structure in the main display area MDA according to an exemplary embodiment.

Referring to FIG. 6, the plurality of first sub-pixels Pm may be arranged in the main display area MDA. As used herein, a sub-pixel refers to an emission area as a minimum unit for implementing an image. When an organic light-emitting diode is employed as a display element, the emission area of a sub-pixel may be defined by an emission layer or an opening of a pixel-defining layer. This will be described in more detail later below.

As shown in FIG. 6, the first sub-pixels Pm disposed in the main display area MDA may be arranged in a pentile structure. The first sub-pixels Pm may include a red sub-pixel Pr, a green sub-pixel Pg, and a blue sub-pixel Pb, and the red sub-pixel Pr, the green sub-pixel Pg, and the blue sub-pixel Pb may implement red, green, and blue colors, respectively.

The red sub-pixel Pr and the blue sub-pixel Pb may be alternately arranged in a first sub-row 1SN of each row N, green sub-pixels Pg may be spaced apart at predetermined intervals in an adjacent second sub-row 2SN, and such pixel arrangement may be repeated until an $N^{th}$ row. The blue sub-pixel Pb and the red sub-pixel Pr may be larger than the green sub-pixel Pg. The red sub-pixel Pr and the blue sub-pixel Pb arranged in the first sub-row 1SN, and the green sub-pixel Pg arranged in the second sub-row 2SN may be staggered with respect to each other. Accordingly, the red sub-pixel Pr and the blue sub-pixel Pb may be alternately arranged in a first column 1M, the green sub-pixels Pg may be spaced apart at predetermined intervals in an adjacent second column 2M, the blue sub-pixel Pb and the red sub-pixel Pr may be alternately arranged in an adjacent third column 3M, the green sub-pixels Pg may be spaced apart at predetermined intervals in an adjacent fourth column 4M, and such pixel arrangement may be repeated until an $M^{th}$ column.

More particularly, the red sub-pixels Pr are arranged on first and third vertices facing each other among vertices of a virtual quadrilateral VS, in which the green sub-pixel Pg is paced at a center of the quadrilateral, and blue sub-pixels Pb are arranged on second and fourth vertices, which are the other vertices. In some exemplary embodiments, the virtual quadrilateral VS may be variously modified into a rectangle, a rhombus, a square, etc.

The pixel arrangement structure described above is referred to as a pentile matrix structure or a pentile structure. In this manner, by applying rendering, in which a color of a pixel is represented by sharing the colors of its adjacent pixels, a high resolution may be obtained via a small number of pixels.

Although FIG. 6 exemplarily shows that the first sub-pixels Pm are arranged in a pentile structure, the inventive concepts are not limited thereto. For example, in some exemplary embodiments, the first sub-pixels Pm may be arranged in various shapes, such as a stripe structure, a mosaic arrangement structure, and a delta arrangement structure.

FIGS. 7A to 7D are layout diagrams schematically illustrating a pixel arrangement structure in the component area CA according to exemplary embodiments.

Figure 7A:
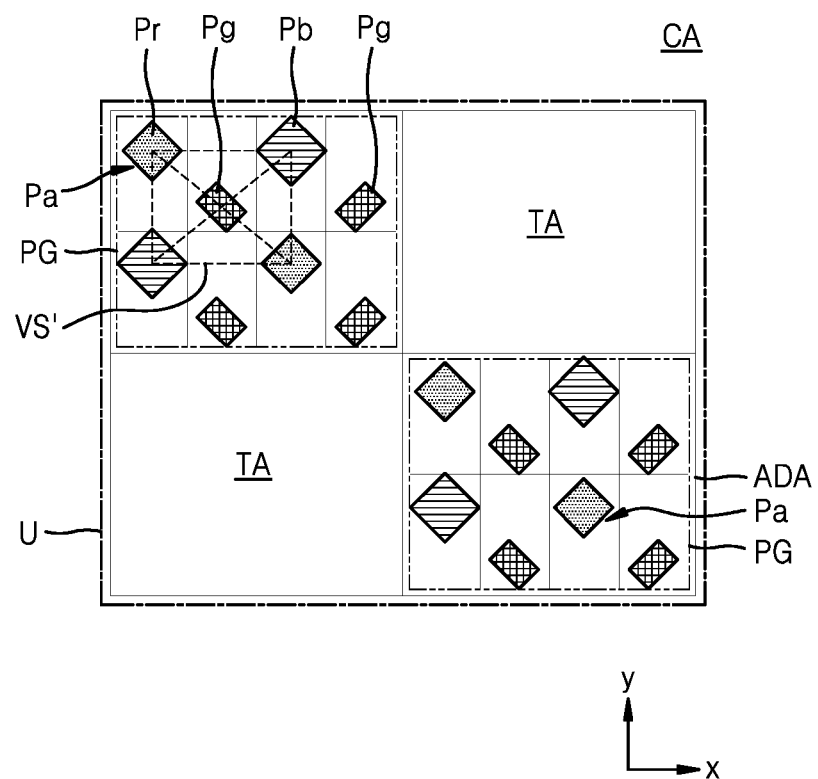
FIGS. 7A, 7B, 7C, and 7D are layout diagrams schematically illustrating a pixel arrangement structure in a component area according to exemplary embodiments.

Referring to FIG. 7A, the plurality of second sub-pixels Pa may be arranged in the component area CA. The second sub-pixels Pa may include the red sub-pixel Pr, the green sub-pixel Pg, and the blue sub-pixel Pb, and the red sub-pixel Pr, the green sub-pixel Pg, and the blue sub-pixel Pb may implement red, green, and blue colors, respectively.

The component area CA may have a sub-pixel area ADA and the transmission area TA. The sub-pixel area ADA may be an area in which the second sub-pixels Pa are arranged. A pixel group PG including at least one second sub-pixel Pa may be arranged in the sub-pixel area ADA. The sub-pixel area ADA and the transmission area TA may be alternately arranged in one direction (e.g., x-axis direction and another direction (e.g., y-axis direction), and for example, may be arranged in a grid. In this case, the component area CA may have a plurality of sub-pixel areas ADA and a plurality of transmission areas TA. Pixel circuits connected to the second sub-pixels Pa of the pixel group PG may be arranged in the sub-pixel area ADA.

The pixel group PG may be defined as a collection of sub-pixels in which the second sub-pixels Pa are grouped in a preset unit. For example, as shown in FIG. 7A, one pixel group PG may include eight second sub-pixels Pa arranged in a pentile structure. More particularly, one pixel group PG according to the illustrated exemplary embodiment may include two red sub-pixels Pr, four green sub-pixels Pg, and two blue sub-pixels Pb.

In the component area CA, a basic unit U in which a predetermined number of pixel groups PG and a predetermined number of transmission areas TA are grouped may be repeatedly arranged in the x-axis direction and the y-axis direction. In FIG. 7A, the basic unit U may have a shape in which two pixel groups PG and two adjacent transmission areas TA are grouped in a quadrilateral shape. The basic unit U refers to a partition of repetitive shapes and does not mean the disconnection of configurations.

As shown in FIG. 6, a corresponding unit U' having the same area as that of the basic unit U may be set in the main display area MDA. In this case, the number of first sub-pixels Pm included in the corresponding unit U' may be greater than the number of second sub-pixels Pa included in the basic unit U. For example, the number of second sub-pixels Pa included in the basic unit U may be 16, and the number of first sub-pixels Pm included in the corresponding unit U' may be 32. As such, the number of second sub-pixels Pa and the number of first sub-pixels Pm arranged per the same area may be provided at a ratio of 1:2.

Similar to arrangement of the first sub-pixels Pm in the main display area MDA, four second sub-pixels Pa may be arranged on vertices of a virtual quadrilateral VS', respectively. Resolution of the component area CA is ½ of that of the main display area MDA, and a pixel arrangement structure of the component area CA may be referred as a ½ pentile structure. The number or arrangement of second sub-pixels Pa included in the pixel group PG may be modified according to resolution of the component area CA.

Figure 7B:
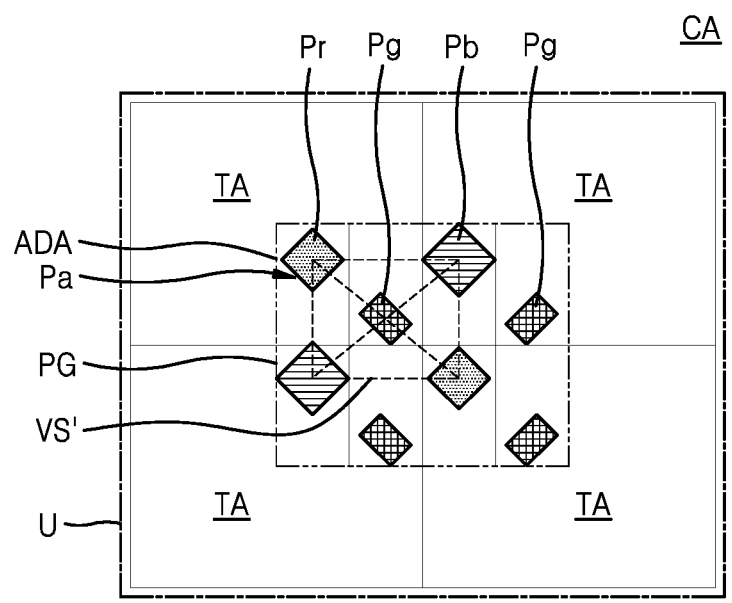

Referring to FIG. 7B, a pixel arrangement structure of the component area CA may have a ¼ pentile structure. In the illustrated exemplary embodiment, eight second sub-pixels Pa are arranged in a pentile structure in the pixel group PG, but only one pixel group PG may be included in the basic unit U. The remaining area of the basic unit U may be provided as the transmission area TA. Accordingly, the number of second sub-pixels Pa and the number of first sub-pixels Pm arranged per the same area may be provided at a ratio of 1:4. In this case, one pixel group PG may be surrounded by the transmission area TA.

Although FIGS. 7A and 7B exemplarily show that the second sub-pixel Pa have the same size as that of the first sub-pixel Pm of FIG. 6, the inventive concepts are not limited thereto. In some exemplary embodiments, a size of the second sub-pixel Pa may be larger than that of the first sub-pixel Pm emitting the same color. For example, a size of the blue sub-pixel Pb of the second sub-pixel Pa may be larger than that of the blue sub-pixel Pb of the first sub-pixel Pm. The difference in size may be determined based on a difference in brightness and/or resolution between the component area CA and the main display area MDA.

In addition, although FIGS. 7A and 7B exemplarily show that the second sub-pixels Pa are arranged in a pentile structure, the inventive concepts are not limited thereto. For example, the second sub-pixels Pa may be arranged in various shapes such as a stripe structure, a mosaic arrangement structure, and a delta arrangement structure.

Figure 7C:
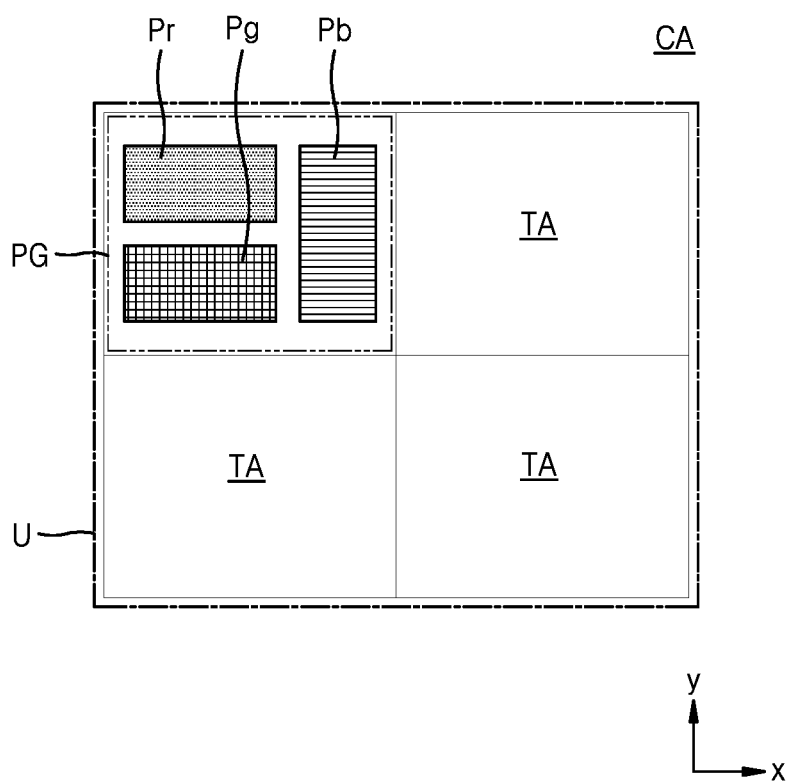

FIG. 7C exemplarily shows an arrangement of the second sub-pixels Pa in an S-stripe structure. In the illustrated exemplary embodiment, one pixel group PG may include a total of three second sub-pixels Pa including one red sub-pixel Pr, one green sub-pixel Pg, and one blue sub-pixel Pb. The red sub-pixel Pr and the green sub-pixel Pg may have a quadrilateral shape having long sides in the x-axis direction, and the blue sub-pixel Pb may have a quadrilateral shape having long sides in the y-axis direction. A length of the blue sub-pixel Pb in the y-axis direction may be the same as or greater than a sum of a length of the red sub-pixel Pr in the y-axis direction y and a length of the green sub-pixel Pg in the y-axis direction. Accordingly, a size of the blue sub-pixel Pb may be larger than sizes of the red sub-pixel Pr and the green sub-pixel Pg. FIG. 7C exemplarily shows that the basic unit U includes only one pixel group PG, but in other exemplary embodiments, the basic unit U may include two or more pixel groups PG. Areas of the second sub-pixels Pa included in the pixel group PG may also be variously modified in other exemplary embodiments.

Figure 7D:
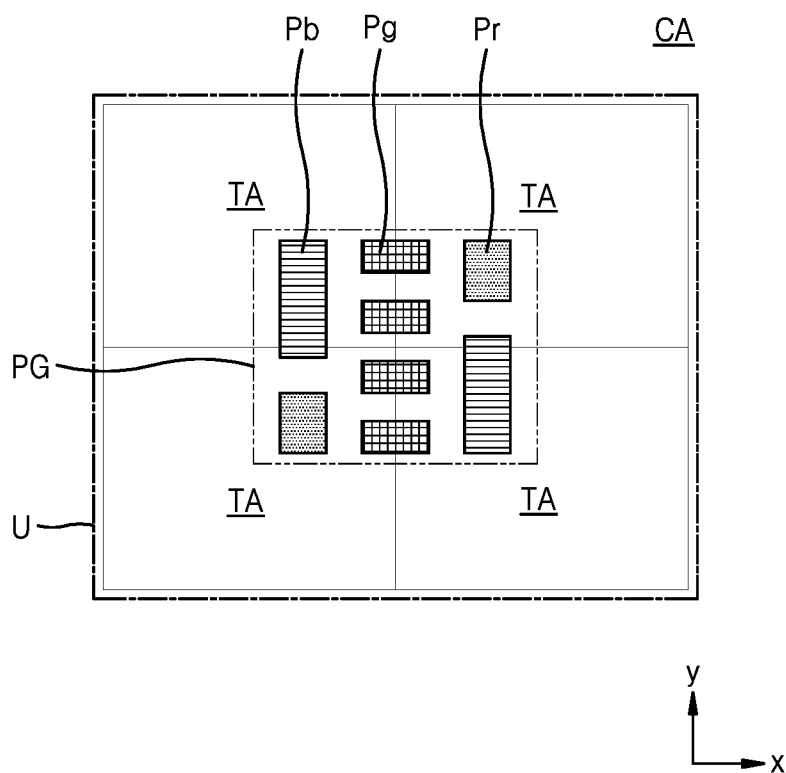

As shown in FIG. 7D, the second sub-pixels Pa included in one pixel group PG according to an exemplary embodiment may include a total of eight second sub-pixels Pa including two red sub-pixels Pr, four green sub-pixels Pg, and two blue sub-pixels Pb. The green sub-pixel Pg may have a quadrilateral shape having long sides in the x-axis direction, and the red sub-pixel Pr and the blue sub-pixel Pb may have a quadrilateral shape having long sides in the y-axis direction. A length of the blue sub-pixel Pb in the y-axis direction may be greater than that of the red sub-pixel Pr in the y-axis direction. The red sub-pixel Pr and the blue sub-pixel Pb may face each other with the green sub-pixel Pg therebetween.

FIGS. 8A to 9G are plan views schematically illustrating shapes of the bottom metal layer BML that may be arranged in the component area CA according to an exemplary embodiment.

Referring to FIGS. 8A to 8E, the bottom metal layer BML may correspond to the component area CA and may include a bottom hole BMLH. The bottom hole BMLH may be a through hole corresponding to the transmission area TA. The bottom metal layer BML and the bottom hole BMLH may have various shapes and sizes.

Figure 8A:
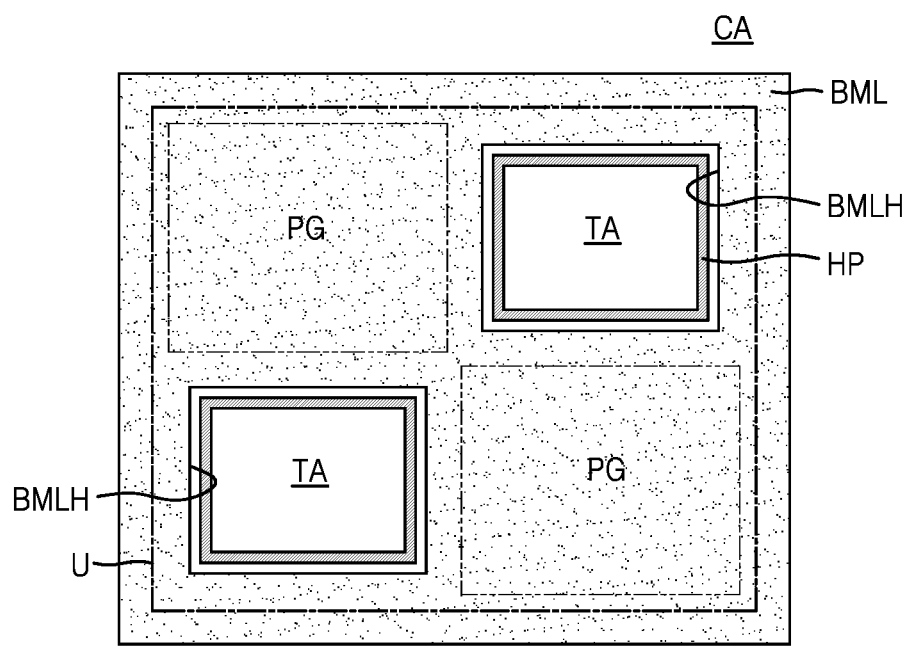
FIGS. 8A, 8B, 8C, 8D, 8E, 9A, 9B, 9C, 9D, 9E, 9F, and 9G are plan views schematically illustrating shapes of a bottom metal layer arranged in a component area according to exemplary embodiments.

Referring to FIG. 8A, the bottom hole BMLH may have a quadrilateral shape, and the bottom hole BMLH may not correspond to the pixel group PG. In this case, a shape and size of the transmission area TA may be defined by a shape and size of the bottom hole BMLH. In a plan view, two bottom holes BMLH may be provided for each basic unit U, and the bottom hole BMLH may be alternately arranged with the pixel group PG.

Figure 8B:
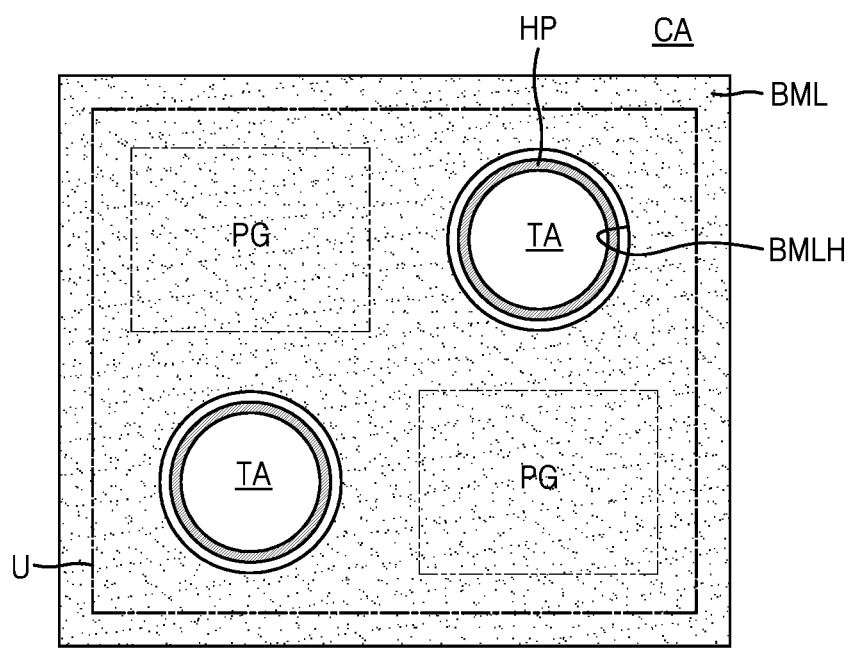
Figure 8C:
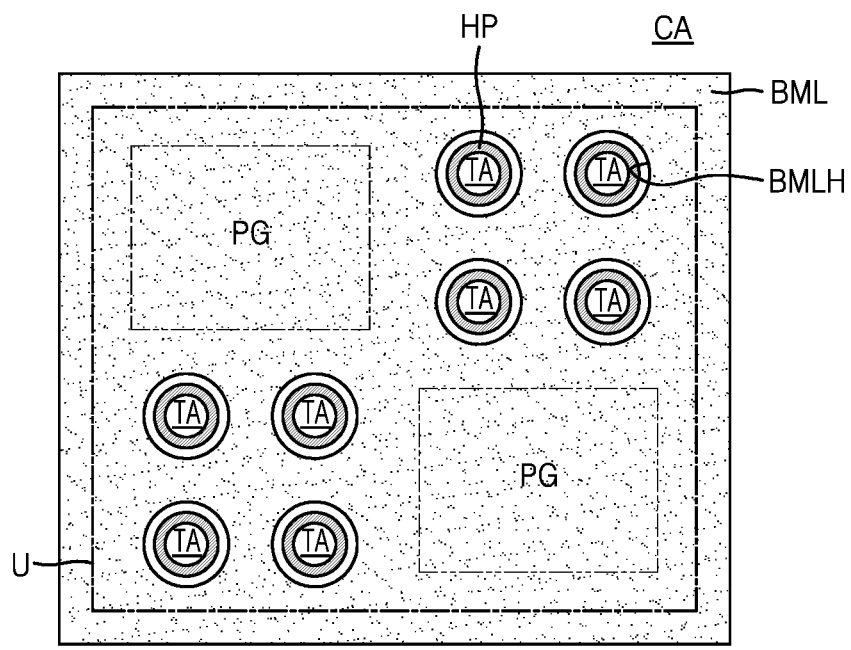

Referring to FIGS. 8B and 8C, the bottom hole BMLH may have a circular shape. When the transmission area TA is nearly circular, diffraction characteristics of light may be improved. As such, when a component arranged below the component area CA is a camera, the transmission area TA may be nearly circular. The bottom hole BMLH may have a polygonal shape with eight or more sides close to a circular shape, or an oval shape. The bottom hole BMLH may have various modifications, for example, there may be one or more bottom holes BMLH between pixel groups PG, as shown in FIG. 8C.

Figure 8D:
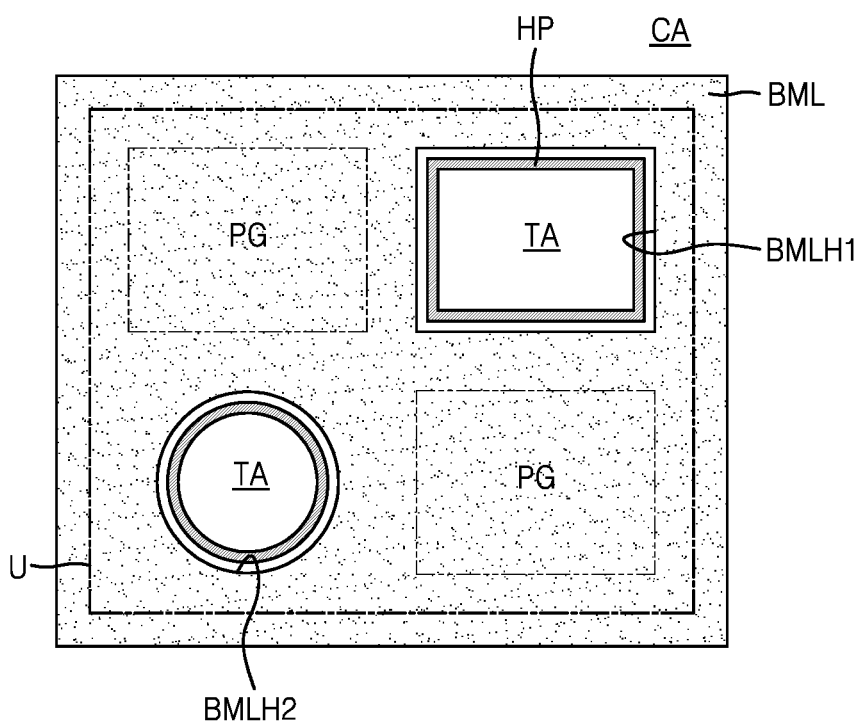

Referring to FIG. 8D, the bottom hole BMLH may include a first bottom hole BMLH1 and a second bottom hole BMLH2 having different shapes from each other. Planar shapes and/or areas (or widths) of the first bottom hole BMLH1 and the second bottom hole BMLH2 may be different from each other. FIG. 8D exemplarily shows that the first bottom hole BMLH1 has a quadrilateral shape, and the second bottom hole BMLH2 has a circular shape, but the inventive concepts are not limited thereto.

In FIGS. 8A to 8D, a wire that connects two pixel group PGs may be arranged between the pixel groups PG, and may not correspond to the bottom hole BMLH.

Figure 8E:
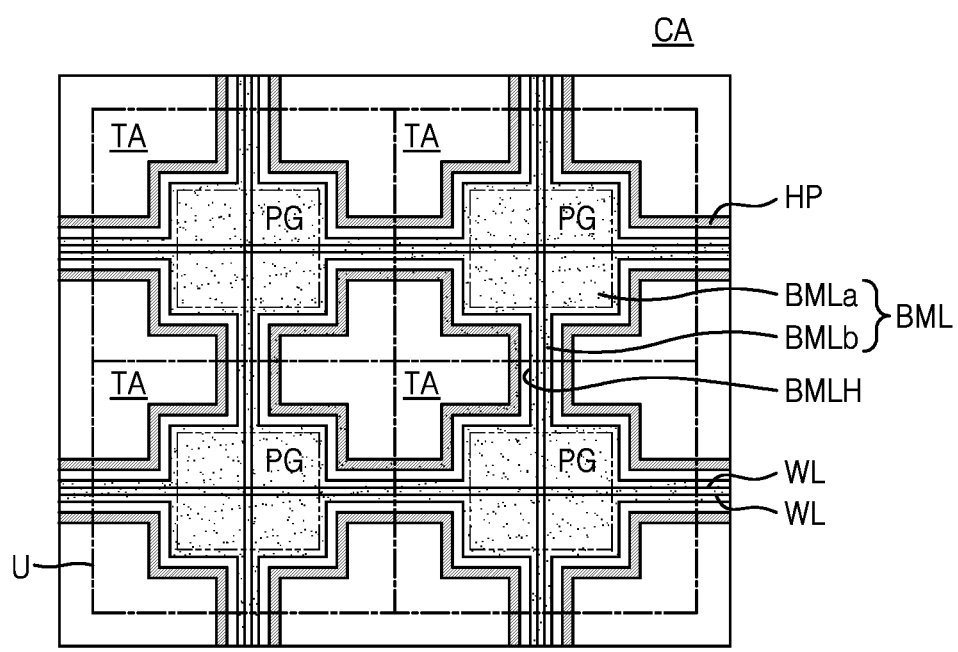

Referring to FIG. 8E, the bottom metal layer BML may include a first bottom metal layer BMLa corresponding to the pixel group PG and a second bottom metal layer BMLb corresponding to a wire WL arranged between the pixel groups PG. A width of the second bottom metal layer BMLb may be less than that of the first bottom metal layer BMLa, and the first bottom metal layer BMLa and the second bottom metal layer BMLb may be integrally provided. Accordingly, the bottom hole BMLH may have substantially a '+' shape. As the bottom metal layer BML corresponds to wires WL, diffraction of light due to a slit formed between the wires WL may be prevented. FIG. 8E exemplarily shows four basic units U.

The bottom hole BMLH may have a curved edge. The bottom hole BMLH may have a curved shape with a smooth edge or may have irregular unevenness (roughness). In some exemplary embodiments, the edge of the bottom hole BMLH may be curved as a whole (or macroscopically) and may have irregular unevenness (roughness) locally (or microscopically).

Figure 9A:
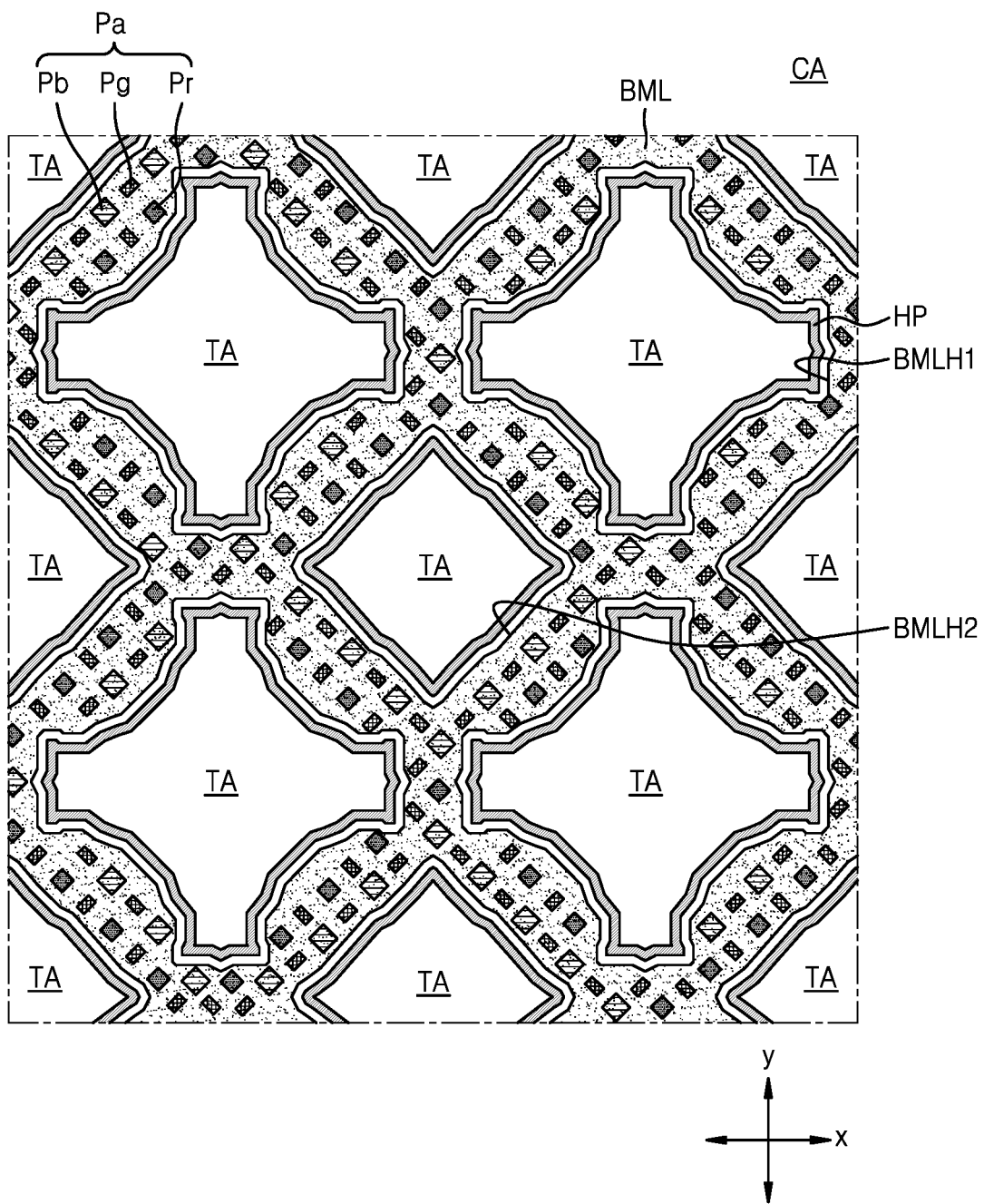

Referring to FIGS. 9A to 9E, the bottom hole BMLH may include the first bottom hole BMLH1 and the second bottom hole BMLH2 having different shapes from each other. FIG. 9A exemplarily shows the bottom metal layer BML corresponding to the second sub-pixels Pa. In FIGS. 9B to 9E, illustration of the second sub-pixels Pa is omitted.

Figure 9B:
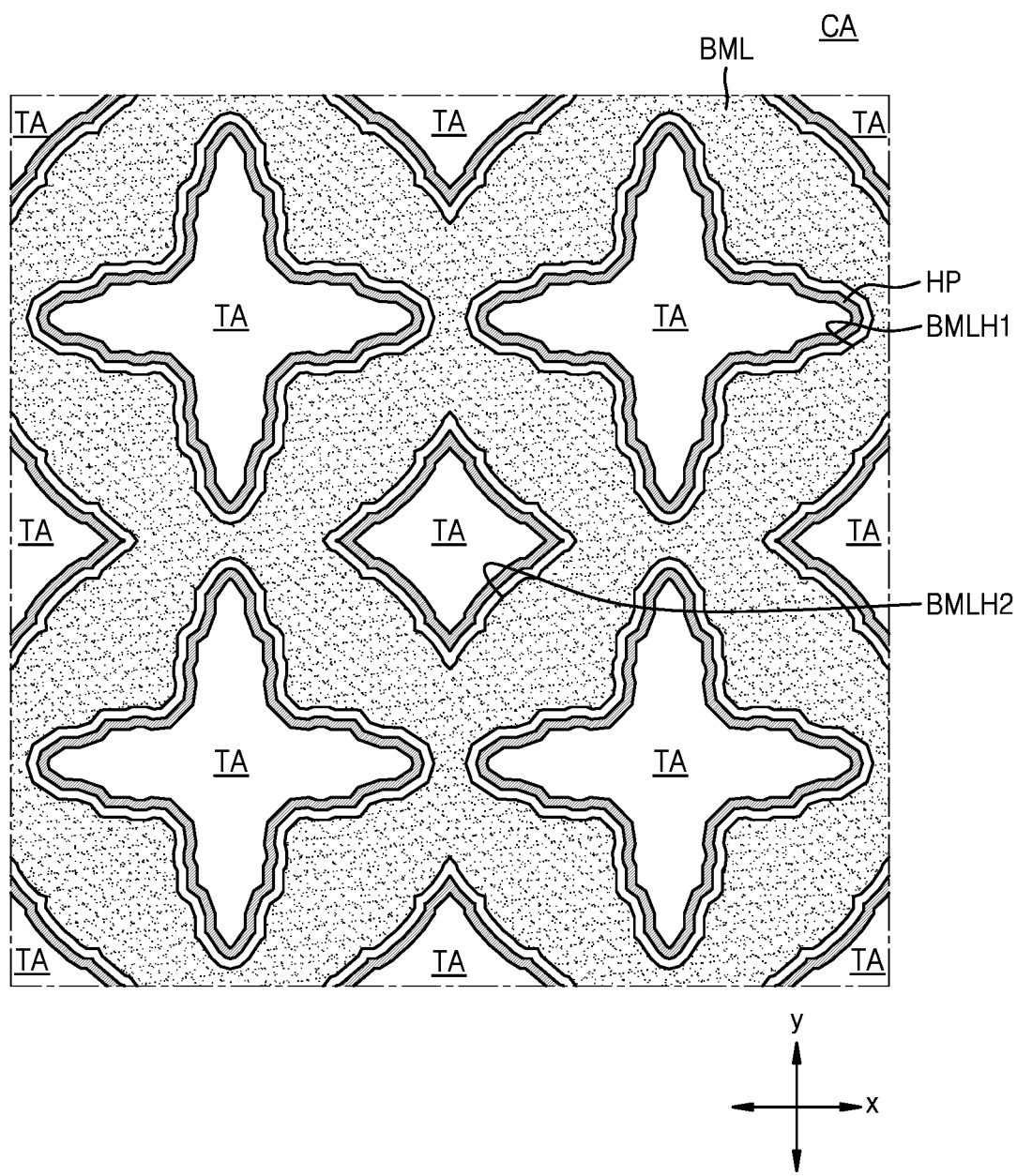
Figure 9C:
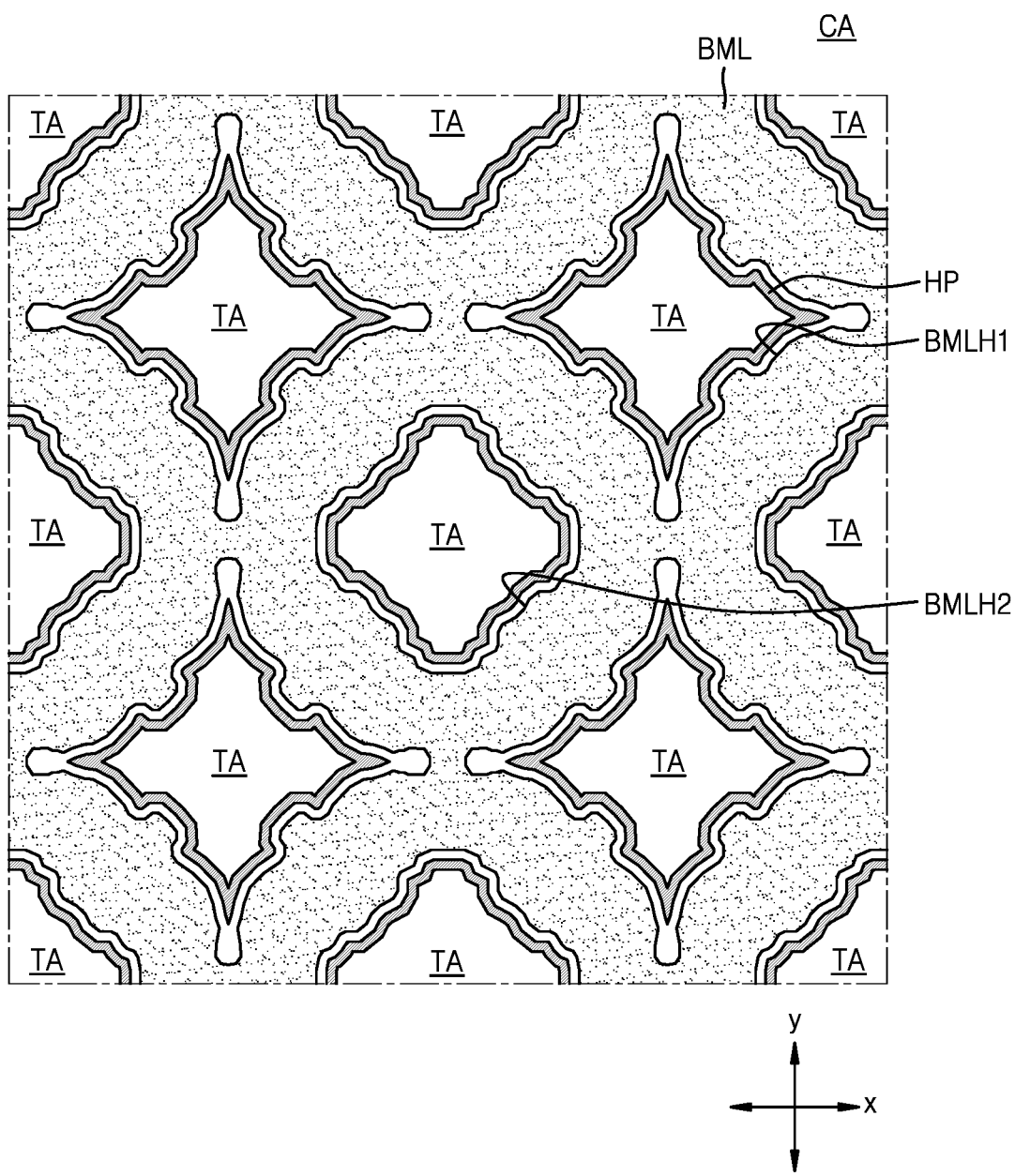
Figure 9D:
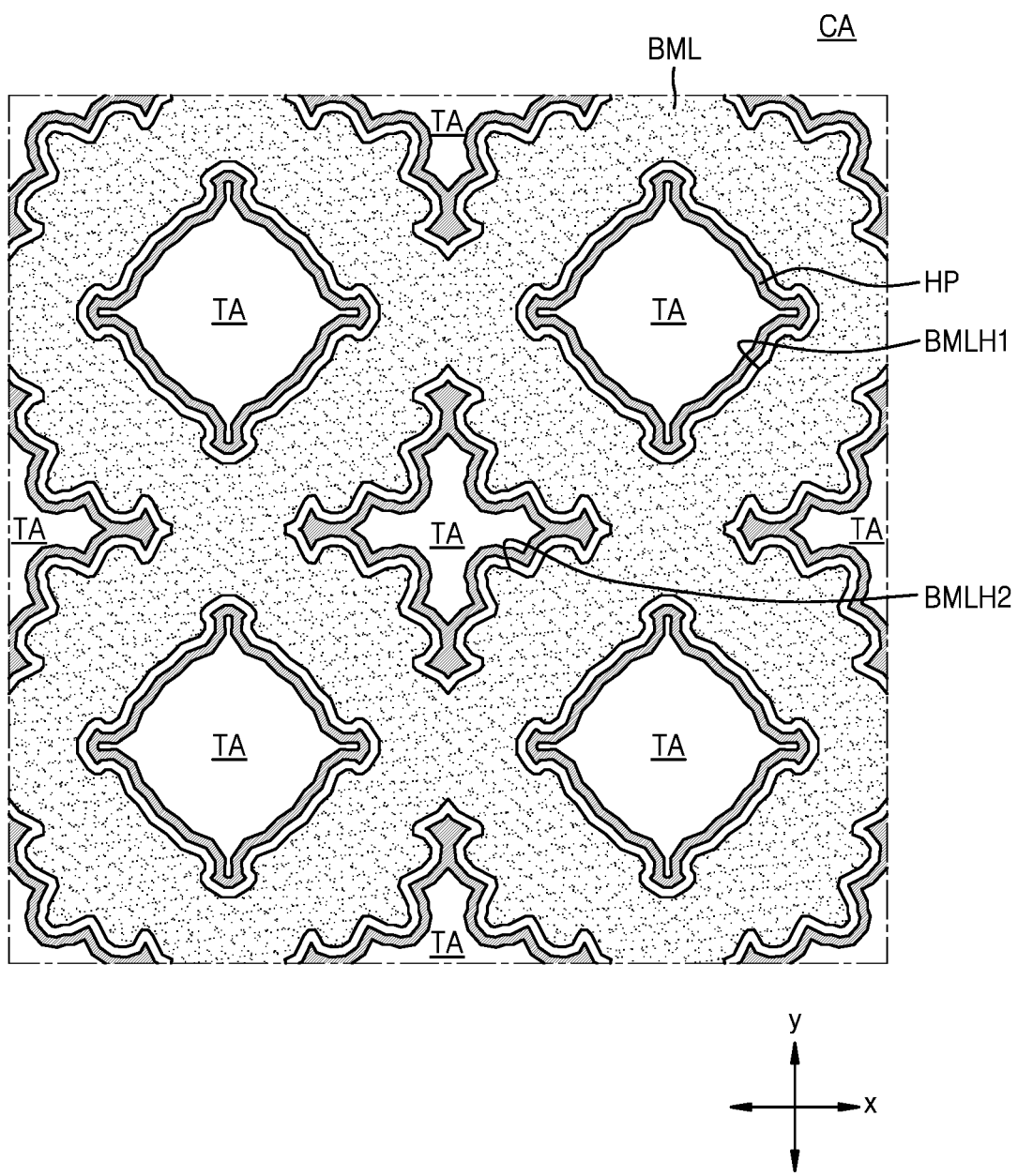

As shown in FIGS. 9A to 9C, the first bottom hole BMLH1 may have substantially a cross shape, and the second bottom hole BMLH2 may have substantially a rhombus shape. In another exemplary embodiment, as shown in FIG. 9D, the first bottom hole BMLH1 may have substantially a rhombus shape, and the second bottom hole BMLH2 may have substantially a cross shape. A plurality of first bottom holes BMLH1 may surround the second bottom hole BMLH2.

Figure 9E:
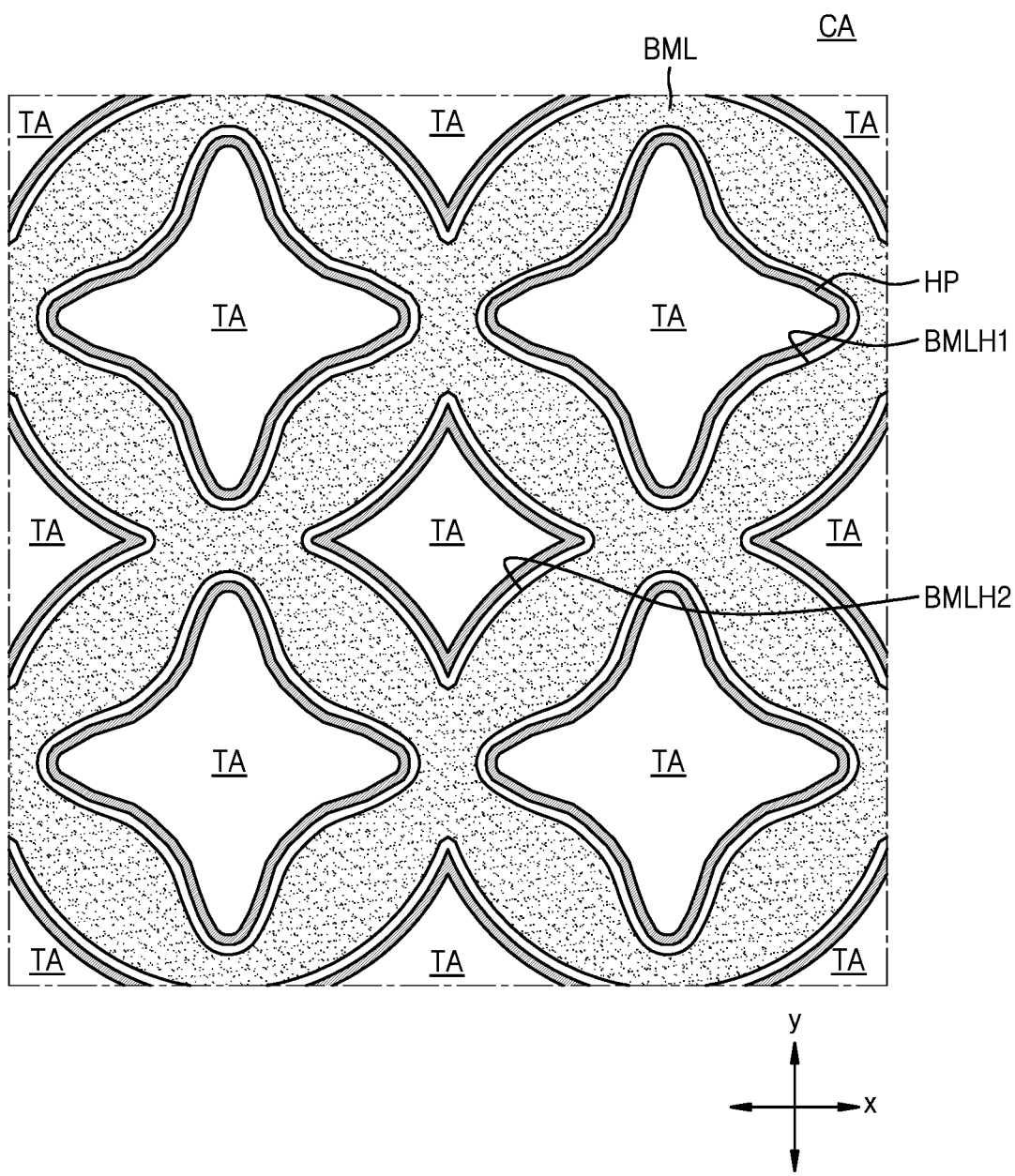
Figure 9F:
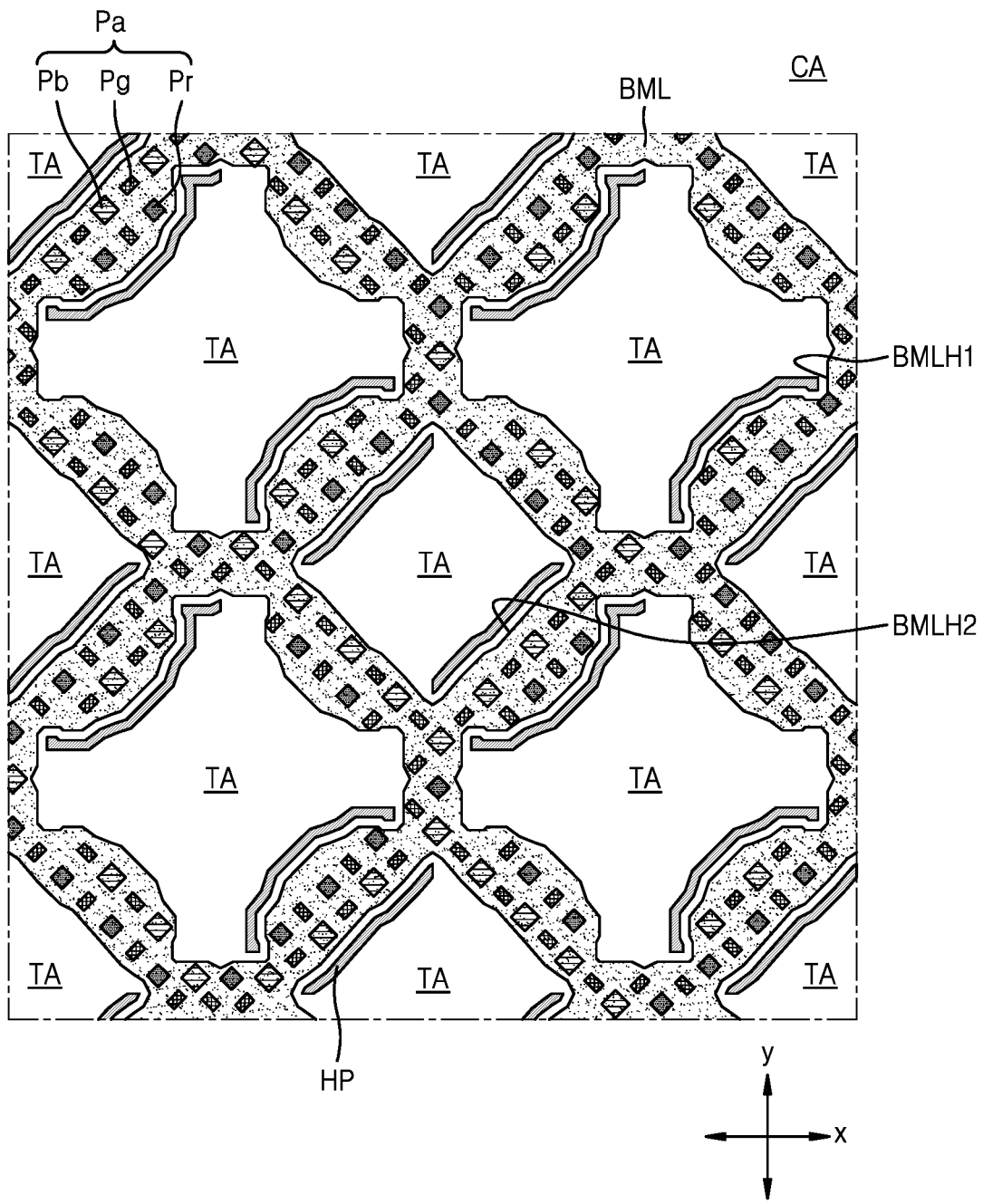
Figure 9G:
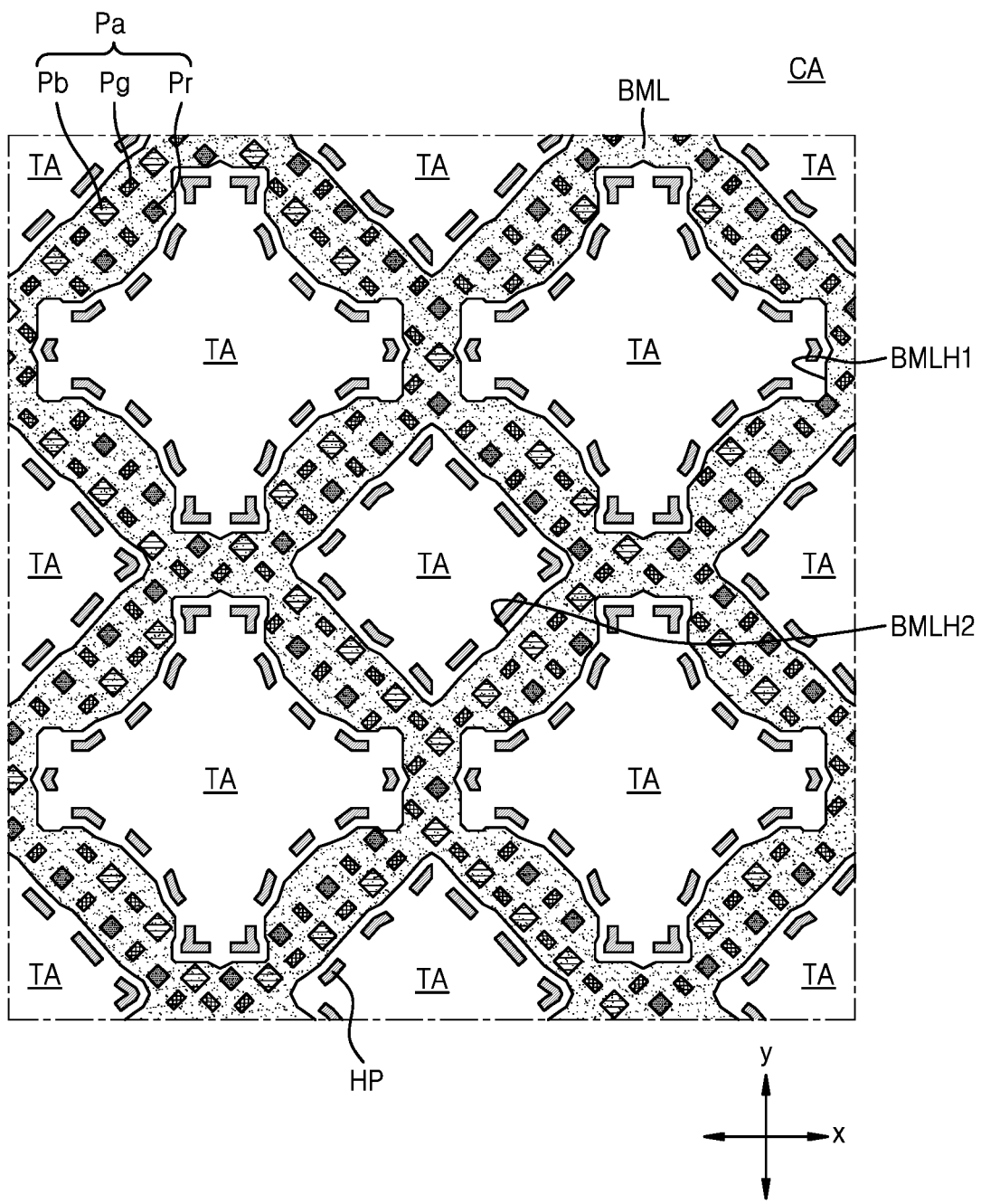

As shown in FIGS. 9A to 9D, edges of the first bottom hole BMLH1 and the second bottom hole BMLH2 may be curved and may have irregular unevenness (roughness). In another exemplary embodiment, as shown in FIG. 9E, edges of the first bottom hole BMLH1 and the second bottom hole BMLH2 may be smoothly curved.

As shown in FIGS. 8A to 9E, a hole pattern HP may be formed in the transmission area TA along an edge of the bottom hole BMLH of the bottom metal layer BML or an edge of the transmission area TA. The hole pattern HP may be a linear pattern having a shape corresponding to that of the bottom hole BMLH. The hole pattern HP may be a hole defined in an organic layer in the transmission area TA. The organic layer may include functional layers arranged on and/or under an emission layer.

As shown in FIGS. 8A to 9E, the hole pattern HP may be a continuous pattern. In another exemplary embodiment, the hole pattern HP may be a discontinuous pattern. For example, as shown in FIG. 9F, the hole pattern HP may be partially formed in the transmission area TA to correspond to a portion of the bottom hole BMLH of the bottom metal layer BML. Alternatively, as shown in FIG. 9G, a plurality of island-type hole patterns HP may be formed at predetermined intervals in the transmission area TA along an edge of the bottom hole BMLH of the bottom metal layer BML. FIGS. 9F and 9G exemplarily show a discontinuous hole pattern around the bottom hole BMLH of the bottom metal layer BML of FIG. 9A. Similarly, as shown in FIGS. 9F and 9G, a discontinuous hole pattern may be formed around the bottom hole BMLH of the bottom metal layer BML shown in FIGS. 8A to 8E and 9B to 9E.

FIGS. 10A to 10F are cross-sectional views schematically illustrating a method of manufacturing a display device according to an exemplary embodiment.

According to an exemplary embodiment, the pixel circuit PC including the thin film transistor TFT and the capacitor Cst, and the organic light-emitting diode OLED, which is a display element connected to the pixel circuit PC, may be arranged in each of the main display area MDA and the component area CA.

Figure 10A:
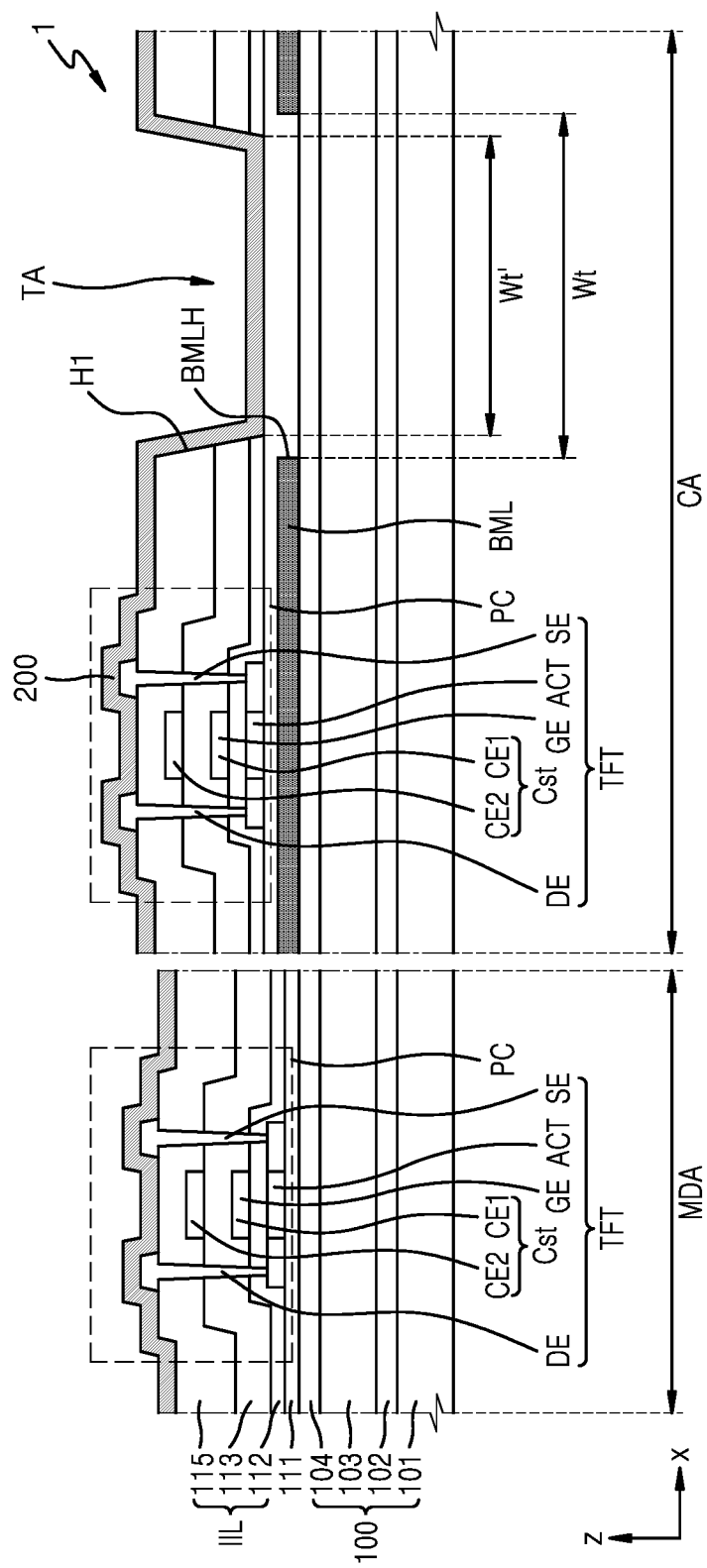
FIGS. 10A, 10B, 10C, 10D, 10E, and 10F are cross-sectional views schematically illustrating a method of manufacturing a display device according to an exemplary embodiment.

Referring to FIG. 10A, the pixel circuit PC and a first hole H1 corresponding to the transmission area TA may be formed above the substrate 100, and a conductive layer 200 may be formed on an inorganic insulating layer IIL.

The substrate 100 may include an insulative material, such as glass, quartz, and polymer resin. The substrate 100 may be a rigid substrate or a flexible substrate that is bendable, foldable, or rollable.

The substrate 100 may have a multi-layer structure. The substrate 100 may include a first base layer 101, a first barrier layer 102, a second base layer 103, and a second barrier layer 104 that are sequentially stacked.

Each of the first base layer 101 and the second base layer 103 may include polymer resin. The polymer resin may include polyethersulfone (PES), polyarylate (PAR), polyetherimide (PEI), polyethylene naphthalate (PEN), PET, polyphenylene sulfide (PPS), PI, polycarbonate, cellulose triacetate (TAC), cellulose acetate propionate (CAP), etc. The polymer resin may be transparent.

Each of the first barrier layer 102 and the second barrier layer 104 is a barrier layer preventing infiltration of an external foreign material, and may have a single-layer or multi-layer structure including an inorganic insulating material such as silicon nitride, silicon oxynitride, and/or silicon oxide.

A buffer layer 111 may be arranged on the substrate 100. The buffer layer 111 may be positioned on the substrate 100, and may prevent or at least suppress infiltration of a foreign material, moisture, or ambient air from below the substrate 100 and provide a flat surface on the substrate 100. In some exemplary embodiments, a barrier layer may be further included between the substrate 100 and the buffer layer 111 to block penetration of ambient air. The buffer layer 111 may include an inorganic insulating material such as silicon nitride, silicon oxynitride, and/or silicon oxide, and may have a single-layer or multi-layer structure including the material described above.

In the component area CA, the bottom metal layer BML may be formed on the substrate 100 before forming the buffer layer 111. In particular, the bottom metal layer BML may be arranged between the substrate 100 and the buffer layer 111. The bottom metal layer BML may include conductive metal, such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu). The bottom metal layer BML may have a single-layer or multi-layer structure including the material described above. For example, the bottom metal layer BML may have a structure in which a first metal layer including titanium (Ti) and a second metal layer including molybdenum (Mo) are sequentially stacked.

The bottom metal layer BML may be connected to a wire arranged on another layer through a contact hole. The bottom metal layer BML may receive a constant voltage or a signal from the wire. The bottom metal layer BML receiving a constant voltage or a signal through the wire may protect the thin film transistor TFT from external static electricity, or may improve performance of the thin film transistor TFT. The bottom hole BMLH corresponding to the transmission area TA may be formed in the bottom metal layer BML. The bottom hole BMLH of the bottom metal layer BML may have the shape and configuration shown in any one of FIGS. 8A to 9G, without being limited thereto.

In another exemplary embodiment, the bottom metal layer BML may also be formed in the main display area MDA.

The pixel circuit PC may be formed on the buffer layer 111. The pixel circuit PC may include the thin film transistor TFT and the capacitor Cst. The thin film transistor TFT may include a semiconductor layer ACT, a gate electrode GE overlapping a channel region of the semiconductor layer ACT, and a source electrode SE and a drain electrode DE respectively connected to a source region and a drain region of the semiconductor layer ACT. A gate insulating layer 112 may be arranged between the semiconductor layer ACT and the gate electrode GE. A first interlayer insulating layer 113 and a second interlayer insulating layer 115 may be arranged between the gate electrode GE and the source electrode SE or the gate electrode GE and the drain electrode DE.

The capacitor Cst may overlap the thin film transistor TFT. The capacitor Cst may include a lower electrode CE1 and an upper electrode CE2 overlapping each other. In some exemplary embodiments, the gate electrode GE of the thin film transistor TFT may include the lower electrode CE1 of the capacitor Cst. The first interlayer insulating layer 113 may be arranged between the lower electrode CE1 and the upper electrode CE2.

The semiconductor layer ACT may include polysilicon. In some exemplary embodiments, the semiconductor layer ACT may include amorphous silicon. In some exemplary embodiments, the semiconductor layer ACT may include oxide that includes at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer ACT may include a channel region, and a source region, and a drain region doped with impurities.

The gate insulating layer 112 may include an inorganic insulating material such as silicon oxide, silicon oxynitride, and/or silicon nitride, and may have a single-layer or multi-layer structure including the material described above.

The gate electrode GE or the lower electrode CE1 of the capacitor Cst may include a low-resistance conductive material such as molybdenum (Mo), aluminum (Al), copper (Cu) and/or titanium (Ti), and may have a single-layer or multi-layer structure including the material described above.

The first interlayer insulating layer 113 may include an inorganic insulating material such as silicon oxide, silicon oxynitride and/or silicon nitride, and may have a single-layer or multi-layer structure including the material described above.

The upper electrode CE2 of the capacitor Cst may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu), and may have a single-layer or multi-layer structure including the material described above.

The second interlayer insulating layer 115 may include an inorganic insulating material such as silicon oxide, silicon oxynitride and/or silicon nitride, and may have a single-layer or multi-layer structure including the material described above.

The source electrode SE or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu), and may have a single-layer or multi-layer structure including the material described above. For example, the source electrode SE and the drain electrode DE may have a three-layer structure of titanium layer/aluminum layer/titanium layer.

Before the source electrode SE and the drain electrode DE are formed, the first hole H1 corresponding to the transmission area TA may be formed in at least one inorganic insulating layer IIL. The at least one inorganic insulating layer BL may include one or more of the gate insulating layer 112, the first interlayer insulating layer 113, and the second interlayer insulating layer 115. The first hole H1 may overlap a hole in the gate insulating layer 112, a hole in the first interlayer insulating layer 113, and a hole in the second interlayer insulating layer 115 corresponding to the transmission area TA. FIG. 10A exemplarily shows that the first hole H1 is formed in the gate insulating layer 112, the first interlayer insulating layer 113, and the second interlayer insulating layer 115 through the same process. However, the inventive concepts are not limited thereto. In another exemplary embodiment, a hole may be formed in each of the gate insulating layer 112, the first interlayer insulating layer 113, and the second interlayer insulating layer 115 through separate processes, and thus, an inner side surface of the first hole H1 may not be smooth and may have steps. A width Wt' of the first hole H1 may be the smallest width of the transmission area TA, and may be less than a width Wt of the bottom hole BMLH.

In addition, contact holes exposing the source region and the drain region of the semiconductor layer ACT may be formed in the inorganic insulating layer IIL. The source electrode SE and the drain electrode DE may be formed on the second interlayer insulating layer 115 to contact the source region and the drain region of the semiconductor layer ACT, respectively, through the contact holes.

The conductive layer 200 may be formed on the second interlayer insulating layer 115. The conductive layer 200 may be formed over an entire surface of the substrate 100. More particularly, the conductive layer 200 may be formed on the second interlayer insulating layer 115 in the main display area MDA and the component area CA, and may be formed on the buffer layer 111 in the transmission area TA. The conductive layer 200 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu). In an exemplary embodiment, the conductive layer 200 may include substantially the same material as the source electrode SE and the drain electrode DE. For example, the conductive layer 200 may include the same material as an uppermost layer of the source electrode SE and the drain electrode DE having a multi-layer structure, such as titanium.

Figure 10B:
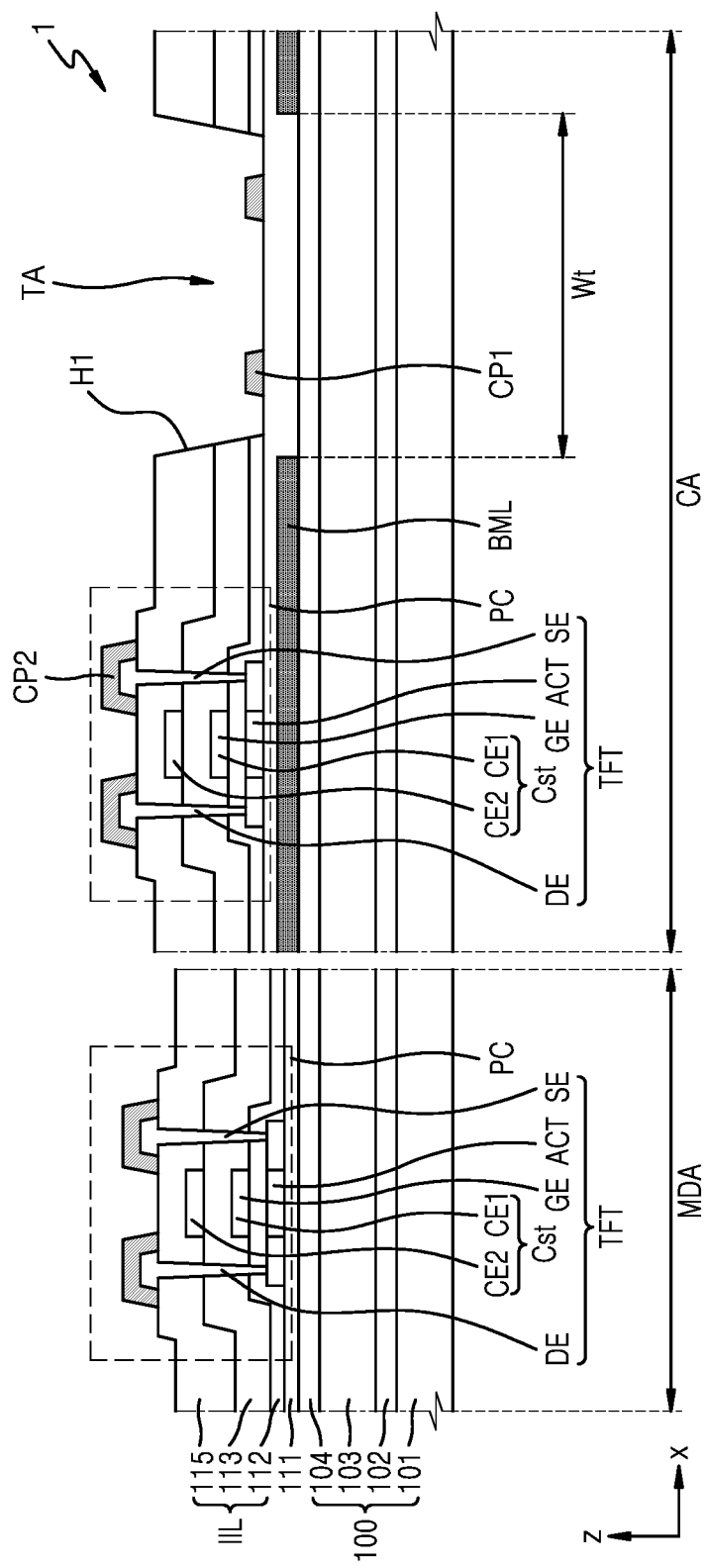

Referring to FIG. 10B, the conductive layer 200 may be partially removed by dry etching or the like to form a first conductive pattern CP1 and a second conductive pattern CP2.

A portion of the conductive layer 200 may be removed in the transmission area TA to form the first conductive pattern CP1 in the transmission area TA. The first conductive pattern CP1 may function as a sacrificial layer for forming the hole pattern HP in the transmission area TA. The first conductive pattern CP1 may be a pattern forming a continuous line along an edge of the bottom hole BMLH. A line width of the first conductive pattern CP1 may be about 2 micrometers (μm) to about 20 micrometers (μm). A thickness of the first conductive pattern CP1 may be about 50 angstroms (Å) to 200 angstroms (Å).

A portion of the conductive layer 200 may be removed in the main display area MDA and the component area CA to form the second conductive pattern CP2 covering upper surfaces of the source electrode SE and the drain electrode DE.

Figure 10C:
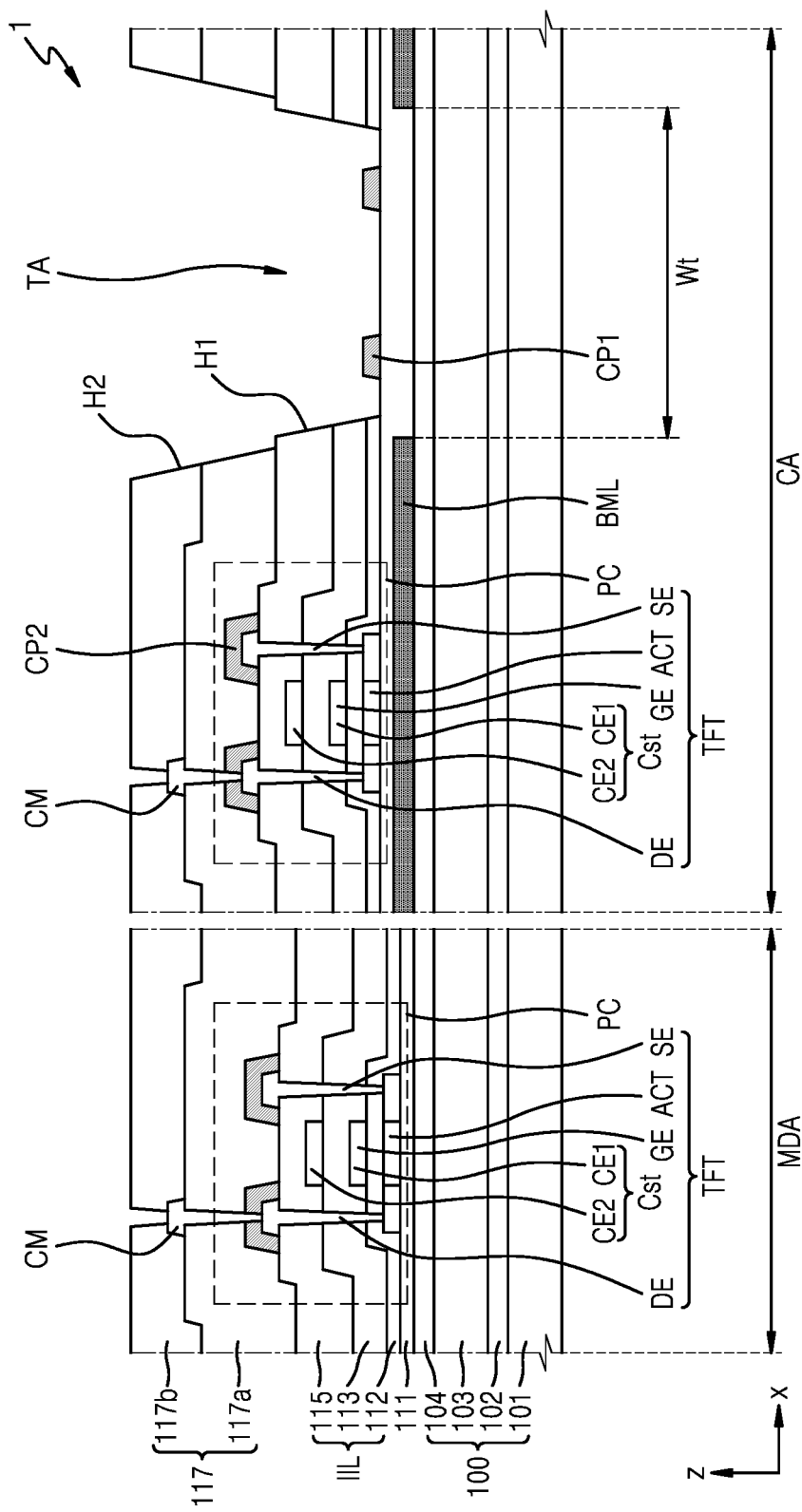

Referring to FIG. 10C, a planarization layer 117 covering the pixel circuit PC may be formed on the second interlayer insulating layer 115. The planarization layer 117 may have a single-layer or multi-layer structure. The planarization layer 117 according to the illustrated exemplary embodiment may include a first planarization layer 117a and a second planarization layer 117b. Accordingly, a connection electrode CM may be formed between the first planarization layer 117a and the second planarization layer 117b, which may be advantageous for high integration. The first planarization layer 117a may cover the second conductive pattern CP2.

The connection electrode CM may include a conductive material including molybdenum (Mo), aluminum (Al), copper (Cu), titanium (Ti), etc., and may have a multi-layer or single-layer structure including the material described above. For example, the connection electrode CM may have a three-layer structure of titanium layer/aluminum layer/titanium layer.

The first planarization layer 117a and the second planarization layer 117b may include a general commercial polymer, such as benzocyclobutene (BCB), PI, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer. The first planarization layer 117a and the second planarization layer 117b may include an inorganic insulating material, such as silicon oxide, silicon oxynitride, silicon nitride, aluminum oxide, titanium oxide, tantalum oxide, hafnium oxide, or zinc oxide. When the planarization layer 117 is formed, a layer may be formed, and then, chemical and mechanical polishing may be performed on an upper surface of the layer to provide a flat upper surface.

A second hole H2 may be formed in the planarization layer 117 to correspond to the transmission area TA. The second hole H2 may overlap the first hole H1. FIG. 10C exemplarily shows that the second hole H2 is larger than the first hole H1. According to another exemplary embodiment, the planarization layer 117 may cover an edge of the first hole H1 of the inorganic insulating layer IIL, and in this case, an area of the second hole H2 may be smaller than that of the first hole H1.

A via hole exposing one of the source electrode SE and the drain electrode DE of the thin film transistor TFT may be formed in the first planarization layer 117a, and a via hole exposing the connection electrode CM may be formed in the second planarization layer 117b.

Figure 10D:
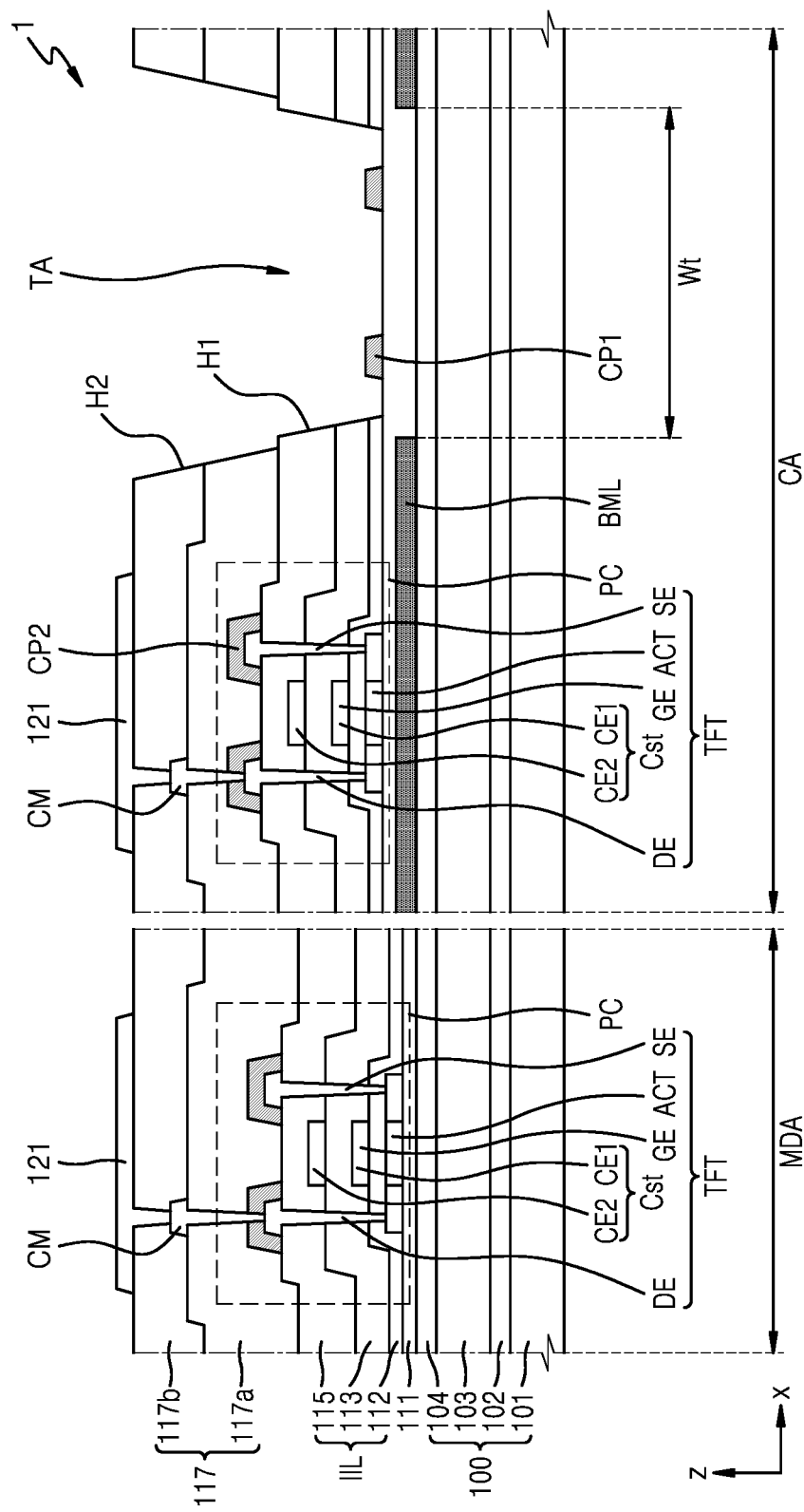

Referring to FIG. 10D, a pixel electrode 121 may be formed on the planarization layer 117, and the pixel electrode 121 may be electrically connected to the thin film transistor TFT by contacting the source electrode SE or the drain electrode DE through the connection electrode CM.

The pixel electrode 121 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 121 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the pixel electrode 121 may have a structure having films on/under the reflective film described above, in which the films include ITO, IZO, ZnO, or $In_2O_3$. In this case, the pixel electrode 121 may have a stack structure of ITO/Ag/ITO.

Figure 10E:
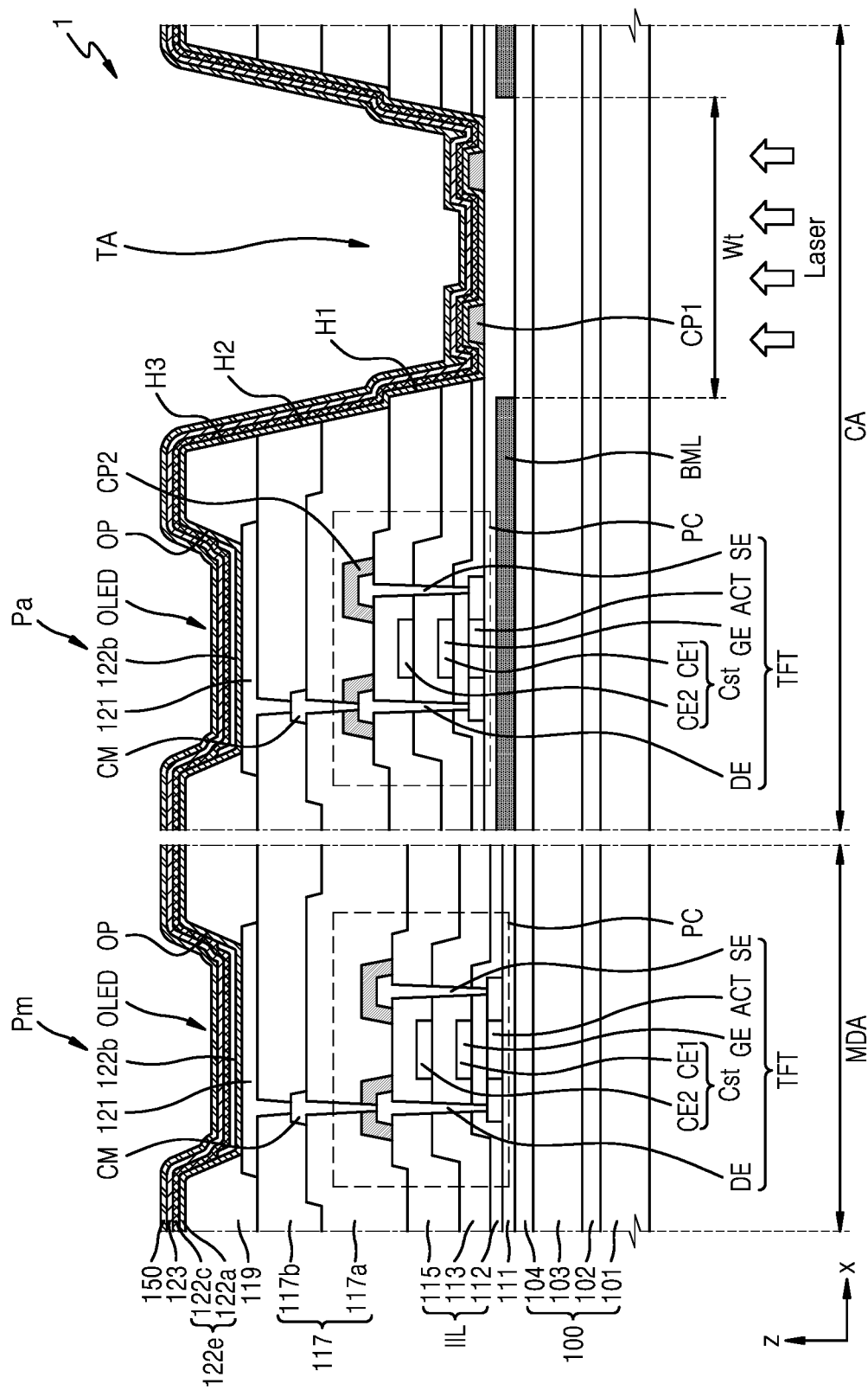

Referring to FIG. 10E, a pixel-defining layer 119 may be arranged on the planarization layer 117. The pixel-defining layer 119 may cover an edge of the pixel electrode 121, and may include an opening OP exposing a portion of the pixel electrode 121. An emission area of the organic light-emitting diode OLED, that is, sizes and shapes of the first sub-pixel Pm and the second sub-pixel Pa are defined by the opening OP. The pixel-defining layer 119 may include an organic insulating material, such as PI, polyamide, acrylic resin, BCB, HMDSO, phenol resin, etc.

A third hole H3 positioned in the transmission area TA may be formed in the pixel-defining layer 119. The third hole H3 may overlap the first hole H1 and the second hole H2. The first to third holes H1 to H3 may improve the light transmittance in the transmission area TA.

An emission layer 122b is arranged in the opening OP of the pixel-defining layer 119 to correspond to the pixel electrode 121. The emission layer 122b may include a polymer material or a low-molecular weight material, and may emit red, green, blue, or white light.

An organic functional layer 122e may be arranged on and/or under the emission layer 122b. The organic functional layer 122e may include a first functional layer 122a and/or a second functional layer 122c. In some exemplary embodiments, the first functional layer 122a or the second functional layer 122c may be omitted.

The first functional layer 122a may be arranged under the emission layer 122b. The first functional layer 122a may have a single-layer or multi-layer structure including an organic material. The first functional layer 122a may be a hole transport layer (HTL). Alternatively, the first functional layer 122a may include a hole injection layer (HIL) and an HTL.

The second functional layer 122c may be arranged on the emission layer 122b. The second functional layer 122c may have a single-layer or multi-layer structure including an organic material. The second functional layer 122c may include an electron transport layer (ETL) and/or an electron injection layer (EIL).

The first functional layer 122a and the second functional layer 122c may be integrally formed to correspond to organic light-emitting diodes OLED included in the main display area MDA and the component area CA.

An opposite electrode 123 is arranged on the second functional layer 122c. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof Alternatively, the opposite electrode 123 may further include a layer, such as ITO, IZO, ZnO, or $In_2O_3$, on a (semi) transparent layer including any of the above-described materials. The opposite electrode 123 may be integrally formed to correspond to the organic light-emitting diodes OLED included in the main display area MDA and the component area CA.

Sequentially stacked layers from the pixel electrode 121 to the opposite electrode 123 may form the organic light-emitting diode OLED.

An upper layer 150 including an organic material may be formed on the opposite electrode 123. The upper layer 150 may be provided to protect the opposite electrode 123 and to increase light extraction efficiency. The upper layer 150 may include an organic material having a higher refractive index than that of the opposite electrode 123. Alternatively, the upper layer 150 may have stacked layers having different refractive indices from each other. For example, the upper layer 150 may have a high refractive index layer/a low refractive index layer/a high refractive index layer. In this case, a refractive index of the high refractive index layer may be about 1.7 or more, and a refractive index of the low refractive index layer may be about 1.3 or less. The upper layer 150 may additionally include lithium fluoride (LiF). Alternatively, the upper layer 150 may additionally include at least one of silicon oxide, silicon oxynitride, and silicon nitride. According to another exemplary embodiment, the upper layer 150 may be omitted.

Each of the first functional layer 122a, the second functional layer 122c, the opposite electrode 123, and the upper layer 150 may be formed over an entire surface of the substrate 100. The first functional layer 122a, the second functional layer 122c, the opposite electrode 123, and the upper layer 150 may be formed in the main display area MDA and the component area CA. Each of the first functional layer 122a, the second functional layer 122c, the opposite electrode 123, and the upper layer 150 may cover side surfaces of the first to third holes H1 to H3 of the transmission area TA and the first conductive pattern CP1.

After each of the first functional layer 122a, the second functional layer 122c, the opposite electrode 123, and the upper layer 150 is formed over an entire surface of the substrate 100, laser may be irradiated on a lower surface opposite to an upper surface of the substrate 100 corresponding to the transmission area TA.

Figure 10F:
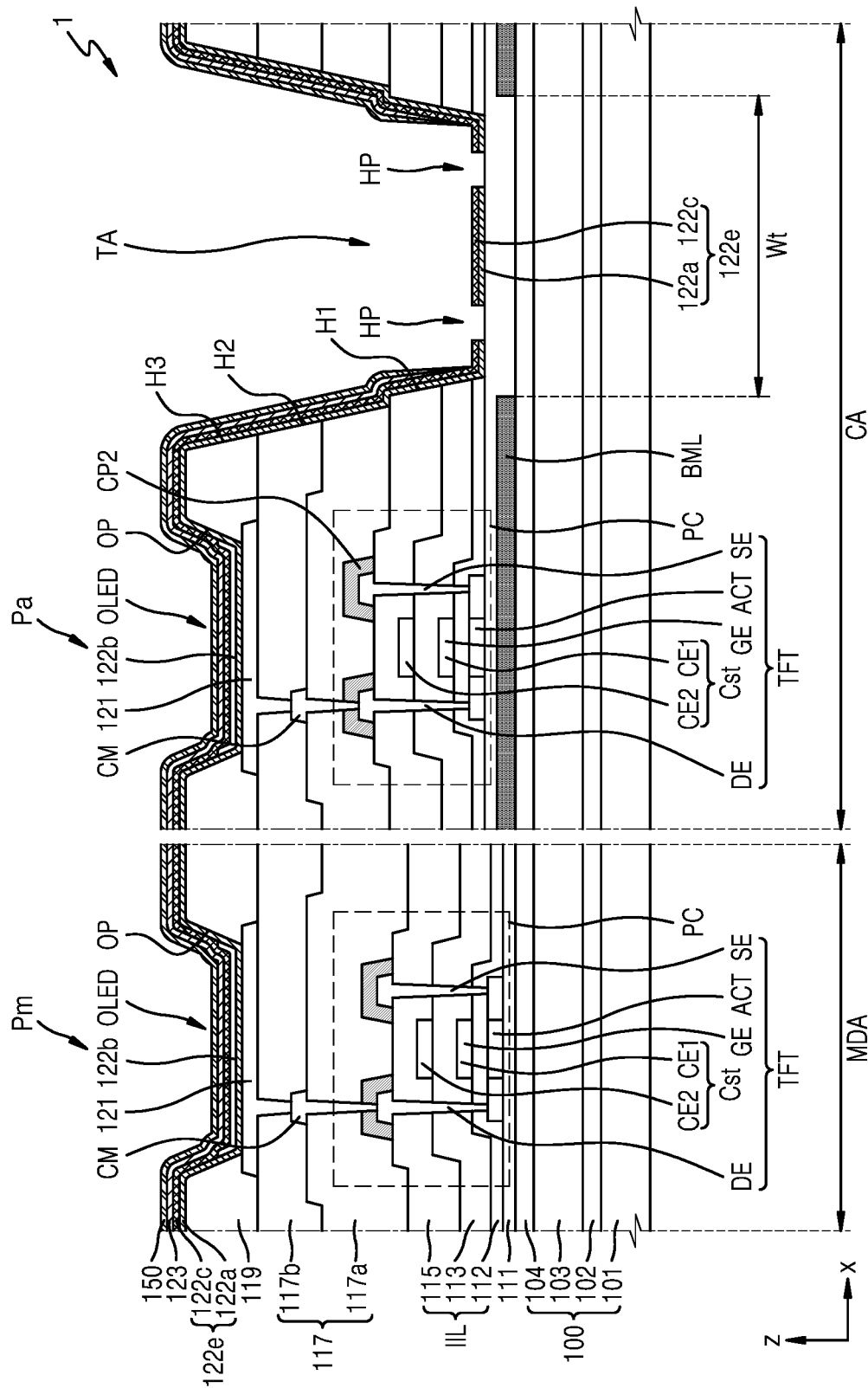

As shown in FIG. 10F, portions of the organic functional layer 122e, the opposite electrode 123, and the upper layer 150 formed on the first conductive pattern CP1 may be removed using laser lift-off. When the portions of the organic functional layer 122e, the opposite electrode 123, and the upper layer 150 are removed, the first conductive pattern CP1 may also be removed. In an area of the transmission area TA where the first conductive pattern CP1 is not formed, only the opposite electrode 123 and the upper layer 150 may be removed, and the organic functional layer 122e may be retained without being removed.

The hole pattern HP may be formed in the transmission area TA by removing the portions of the organic functional layer 122e, the opposite electrode 123, and the upper layer 150 formed on the first conductive pattern CP1. The hole pattern HP may be a hole formed in the organic functional layer 122e of the transmission area TA, which corresponds to a shape of the first conductive pattern CP1.

When the organic functional layer 122e, the opposite electrode 123, and the upper layer 150 formed in the transmission area TA are removed by using laser without a sacrificial layer such as the first conductive pattern CP1, only the opposite electrode 123 and the upper layer 150 are removed while the organic functional layer 122e is retained without being removed, thereby reducing the transmittance in the transmission area TA. In addition, when a thickness of a remaining inorganic layer decreases due to the removal of an inorganic insulating layer in the transmission area TA, gas emitted from the second base layer 103 of the substrate 100, moisture flowing into the second base layer 103, and/or moisture flowing from the organic encapsulation layer 132 (of FIG. 2) propagates along the organic functional layer 122e of the transmission area TA due to the remaining organic functional layer 122e, which may cause defects in pixels around the transmission area TA.

According to an exemplary embodiment, after the first conductive pattern CP1 is formed under the organic functional layer 122e, the organic functional layer 122e may be removed and shorted (e.g., broken) by using the first conductive pattern CP1 as a sacrificial layer in a laser lift-off method, and thus, a moisture permeable path may be blocked.

FIGS. 11A to 11E are cross-sectional views schematically illustrating a method of manufacturing a display device according to an exemplary embodiment. Hereinafter, repeated descriptions of the same processes as those described in FIGS. 10A to 10F will be omitted or simplified, and differences will be mainly described.

Figure 11A:
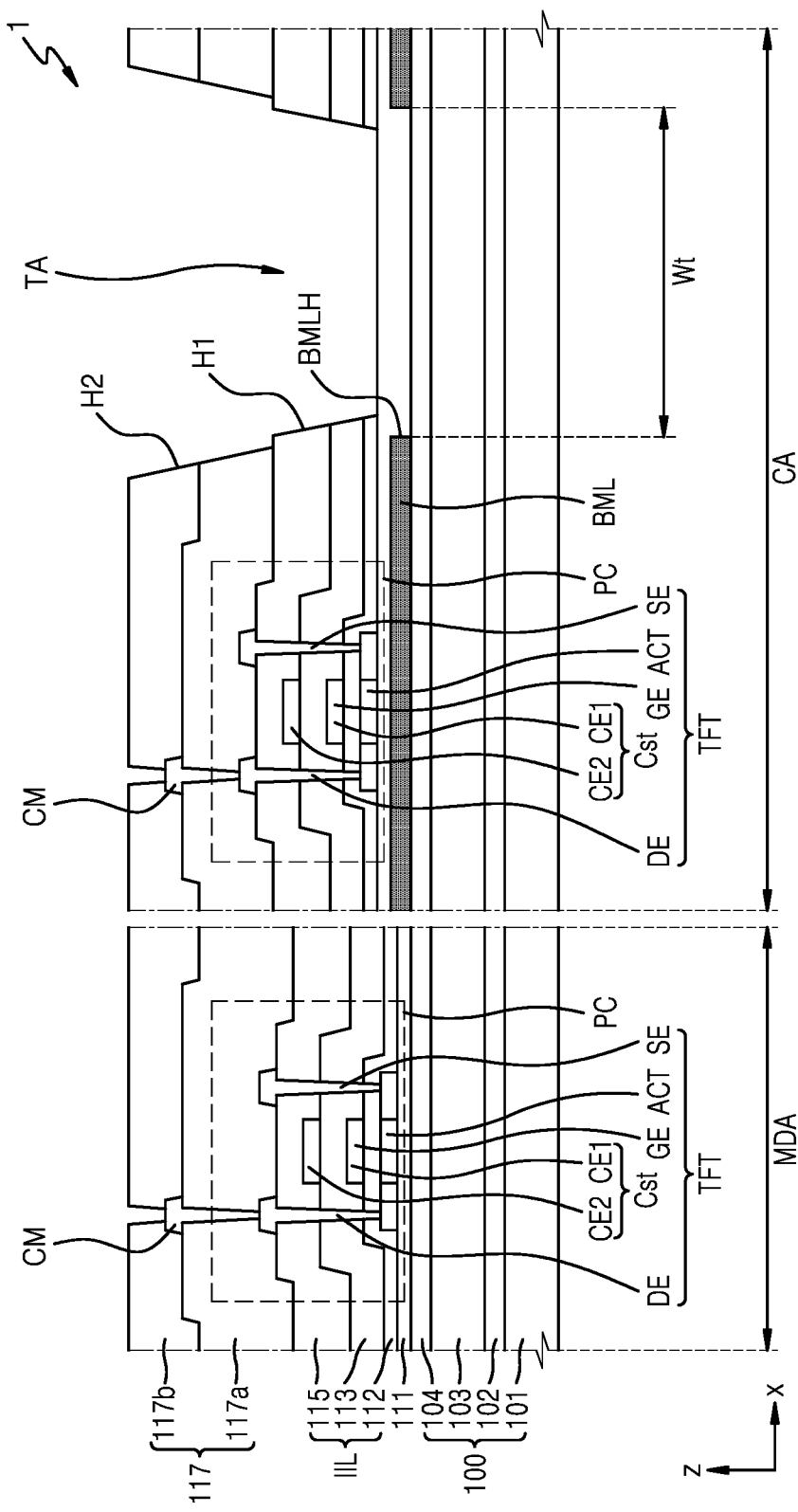
FIGS. 11A, 11B, 11C, 11D, and 11E are cross-sectional views schematically illustrating a method of manufacturing a display device according to an exemplary embodiment.

Referring to FIG. 11A, the bottom metal layer BML may be formed on the substrate 100 in the component area CA, and then, the buffer layer 111 may be formed in the main display area MDA and the component area CA.

The pixel circuit PC may be formed on the buffer layer 111 in the main display area MDA and the component area CA. The pixel circuit PC arranged in the component area CA may overlap the bottom metal layer BML. The first hole H1 corresponding to the transmission area TA may be formed in the inorganic insulating layer IIL.

The planarization layer 117 may be formed on the inorganic insulating layer IIL to cover the pixel circuit PC. The second hole H2 may be formed in the planarization layer 117 to correspond to the transmission area TA.

Figure 11B:
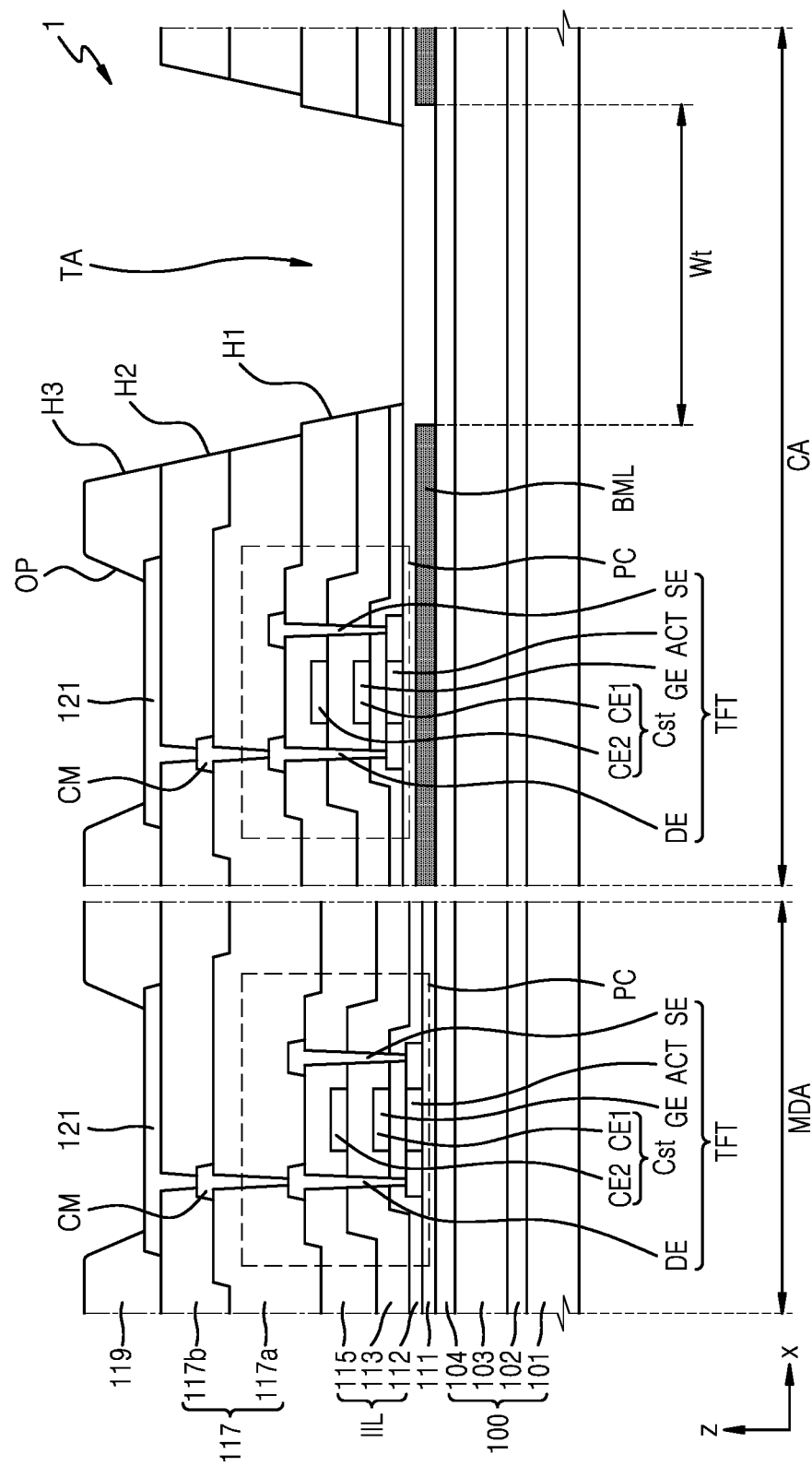

Referring to FIG. 11B, the pixel electrode 121 may be formed on the planarization layer 117, and the pixel electrode 121 may be electrically connected to the thin film transistor TFT by contacting the source electrode SE or the drain electrode DE through a via hole in the planarization layer 117.

The pixel-defining layer 119 covering an edge of the pixel electrode 121 may be arranged on the planarization layer 117. The pixel-defining layer 119 may include the opening OP exposing a portion of the pixel electrode 121. The third hole H3 corresponding to the transmission area TA may be formed in the pixel-defining layer 119.

Figure 11C:
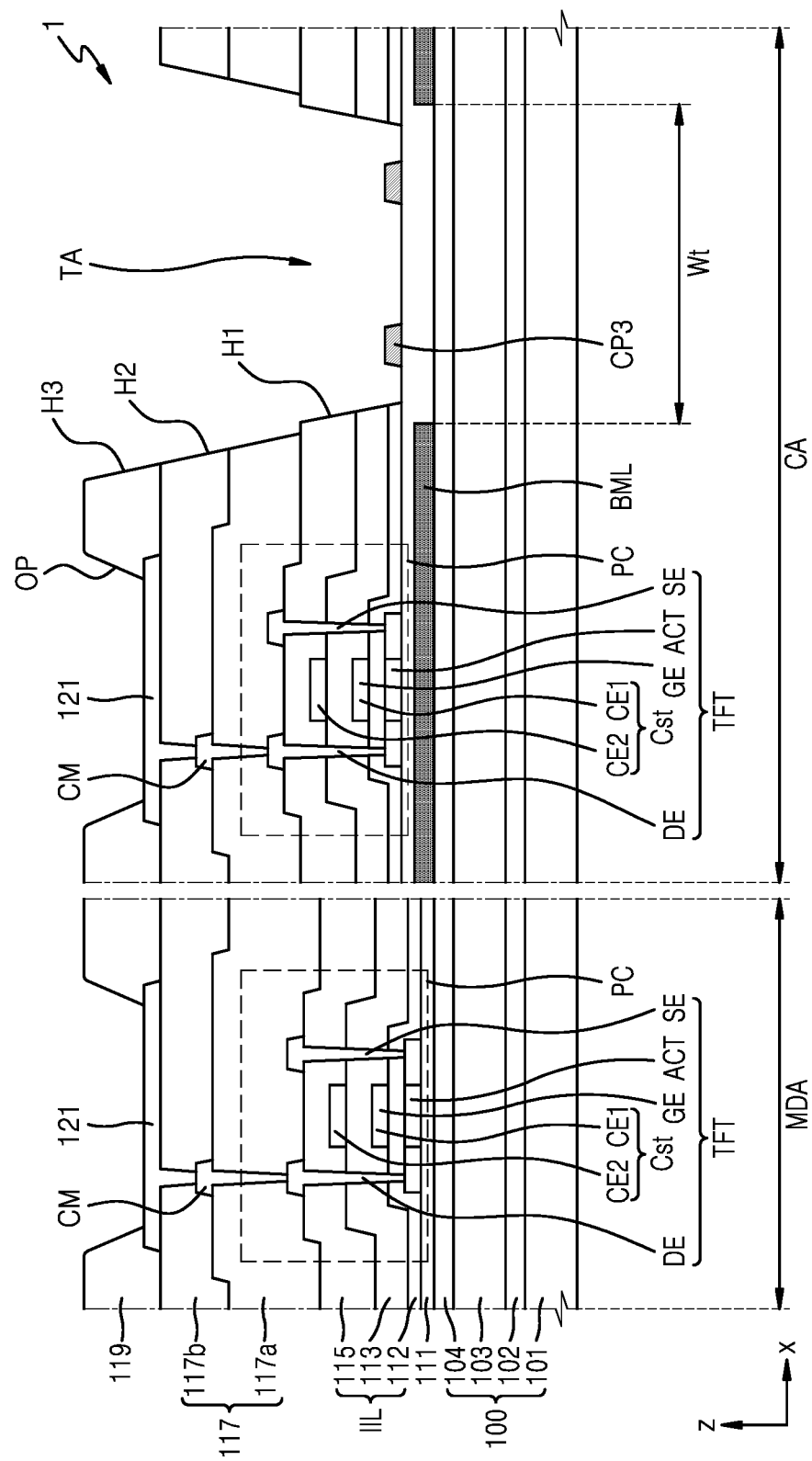

Referring to FIG. 11C, a third conductive pattern CP3 may be formed in the transmission area TA. The third conductive pattern CP3 may functions as a sacrificial layer for forming the hole pattern HP in the transmission area TA. The third conductive pattern CP3 may form a continuous line along an edge of the bottom hole BMLH. The third conductive pattern CP3 may be formed by deposition processes using a mask, such as a fine metal mask (FMM). In an exemplary embodiment, the third conductive pattern CP3 may include ytterbium (Yb). A line width of the third conductive pattern CP3 may be about 2 micrometers ($\mu$m) to about 20 micrometers ($\mu$m). A thickness of the third conductive pattern CP3 may be about 50 angstroms (Å) to about 200 angstroms (Å).

Figure 11D:
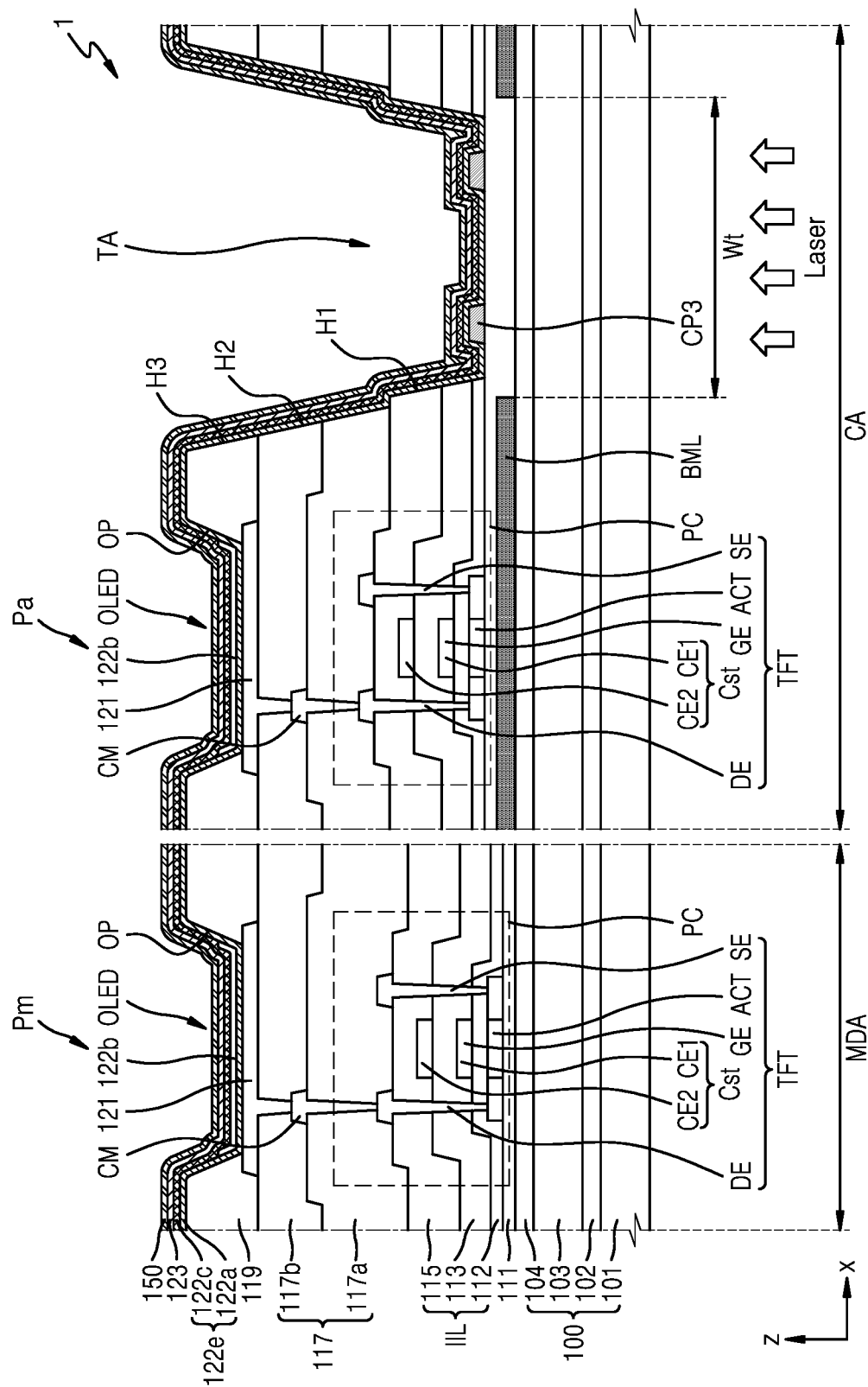

Referring to FIG. 11D, the emission layer 122b is arranged in the opening OP of the pixel-defining layer 119 to correspond to the pixel electrode 121. The organic functional layer 122e may be arranged on and/or under the emission layer 122b. The organic functional layer 122e may include the first functional layer 122a and/or the second functional layer 122c. The opposite electrode 123 may be arranged on the second functional layer 122c. The upper layer 150 including an organic material may be formed on the opposite electrode 123.

The first functional layer 122a, the second functional layer 122c, the opposite electrode 123, and the upper layer 150 may be formed in the main display area MDA and the component area CA. Each of the first functional layer 122a, the second functional layer 122c, the opposite electrode 123, and the upper layer 150 may cover side surfaces of the first to third holes H1 to H3 of the transmission area TA and the third conductive pattern CP3.

After each of the first functional layer 122a, the second functional layer 122c, the opposite electrode 123, and the upper layer 150 is formed over an entire surface of the substrate 100, laser may be irradiated on a lower surface opposite to an upper surface of the substrate 100 corresponding to the transmission area TA.

Figure 11E:
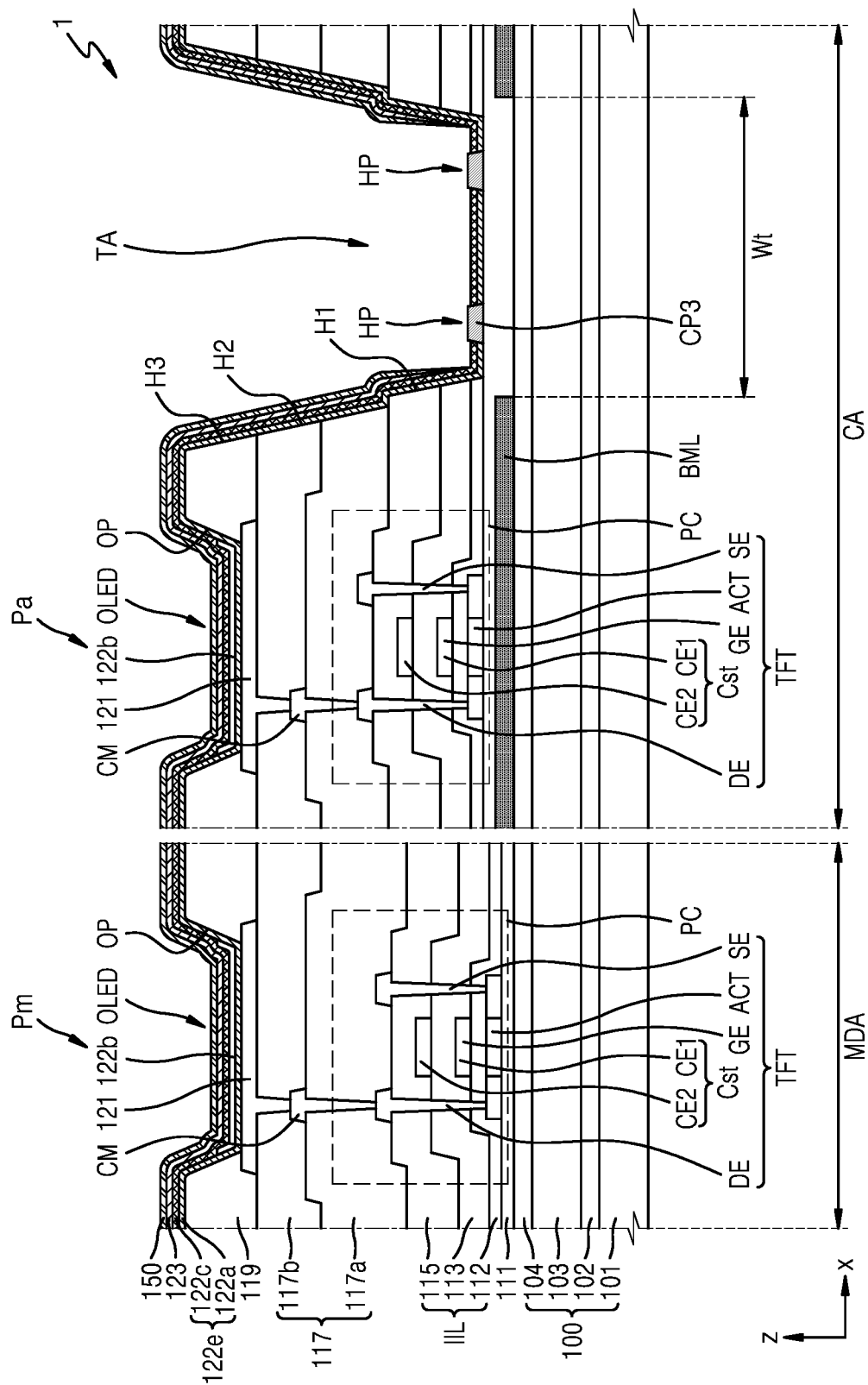

Referring to FIG. 11E, portions of the organic functional layer 122e, the opposite electrode 123, and the upper layer 150 formed on the third conductive pattern CP3 may be removed using laser lift-off. According to the illustrated exemplary embodiment, when portions of the organic functional layer 122e, the opposite electrode 123, and the upper layer 150 are removed, the third conductive pattern CP3 may be retained. In an area of the transmission area TA where the third conductive pattern CP3 is not formed, only the opposite electrode 123 and the upper layer 150 may be removed, and the organic functional layer 122e may be retained without being removed.

The hole pattern HP may be formed in the transmission area TA by removing portions of the organic functional layer 122e, the opposite electrode 123, and the upper layer 150 formed on the third conductive pattern CP3. The hole pattern HP may be a hole formed in the organic functional layer 122e of the transmission area TA, which corresponds to a shape of the third conductive pattern CP3.

The display device of FIG. 11E is different from the display device of FIG. 10F in that the third conductive pattern CP3 under the organic functional layer 122e is retained, whereas the display device of FIG. 10F has the first conductive pattern CP1 under the organic functional layer 122e removed.

Figure 12:
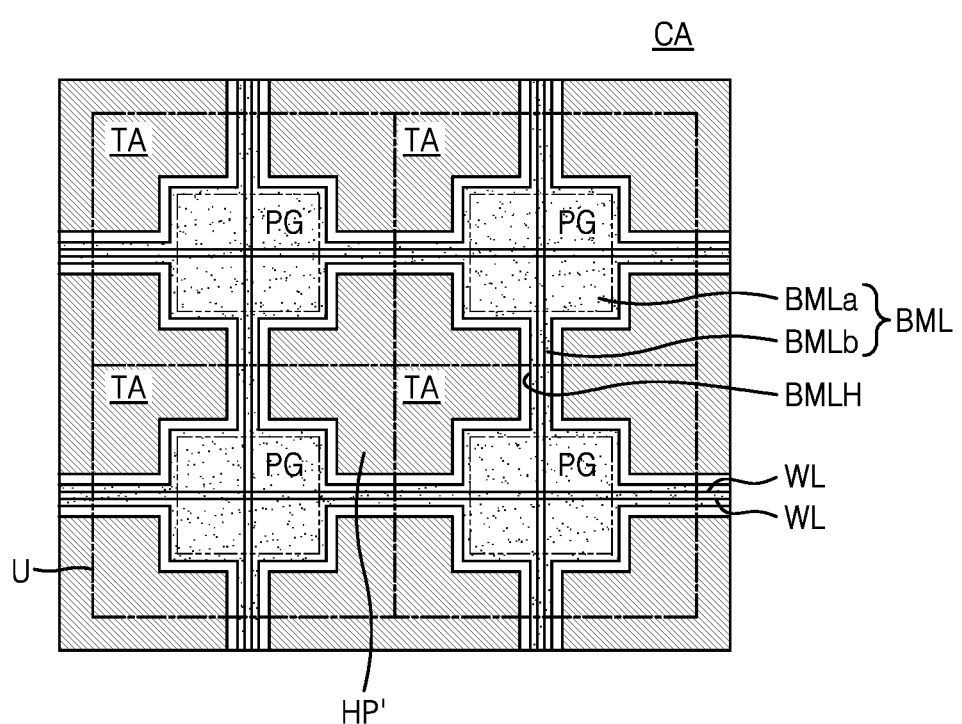
FIG. 12 is a plan view schematically illustrating a shape of a hole pattern formed in a component area according to an exemplary embodiment.

FIG. 12 is a plan view schematically illustrating a shape of a hole pattern HP' formed in the component area CA according to an exemplary embodiment.

Referring to FIG. 12, the hole pattern HP' may be formed in the transmission area TA along an edge of the bottom hole BMLH of the bottom metal layer BML or an edge of the transmission area TA. The hole pattern HP' may have a shape corresponding to that of the bottom hole BMLH. The hole pattern HP' shown in FIG. 12 may be a hole defined in the organic functional layer 122e substantially corresponding to the entire transmission area TA in a cross-section. The hole pattern HP' may have a smaller area than the transmission area TA.

FIG. 12 may correspond to the hole pattern HP in the bottom hole BMLH of the bottom metal layer BML shown in FIG. 8B. The hole pattern HP' may be formed in the transmission area TA along an edge of the bottom hole BMLH of the bottom metal layer BML shown in each of FIGS. 8A and 8C to 9E.

Figure 13A:
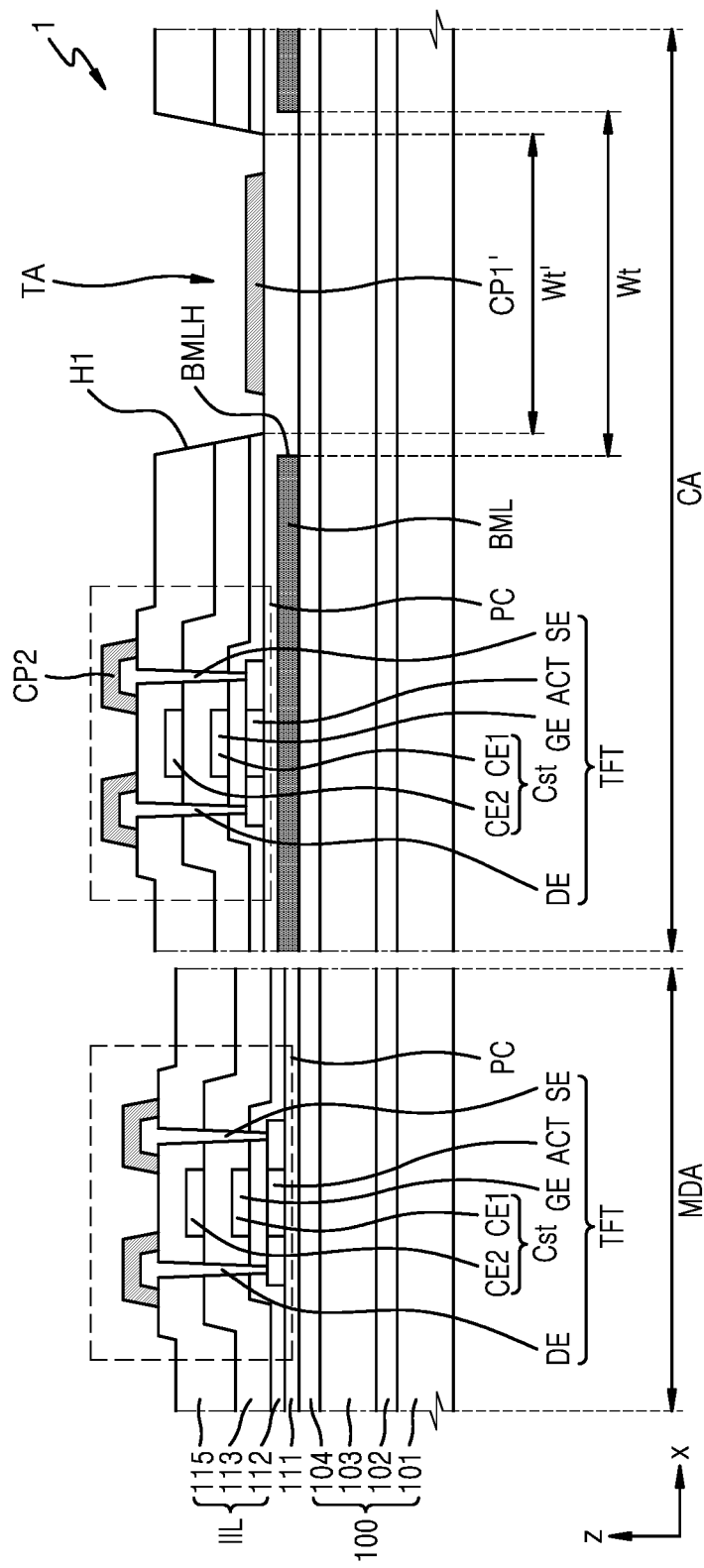
FIGS. 13A, 13B, and 13C are cross-sectional views schematically illustrating a method of manufacturing a display device according to an exemplary embodiment.
Figure 13B:
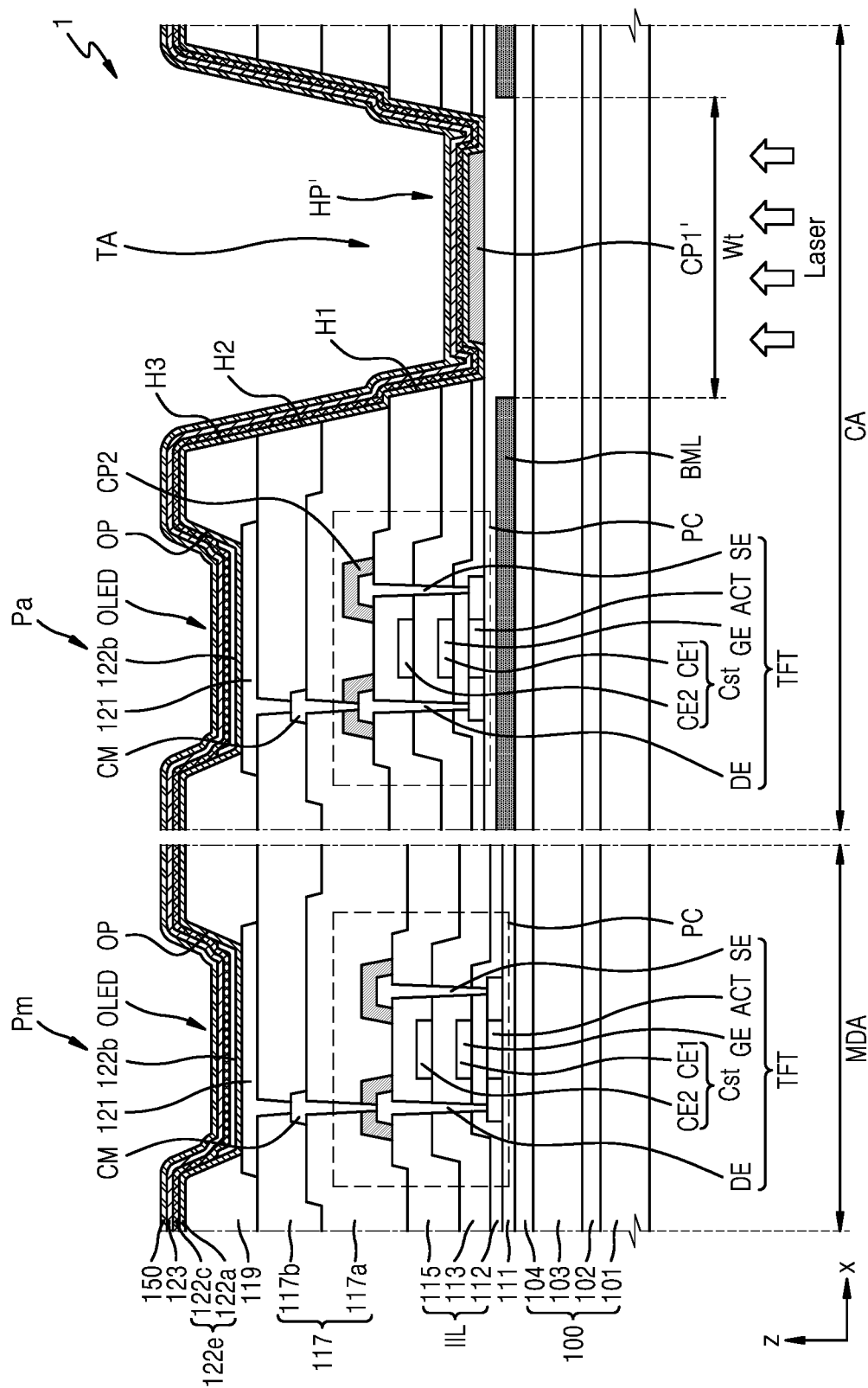
Figure 13C:
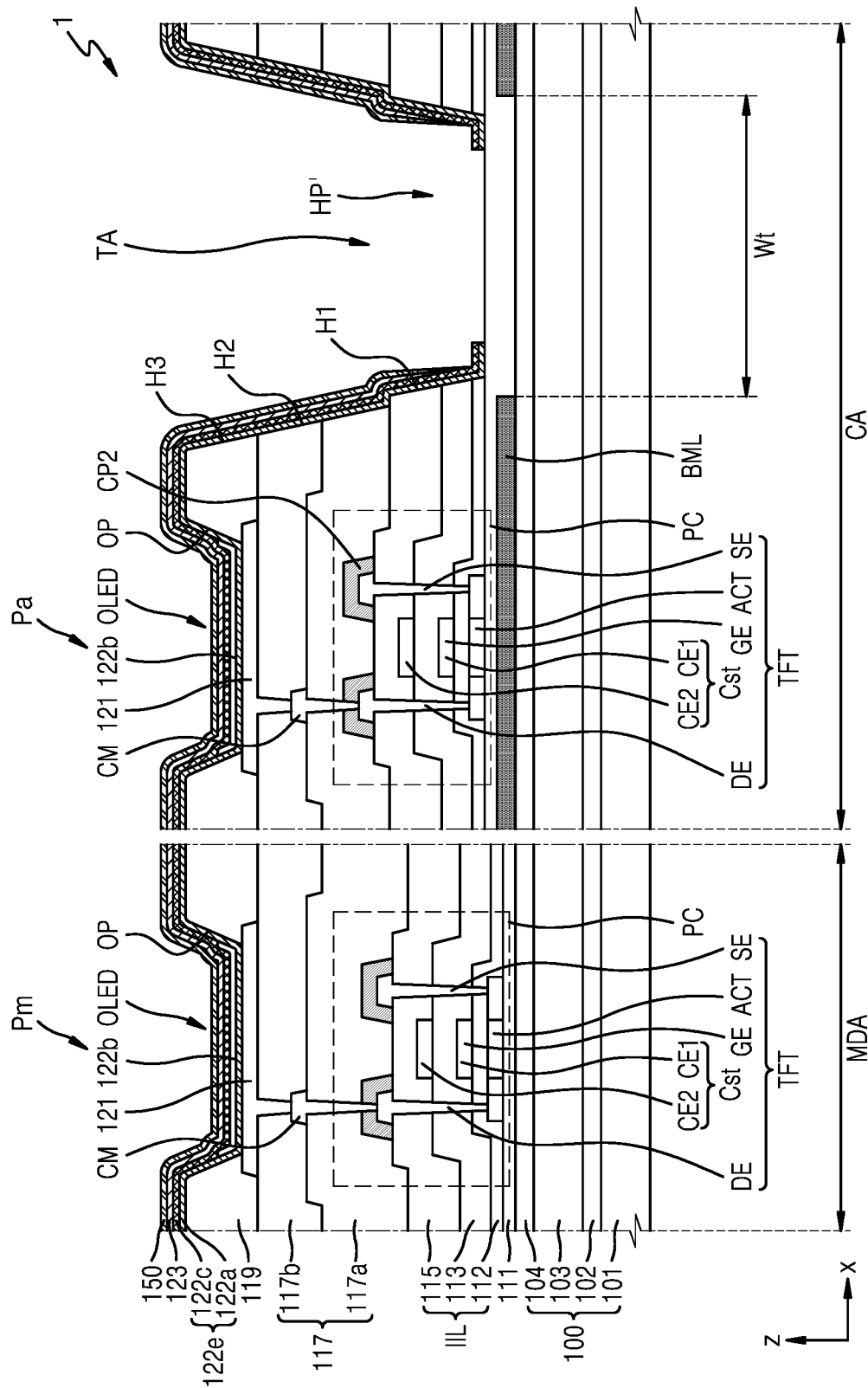

FIGS. 13A to 13C are cross-sectional views schematically illustrating a method of manufacturing a display device according to an exemplary embodiment. Hereinafter, repeated descriptions of the same processes as those described in FIGS. 10A to 10F will be omitted or simplified, and differences will be mainly described.

Referring to FIG. 13A, the pixel circuit PC may be formed above the substrate 100, and the first hole H1 corresponding to the transmission area TA may be formed in the inorganic insulating layer IIL. The conductive layer 200 may be formed on the inorganic insulating layer IIL, and the conductive layer 200 may be partially removed by dry etching or the like to form a first conductive pattern CP1' and the second conductive pattern CP2. The conductive layer 200 may include titanium.

The first conductive pattern CP1' may be formed in the transmission area TA. The first conductive pattern CP1' may be a plate-shaped pattern corresponding to the transmission area TA. An edge of the first conductive pattern CP1' may be spaced apart from an edge of the bottom metal layer BML, and a width of the first conductive pattern CP1' may be less than the width Wt' of the transmission area TA. A thickness of the first conductive pattern CP1' may be about 50 angstroms (Å) to about 200 angstroms (Å).

The second conductive pattern CP2 covering upper surfaces of the source electrode SE and the drain electrode DE may be formed in the main display area MDA and the component area CA.

Referring to FIG. 13B, the planarization layer 117 covering the pixel circuit PC may be formed on the second interlayer insulating layer 115. The second hole H2 may be formed in the planarization layer 117 to correspond to the transmission area TA.

The pixel electrode 121 may be formed on the planarization layer 117, and the pixel-defining layer 119 covering an edge of the pixel electrode 121 may be formed on the planarization layer 117. The third hole H3 corresponding to the transmission area TA may be formed in the pixel-defining layer 119.

The emission layer 122b is arranged in the opening OP of the pixel-defining layer 119 to correspond to the pixel electrode 121. The organic functional layer 122e may be arranged on and/or under the emission layer 122b. The organic functional layer 122e may include the first functional layer 122a and/or the second functional layer 122c. The opposite electrode 123 may be arranged on the second functional layer 122c. The upper layer 150 including an organic material may be formed on the opposite electrode 123.

The first functional layer 122a, the second functional layer 122c, the opposite electrode 123, and the upper layer 150 may be formed in the main display area MDA and the component area CA. Each of the first functional layer 122a, the second functional layer 122c, the opposite electrode 123, and the upper layer 150 may cover side surfaces of the first to third holes H1 to H3 of the transmission area TA and the first conductive pattern CP1'.

After each of the first functional layer 122a, the second functional layer 122c, the opposite electrode 123, and the upper layer 150 is formed over an entire surface of the substrate 100, laser may be irradiated on a lower surface opposite to an upper surface of the substrate 100 corresponding to the transmission area TA.

Referring to FIG. 13C, portions of the organic functional layer 122e, the opposite electrode 123, and the upper layer 150 formed on the first conductive pattern CP1' may be removed using laser lift-off. When portions of the organic functional layer 122e, the opposite electrode 123, and the upper layer 150 are removed, the first conductive pattern CP1' may also be removed. In an area of the transmission area TA where the first conductive pattern CP1' is not formed, only the opposite electrode 123 and the upper layer 150 may be removed, and the organic functional layer 122e may be retained without being removed.

The hole pattern HP' may be formed in the transmission area TA by removing the portions of the organic functional layer 122e, the opposite electrode 123, and the upper layer 150 formed on the first conductive pattern CP1'. The hole pattern HP' may be a hole formed in the organic functional layer 122e of the transmission area TA in a cross-section, which corresponds to a shape of the first conductive pattern CP1'.

FIGS. 14A to 14E are cross-sectional views schematically illustrating a method of manufacturing a display device according to an exemplary embodiment. Hereinafter, repeated descriptions of the same processes as those described in FIGS. 10A to 10F will be omitted or simplified, and differences will be mainly described.

Figure 14A:
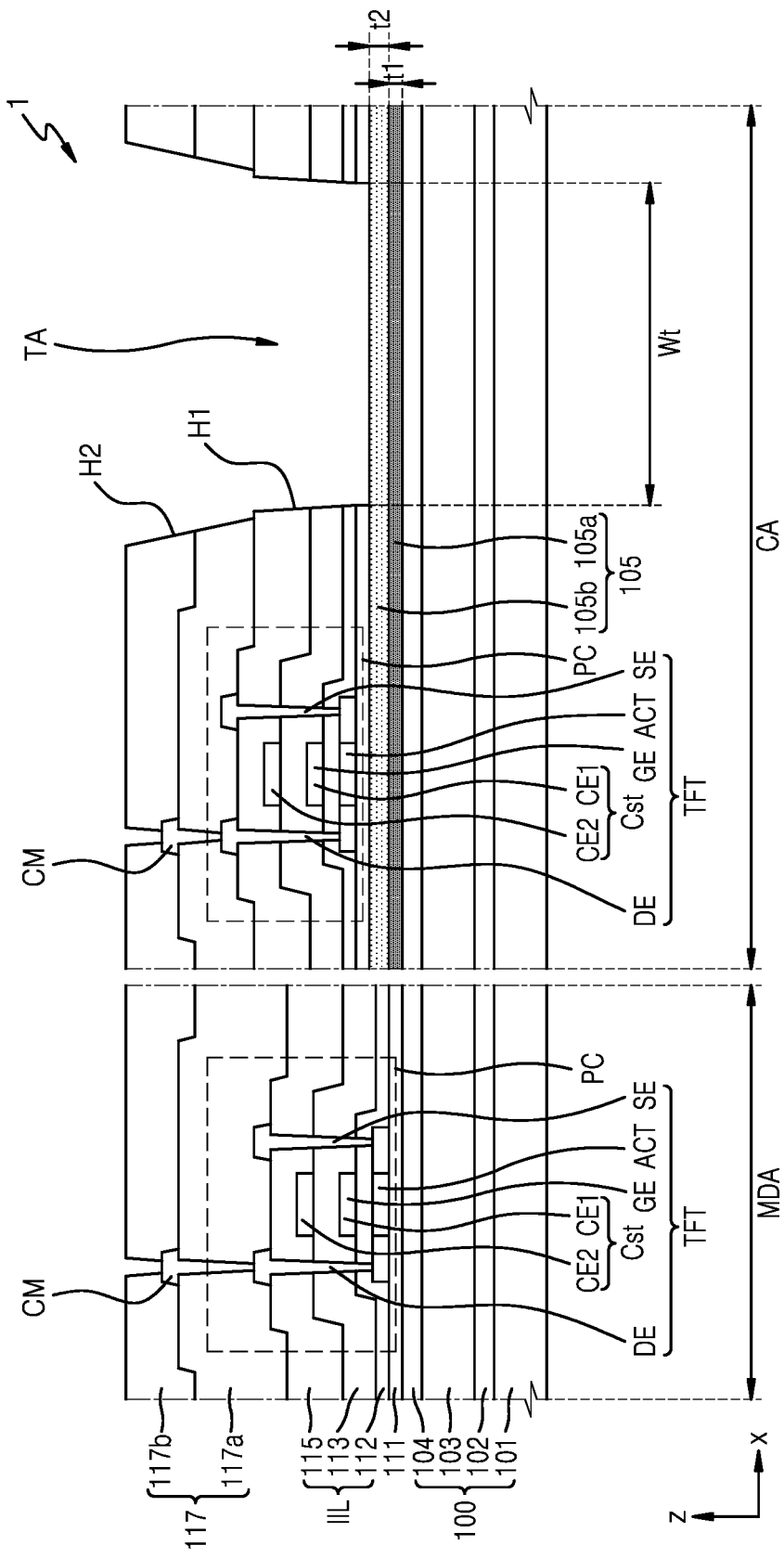
FIGS. 14A, 14B, 14C, FIGS. 14D and 14E are cross-sectional views schematically illustrating a method of manufacturing a display device according to an exemplary embodiment.

Referring to FIG. 14A, a conductive layer 105 may be formed on the substrate 100 in the component area CA. The conductive layer 105 may include a first conductive layer 105a and a second conductive layer 105b. The conductive layer 105 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), indium tin oxide (ITO), indium zinc oxide (IZO), zinc oxide (ZnO), indium oxide ($In_2O_3$), indium gallium oxide (IGO), and aluminum zinc oxide (AZO). For example, the first conductive layer 105a may include at least one of titanium (Ti), chromium (Cr), indium tin oxide (ITO), indium zinc oxide (IZO), zinc oxide (ZnO), indium oxide ($In_2O_3$), indium gallium oxide (IGO), and aluminum zinc oxide (AZO). The second conductive layer 105b may include molybdenum (Mo).

The first conductive layer 105a may be formed on the substrate 100 to have a first thickness t1 from an upper surface of the substrate 100, and the second conductive layer 105b may be formed on the first conductive layer 105a to have a second thickness t2 from an upper surface of the first conductive layer 105a. The second thickness t2 of the second conductive layer 105b may be greater than the first thickness t1 of the first conductive layer 105a. For example, the first thickness t1 may be about 200 angstroms (Å) to about 400 angstroms (Å), and the second thickness t2 may be about 2500 angstroms (Å) to about 3500 angstroms (Å).

The buffer layer 111 may be formed on the substrate 100 in the main display area MDA, and on the second conductive layer 105b in the component area CA. The pixel circuit PC may be formed on the buffer layer 111. The first hole H1 corresponding to the transmission area TA may be formed in the inorganic insulating layer IIL, and the planarization layer 117 covering the pixel circuit PC may be arranged on the inorganic insulating layer IIL. When the first hole H1 is formed, a hole of the buffer layer 111 corresponding to the transmission area TA may be formed. The hole of the buffer layer 111 may be overlapped with the first hole H1 of the inorganic insulating layer IIL. The second hole H2 may be formed in the planarization layer 117 to correspond to the transmission area TA. An upper surface of the second conductive layer 105b may be exposed in the transmission area TA by the first hole H1 and the second hole H2.

Figure 14B:
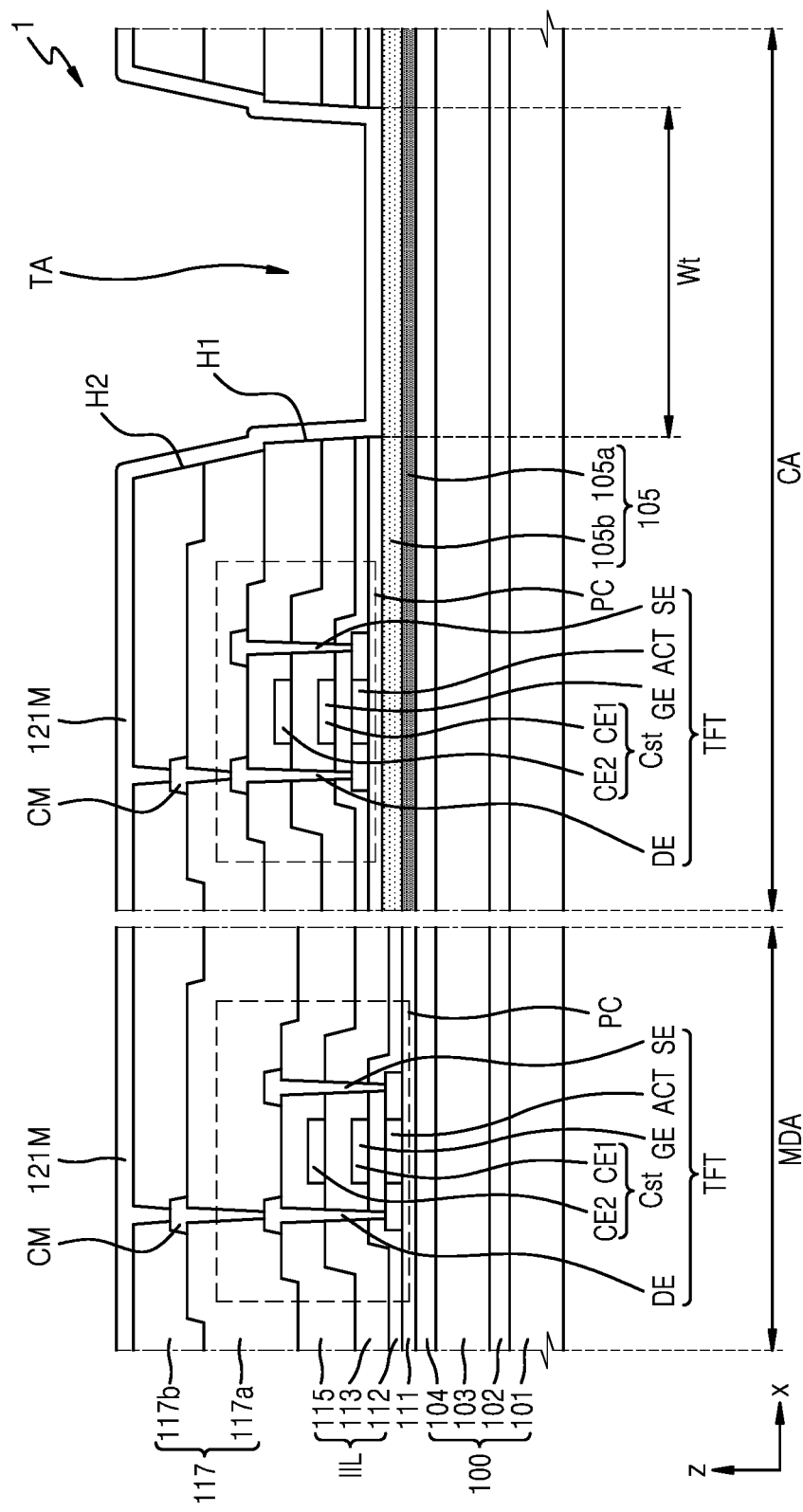

As shown in FIG. 14B, a conductive layer 121M may be formed on the planarization layer 117 in the main display area MDA and the component area CA, and on the second conductive layer 105b in the transmission area TA.

Figure 14C:
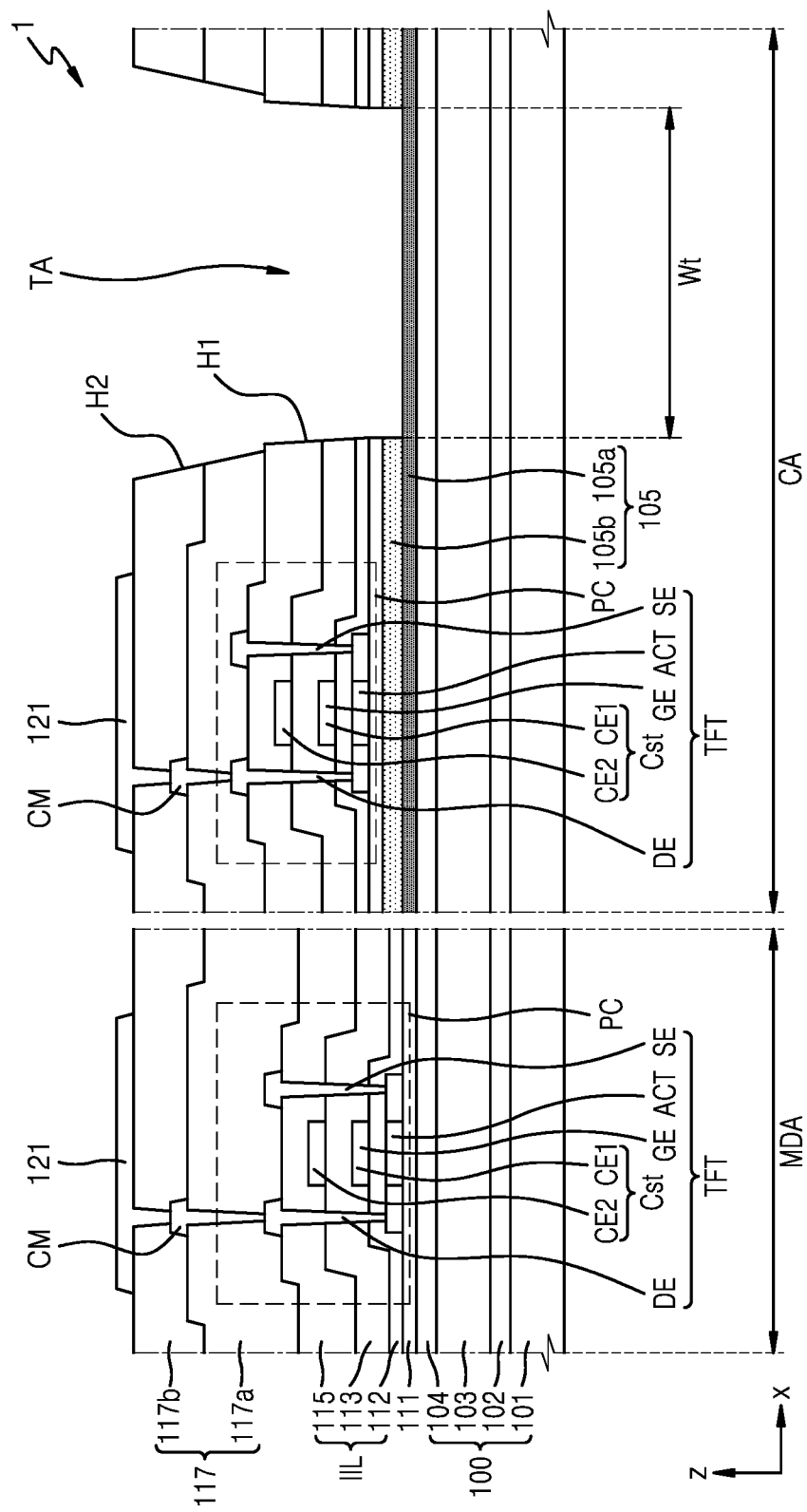

Next, as shown in FIG. 14C, the pixel electrode 121 may be formed by removing at least a portion of the conductive layer 121M, and a portion of the second conductive layer 105b corresponding to the transmission area TA may be removed. The pixel electrode 121 may be formed by wet-etching the conductive layer 121M formed over an entire surface of the substrate 100. When the conductive layer 121M is etched, the second conductive layer 105b formed in the transmission area TA may also be etched. Accordingly, an upper surface of the first conductive layer 105a arranged under the second conductive layer 105b in the transmission area TA may be externally exposed.

Figure 14D:
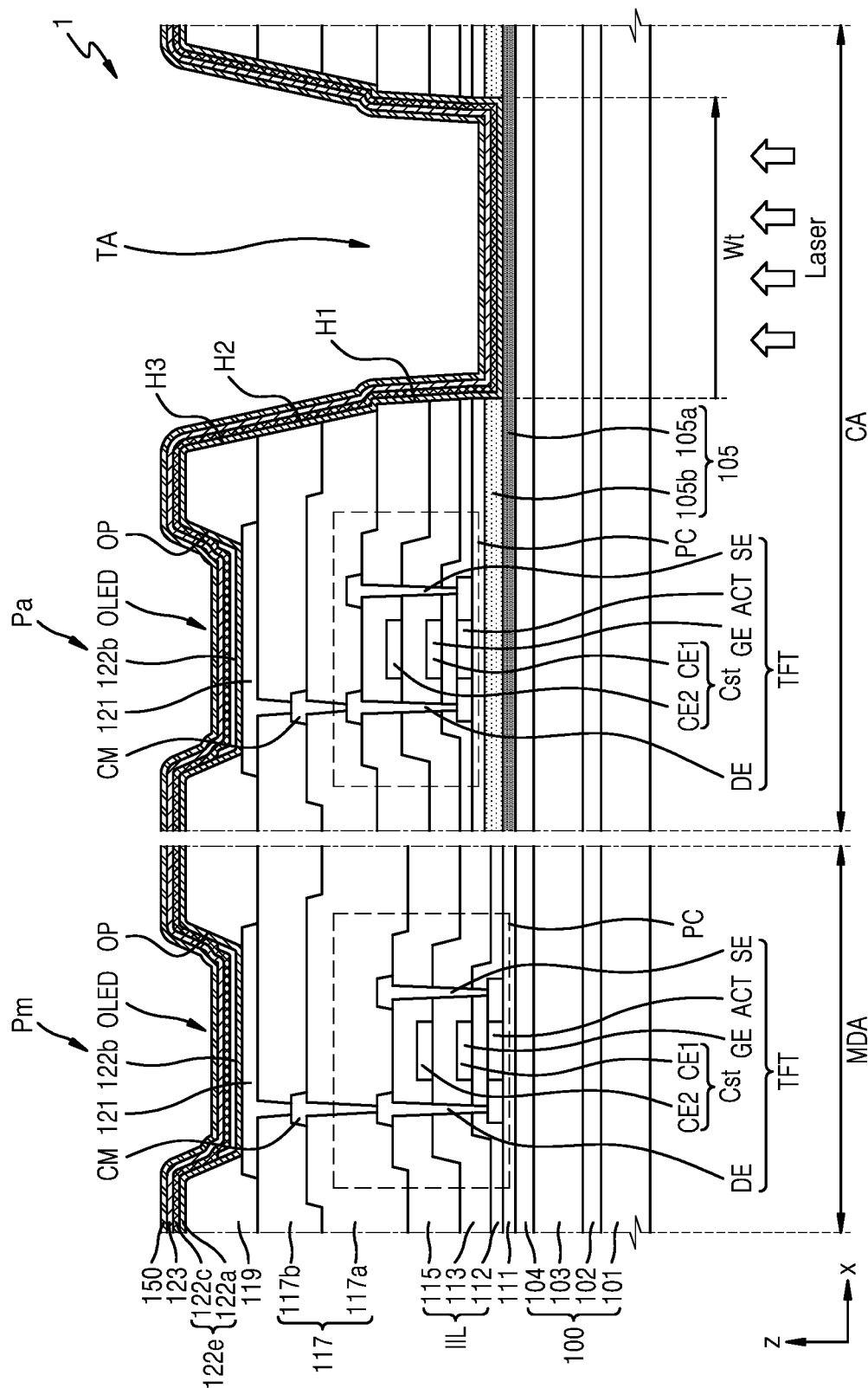

As shown in FIG. 14D, the pixel-defining layer 119 covering an edge of the pixel electrode 121 may be arranged on the planarization layer 117. The third hole H3 corresponding to the transmission area TA may be formed in the pixel-defining layer 119.

In addition, the organic functional layer 122e, the opposite electrode 123, and the upper layer 150 may be formed over an entire surface of the substrate 100 to cover the pixel electrode 121 and the first conductive layer 105a. The organic functional layer 122e, the opposite electrode 123, and the upper layer 150 may be integrally formed to correspond to the organic light-emitting diodes OLED included in the main display area MDA and the component area CA.

After each of the first functional layer 122a, the second functional layer 122c, the opposite electrode 123, and the upper layer 150 is formed over an entire surface of the substrate 100, laser may be irradiated on a lower surface opposite to an upper surface of the substrate 100 corresponding to the transmission area TA.

Figure 14E:
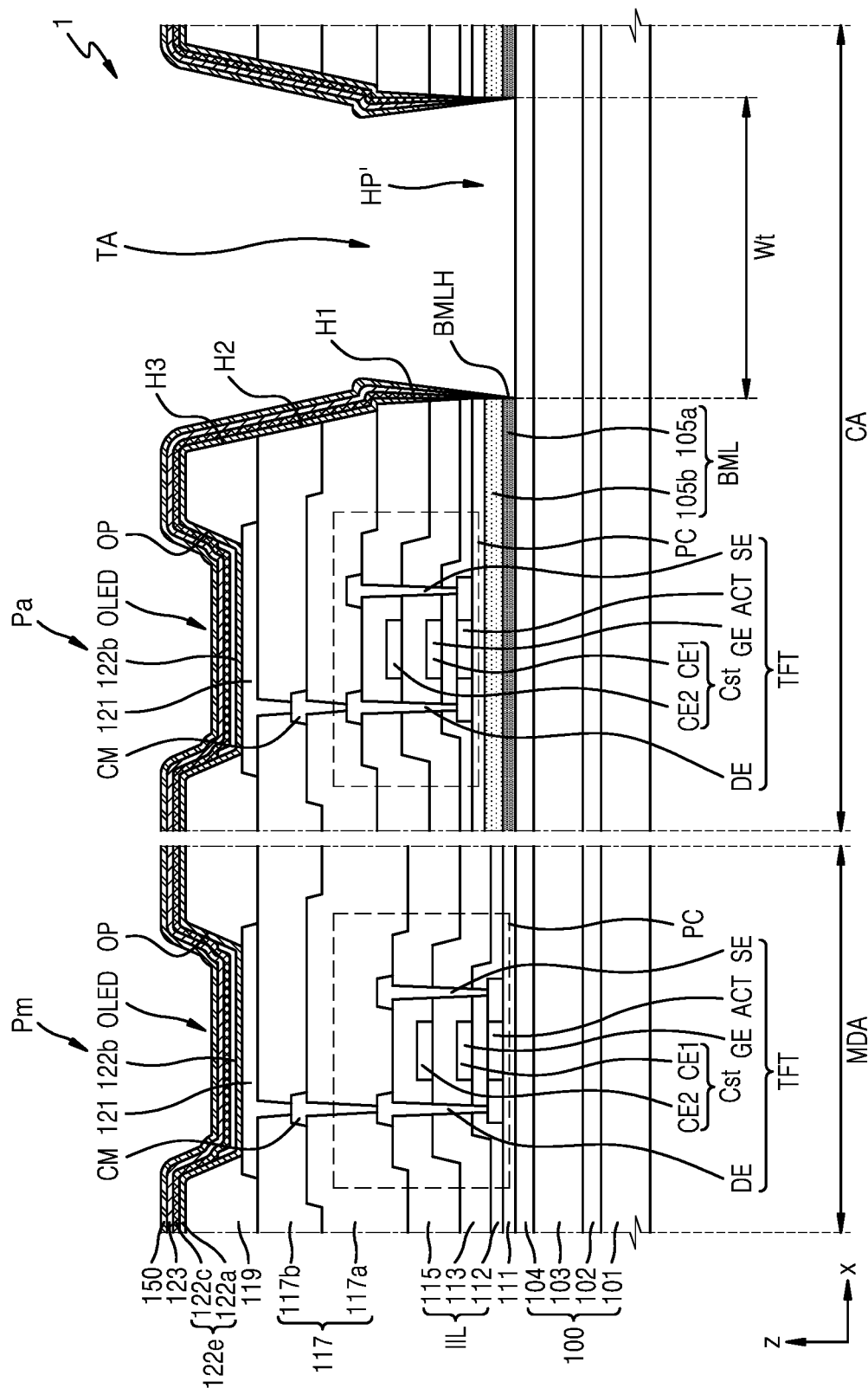

Referring to FIG. 14E, the first conductive layer 105a in the transmission area TA functions as a sacrificial layer, and thus, portions of the organic functional layer 122e, the opposite electrode 123, and the upper layer 150 formed on the first conductive layer 105a may be removed using laser lift-off, and thus, the hole pattern HP' may be formed in the transmission area TA. In this case, the first conductive layer 105a in the transmission area TA may also be removed to expose an upper surface of the second barrier layer 104 of the substrate 100 and form the bottom metal layer BML in the component area CA. The width Wt of the bottom hole BMLH of the bottom metal layer BML may be substantially the same as the smallest width of the transmission area TA. In FIG. 14E, a width or area of the hole pattern HP' of the organic functional layer 122e may be the same as the width Wt or area of the bottom hole BMLH of the bottom metal layer BML.

Figure 15A:
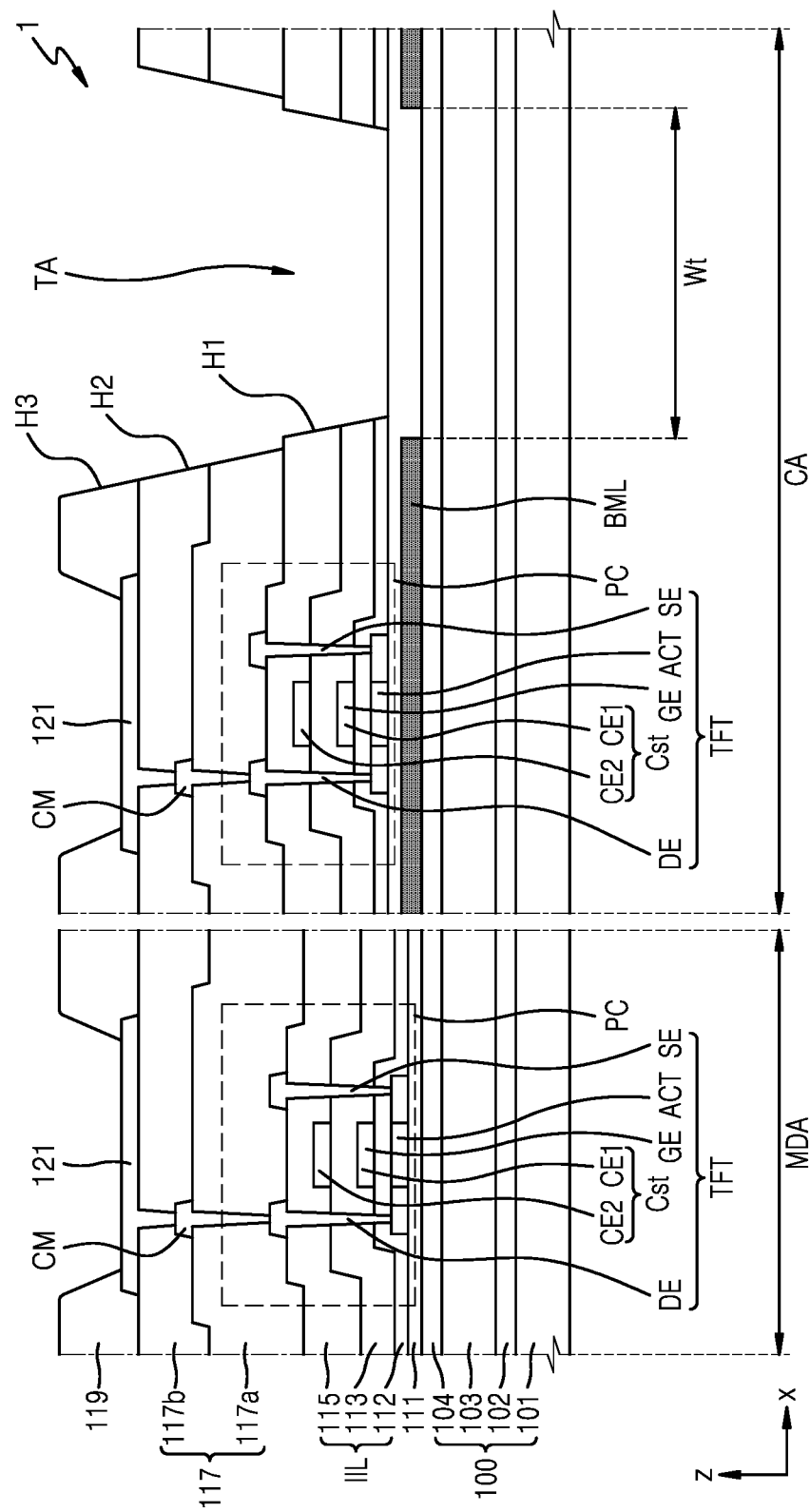
FIGS. 15A, 15B, and 15C are cross-sectional views schematically illustrating a method of manufacturing a display device according to an exemplary embodiment.
Figure 15B:
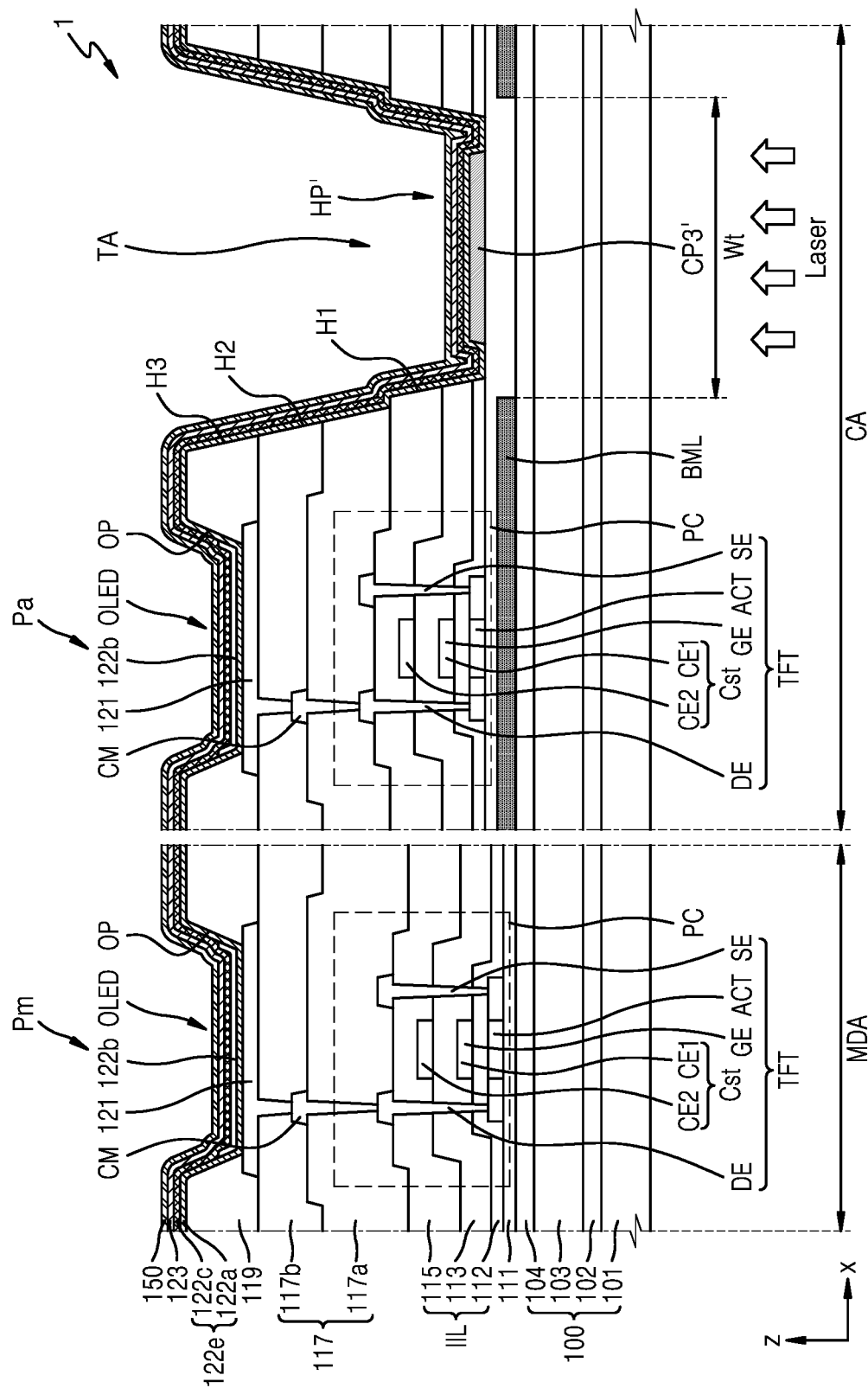
Figure 15C:
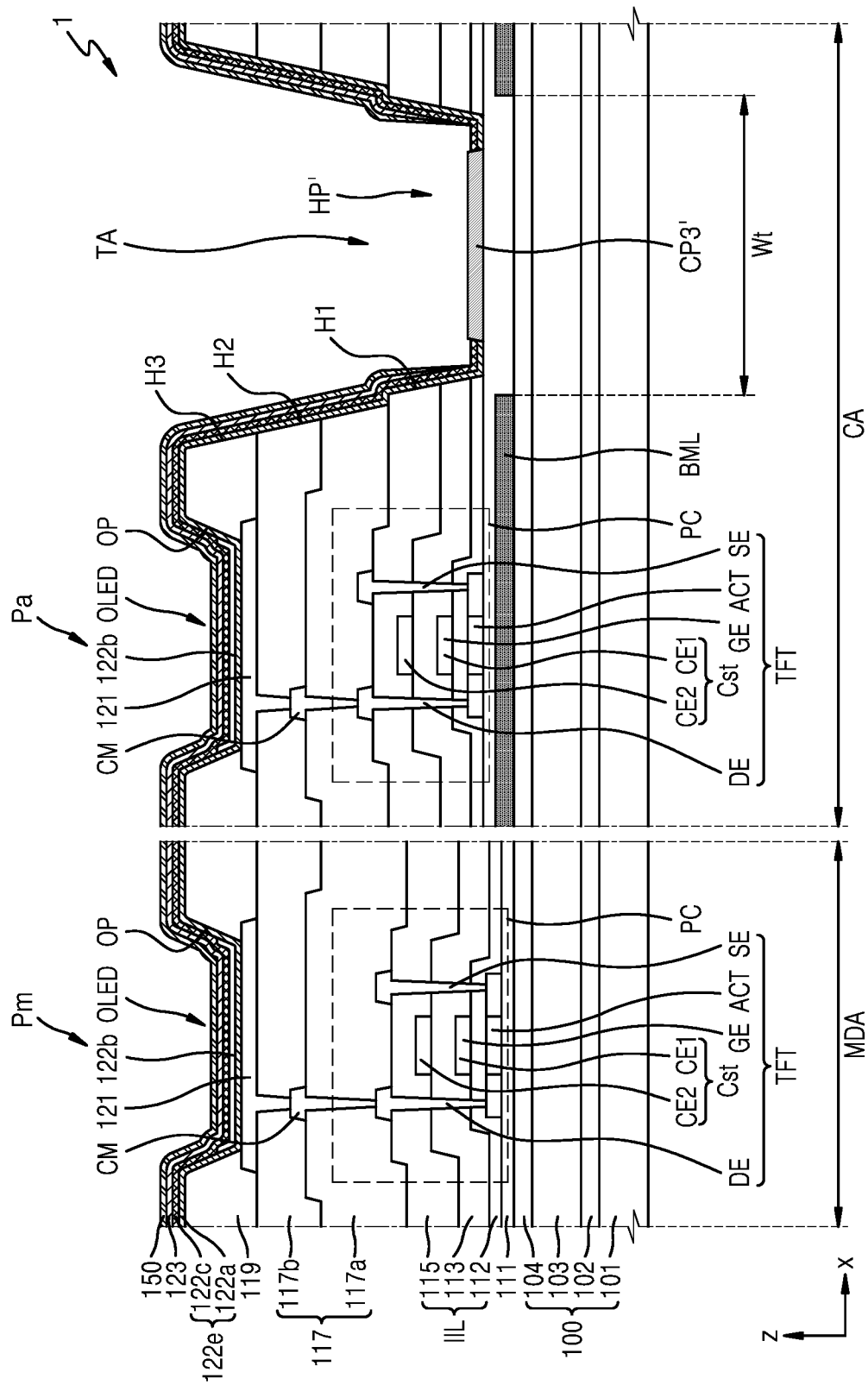

FIGS. 15A to 15C are cross-sectional views schematically illustrating a method of manufacturing a display device according to an exemplary embodiment. Hereinafter, repeated descriptions of the same processes as those described in FIGS. 11A to 11E will be omitted or simplified, and differences will be mainly described.

As shown in FIG. 15A, after the bottom metal layer BML is formed in the component area CA, the pixel circuit PC may be formed in the main display area MDA and the component area CA, and the pixel electrode 121 connected to the pixel circuit PC may be formed. In addition, the first hole H1 corresponding to the transmission area TA may be formed in the inorganic insulating layer IIL, the second hole H2 may be formed in the planarization layer 117 to correspond to the transmission area TA, and the third hole H3 corresponding to the transmission area TA may be formed in the pixel-defining layer 119.

Referring to FIG. 15B, a third conductive pattern CP3' may be formed in the transmission area TA. The third conductive pattern CP3' may function as a sacrificial layer for forming the hole pattern HP' in the transmission area TA.

The third conductive pattern CP3' may be a plate-shaped pattern corresponding to the transmission area TA. The third conductive pattern CP3' may be formed by deposition processes using a mask, such as an FMM). In an exemplary embodiment, the third conductive pattern CP3' may include ytterbium (Yb). A thickness of the third conductive pattern CP3' may be about 50 angstroms (Å) to about 200 angstroms (Å).

In addition, the organic functional layer 122e, the opposite electrode 123, and the upper layer 150 may be formed over an entire surface of the substrate 100 to cover the pixel electrode 121 and the third conductive pattern CP3'. Next, laser may be irradiated on a lower surface opposite to an upper surface of the substrate 100 corresponding to the transmission area TA.

Referring to FIG. 15C, portions of the organic functional layer 122e, the opposite electrode 123, and the upper layer 150 formed on the third conductive pattern CP3' may be removed using laser lift-off In this case, the third conductive pattern CP3' may be retained in the transmission area TA. In an area of the transmission area TA where the third conductive pattern CP3' is not formed, only the opposite electrode 123 and the upper layer 150 may be removed, and the organic functional layer 122e may be retained without being removed.

In the above-described exemplary embodiments, the buffer layer 111 may be continuously arranged to correspond to the transmission area TA.

Figure 16:
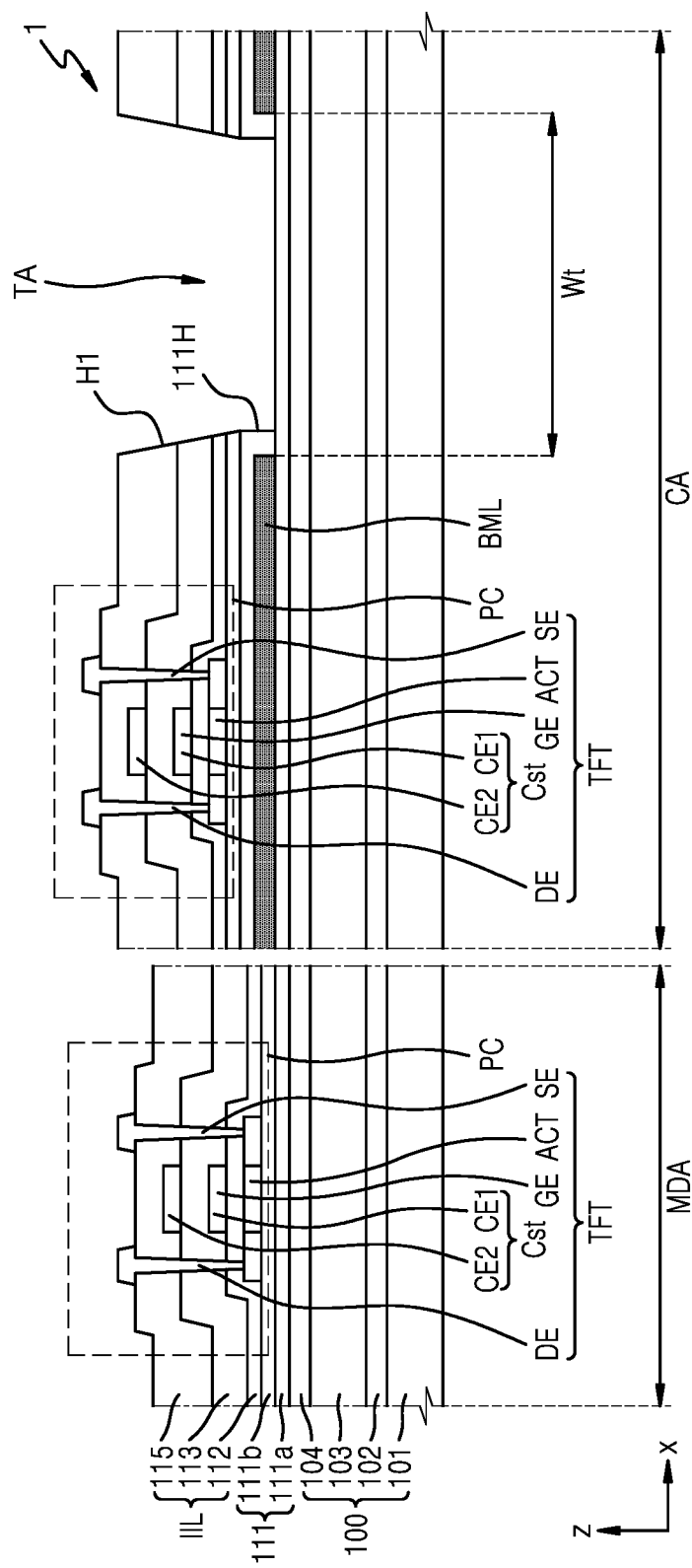
FIGS. 16 and 17 are cross-sectional views schematically illustrating a transmission area of a display device according to exemplary embodiments.
Figure 17:
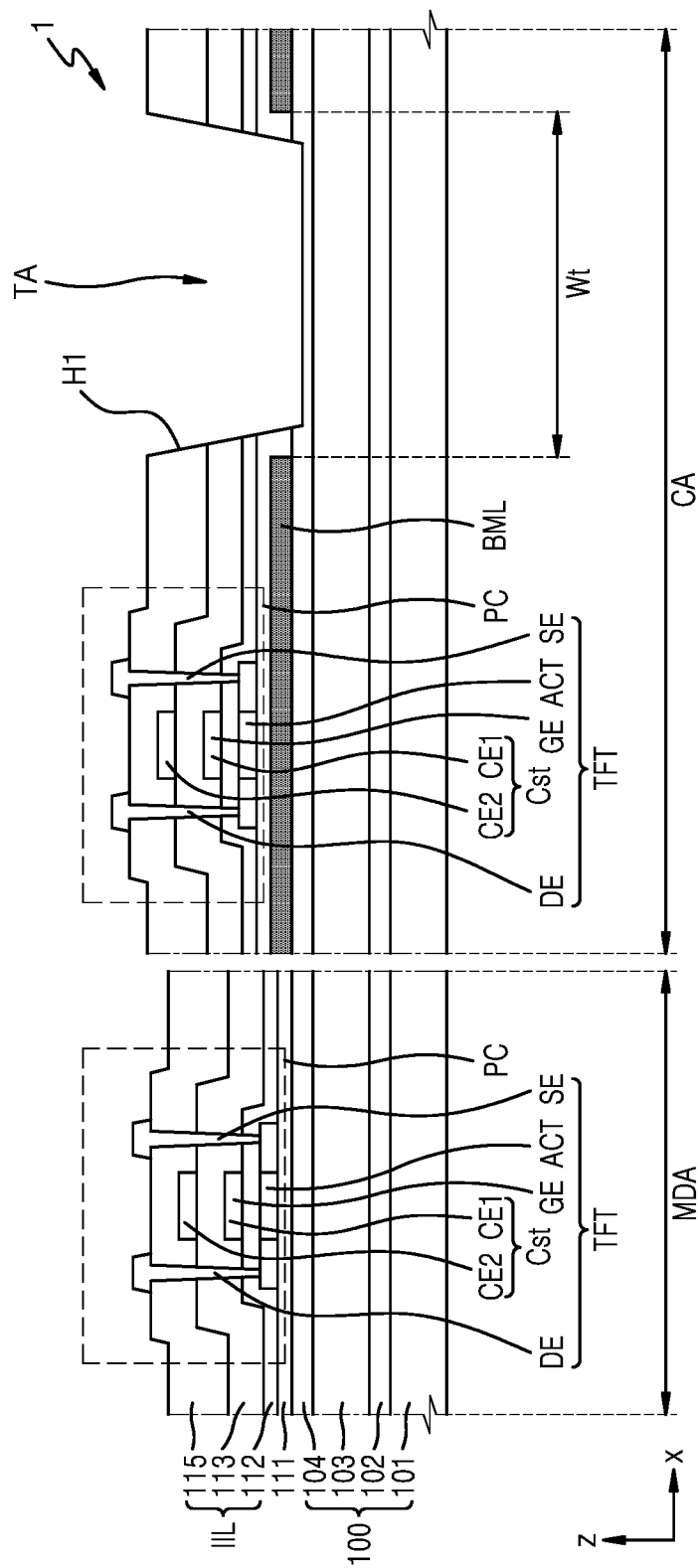

FIGS. 16 and 17 are cross-sectional views schematically illustrating the transmission area TA of the display device 1 according to an exemplary embodiment.

Referring to FIG. 16, the buffer layer 111 according to the illustrated exemplary embodiment may include a first buffer layer 111a and a second buffer layer 111b, and the bottom metal layer BML may be disposed between the first buffer layer 111a and the second buffer layer 111b. In addition, a hole 111H of the second buffer layer 111b overlapping the first hole H1 of the inorganic insulating layer IIL may be formed to expose an upper surface of the first buffer layer 111a in the transmission area TA. The first conductive patterns CP1 and CP1' and the third conductive patterns CP3 and CP3', which function as sacrificial layers, may be formed on an upper surface of the first buffer layer 111a in the transmission area TA. In another exemplary embodiment, a hole may be formed in the first buffer layer 111a to overlap the first hole H1 of the inorganic insulating layer IIL and the hole 111H of the second buffer layer 111b, and thus, an upper surface of the second barrier layer 104 of the substrate 100 may be exposed in the transmission area TA.

Referring to FIG. 17, when the first hole H1 of the inorganic insulating layer IIL is formed according to the illustrated exemplary embodiment, the buffer layer 111 and at least a portion of the second barrier layer 104 may be etched together to expose an upper surface of the second barrier layer 104 in the transmission area TA. The first conductive patterns CP1 and CP1' and the third conductive patterns CP3 and CP3', which functions as sacrificial layers, may be formed on an upper surface of the second barrier layer 104 of the transmission area TA.

According to one or more exemplary embodiments, an organic layer (for example, the organic functional layer 122e) arranged in the transmission area TA may have hole patterns HP and HP', thereby blocking a moisture permeable propagation path from an organic insulating layer (for example, the second base layer 103, the organic encapsulation layer 132, etc.) arranged above and/or below the organic layer to the organic layer.

According to one or more of the exemplary embodiments described above, a display device including a component area in which various components may be arranged in a display area and a method of manufacturing the display device may be implemented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate including a main display area, a component area having a transmission area, and a peripheral area outside the main display area;
   a first thin film transistor and a first display element disposed in the main display area and at least partially overlapping each other along a thickness direction;
   a second thin film transistor and a second display element disposed in the component area;
   a bottom metal layer disposed between the substrate in the component area and the second thin film transistor in the thickness direction, and including a hole corresponding to the transmission area; and
   an organic layer disposed in the transmission area and having a hole pattern defined along an edge of the hole of the bottom metal layer.

2. The display device of claim 1, further comprising a first conductive pattern in the hole pattern of the organic layer.

3. The display device of claim 2, wherein the first conductive pattern comprises ytterbium (Yb).

4. The display device of claim 2, wherein a thickness of the first conductive pattern is about 50 angstroms (Å) to about 200 angstroms (Å).

5. The display device of claim 1, further comprising a second conductive pattern disposed on upper surfaces of a source electrode and a drain electrode of the second thin film transistor.

6. The display device of claim 5, wherein the second conductive pattern comprises titanium (Ti).

7. The display device of claim 5, wherein the second conductive pattern comprises substantially the same material as uppermost layers of the source electrode and the drain electrode.

8. The display device of claim 1, wherein the organic layer comprises at least one of a first functional layer disposed under emission layers of the first display element and the second display element, and a second functional layer disposed on the emission layers.

9. The display device of claim 1, wherein the hole pattern of the organic layer has a line shape continuously or discontinuously extending along the edge of the hole of the bottom metal layer.

10. The display device of claim 1, wherein the hole pattern of the organic layer comprises a plurality of island-type hole patterns spaced apart from each other along the edge of the hole of the bottom metal layer.

11. The display device of claim 1, wherein the hole pattern of the organic layer has a shape of the hole of the bottom metal layer.

12. The display device of claim 1, further comprising an inorganic layer disposed between the substrate and the organic layer in the transmission area.

13. The display device of claim 1, wherein the substrate comprises:
   a first base layer comprising an organic material;
   a first barrier layer comprising an inorganic material and disposed on the first base layer;
   a second base layer comprising an organic material and disposed on the first barrier layer; and
   a second barrier layer comprising an inorganic material and disposed on the second base layer.

14. The display device of claim 13, wherein the organic layer is disposed on the second barrier layer.

15. The display device of claim 1, wherein the bottom metal layer comprises:
   a first metal layer having a first thickness from an upper surface of the substrate; and
   a second metal layer having a second thickness from an upper surface of the first metal layer greater than the first thickness.

16. A display device comprising:
   a substrate including a main display area, a component area having a transmission area, and a peripheral area outside the main display area;
   a bottom metal layer disposed in the component area of the substrate and comprising a hole corresponding to the transmission area;
   at least one insulating layer disposed over the bottom metal layer and comprising a hole corresponding to the transmission area;
   a pixel electrode disposed on the at least one insulating layer;
   an emission layer disposed on the pixel electrode;
   an organic layer comprising a first functional layer and a second functional layer; and
   an opposite electrode facing the pixel electrode and disposed on the organic layer,
   wherein the first functional layer is disposed between the pixel electrode and the emission layer, and the second functional layer is disposed between the emission layer and the opposite electrode,
   wherein the organic layer in the transmission area has a hole pattern defined along an edge of the hole of the bottom metal layer, and
   wherein the bottom metal layer and the pixel electrode at least partially overlap each other in a thickness direction in the component area.

17. The display device of claim 16, further comprising a first conductive pattern in the hole pattern of the organic layer, and
   wherein the first conductive pattern comprises ytterbium (Yb).

18. The display device of claim 16, further comprising:
   a thin film transistor disposed between the bottom metal layer and the pixel electrode in the thickness direction and including a source electrode and a drain electrode; and
   a second conductive pattern overlapping the bottom metal layer and disposed on upper surfaces of the source electrode and the drain electrode of the thin film transistor,
   wherein the second conductive pattern comprises titanium (Ti), and
   wherein the thin film transistor and the pixel electrode at least partially overlap each other in the thickness direction.

19. The display device of claim 16, wherein the hole pattern of the organic layer has a line shape or a shape of the hole of the bottom metal layer.

20. The display device of claim 19, wherein the hole pattern of the organic layer continuously or discontinuously extends along the edge of the hole of the bottom metal layer.

\* \* \* \* \*